US012666881B1

(12) United States Patent
Dannemiller

(10) Patent No.: US 12,666,881 B1
(45) Date of Patent: Jun. 23, 2026

(54) CASIMIR-EFFECT BASED TUNNEL TRANSISTOR UTILIZING GRAPHENE

(71) Applicant: Qubit Semiconductor LLC, Duxbury, MA (US)

(72) Inventor: Douglas Joseph Dannemiller, Duxbury, MA (US)

(73) Assignee: Qubit Semiconductor LLC, Duxbury, MA (US)

( * ) Notice: Subject to any disclaimer, the term of this patent is extended or adjusted under 35 U.S.C. 154(b) by 0 days.

(21) Appl. No.: 19/435,281

(22) Filed: Dec. 29, 2025

Related U.S. Application Data

(63) Continuation-in-part of application No. 19/202,232, filed on May 8, 2025.

(Continued)

(51) Int. Cl.
*H10N 60/12* (2023.01)
*H01P 3/08* (2006.01)
(Continued)

(52) U.S. Cl.
CPC ............. *H10N 60/128* (2023.02); *H01P 3/08* (2013.01); *H10N 60/11* (2023.02); *H10N 60/80* (2023.02); *B82Y 10/00* (2013.01)

(58) Field of Classification Search
CPC ...... H10N 60/128; H10N 60/11; H10N 60/80; H01P 3/08; B82Y 10/00
See application file for complete search history.

(56) References Cited

U.S. PATENT DOCUMENTS 9,126,829 B2    9/2015  Wu
9,765,876 B2    9/2017  Yamauchi et al.
(Continued)

FOREIGN PATENT DOCUMENTS

EP    3401848 A1 * 11/2018   ............ H10W 20/42
JP    2024040790 A * 3/2024   ........... H10D 48/385
(Continued)

OTHER PUBLICATIONS

Abbas, Chahine, et al., "Strong Thermal and Electrostatic Manipulation of the Casimir Force in Graphene Multilayers." Physical Review Letters, vol. 118, 126101, Mar. 2017, <https://journals.aps.org/prl/abstract/10.1103/PhysRevLett.118.126101>, Abstract only.
(Continued)

*Primary Examiner* — Ida M Soward
(74) *Attorney, Agent, or Firm* — Fitch, Even, Tabin & Flannery LLP

(57)    ABSTRACT

A quantum device includes an actuator including a graphene material and having a proximal end mounted to an actuator anchor; an electrode disposed on a distal end of the actuator; a quantum dot, configured to localize a single electron, the quantum dot and the electrode disposed within a common vacuum to define a tunneling gap; and a quantum dot anchor, including the graphene material, disposed in a same plane as the quantum dot relative to the electrode. The quantum device may include a modulator configured to emit electromagnetic signaling within a particular frequency range. The graphene material is tuned to increase a Casimir force between the electrode and the quantum dot anchor in response to the electromagnetic signaling. The increased Casimir force causes the actuator to deform to bring the electrode within an electron tunneling range of the quantum dot, or lowers a tunneling barrier on a static electrode.

25 Claims, 20 Drawing Sheets

Related U.S. Application Data

(60) Provisional application No. 63/780,389, filed on Mar. 30, 2025.

(51) Int. Cl.
H10N 60/10 (2023.01)
H10N 60/80 (2023.01)
B82Y 10/00 (2011.01)

(56) References Cited

U.S. PATENT DOCUMENTS

| | | | |
|---|---|---|---|
| 10,125,321 | B2 | 11/2018 | Auld et al. |
| 10,486,123 | B2 | 11/2019 | Kaufmann |
| 10,652,387 | B2 | 5/2020 | Tsuji |
| 11,133,758 | B2 | 9/2021 | Moddel |
| 11,456,321 | B2 | 9/2022 | Li et al. |
| 12,302,769 | B2 | 5/2025 | White |
| 2014/0092521 | A1 | 4/2014 | Rosendorf |
| 2015/0318401 | A1* | 11/2015 | Duan ............... H10D 30/6728 |
| | | | 257/43 |
| 2018/0277711 | A1* | 9/2018 | Fan ...................... H10D 86/481 |
| 2018/0294377 | A1* | 10/2018 | Fan ...................... H10K 50/844 |
| 2018/0358446 | A1* | 12/2018 | Park ...................... H10F 30/282 |
| 2022/0224996 | A1 | 7/2022 | Nickerson |
| 2023/0015299 | A1 | 1/2023 | Ware et al. |
| 2023/0370256 | A1* | 11/2023 | De Los Santos ..... H04L 9/0877 |
| 2024/0030328 | A1* | 1/2024 | Knapp ................. H10D 30/473 |

FOREIGN PATENT DOCUMENTS

| | | | | |
|---|---|---|---|---|
| TW | 201312558 | A | 3/2013 | |
| WO | WO-2015178519 | A1 * | 11/2015 | ............. H10D 48/40 |
| WO | 2017/091870 | A1 | 6/2017 | |
| WO | WO-2021251175 | A1 * | 12/2021 | ........ H10D 48/3835 |
| WO | 2024/186331 | A2 | 9/2024 | |

OTHER PUBLICATIONS

Arute, F., et al., "Quantum supremacy using a programmable superconducting processor." Nature, vol. 574, (2019), pp. 505-510, <https://doi.org/10.1038/s41586-019-1666-5>.

Baart, Timothy Alexander, et al., "Coherent spin-exchange via a quantum mediator." Nature Nanotechnology, Oct. 2016, pp. 1-5.

Baumann, Susane, et al., "Electron paramagnetic resonance of individual atoms on a surface." Science, vol. 350, No. 6259, (2015), pp. 417-420, <https://doi.org/10.1126/science.aac8703>.

Bordag, M., et al., "Advances in the Casimir Effect." Oxford University Press, (2009), <https://doi.org/10.1093/acprof:oso/9780199238743.003.0023>, Abstract only.

Casimir, H. B. G., "On the attraction between two perfectly conducting plates." Proceedings of the Koninklijke Nederlandse Akademie van Wetenschappen (KNAW), vol. 51, pp. 793-795 (1948).

Choi, D., et al., "Electron spin resonance with scanning tunneling microscopy: a tool for an on-surface quantum platform of identical qubits." (Review), Nanoscale Advances, vol. 7, pp. 4551-4558 (2025), <https://doi.org/10.1039/D5NA00316D>.

Dalvit, Diego, et al., F. S. S. (eds.), "Casimir Physics." Springer, vol. 834, 2011, (book), <https://doi.org/10.1007/978-3-642-20288-9>, Overview only.

Decca, R. S., et al., "Precise comparison of theory and new experimental results for the Casimir force leads to stronger constraints on thermal quantum effects and long-range interactions." Annals of Physics, vol. 318, 2005, pp. 37-80, <https://doi.org/10.1016/j.aop.2005.03.007>, Abstract only.

Dzyaloshinskii, I., et al., "The general theory of van der Waals forces." Advances in Physics, 1961, 10(38), pp. 165-209, <https://doi.org/10.1080/00018736100101281>, Abstract only.

Erbe, A., et al., "Nanomechanical resonator shuttling single electrons at radio frequencies." Physical Review Letters, vol. 87, Article 096106 (2001), <https://doi.org/10.1103/PhysRevLett.87.096106>, Abstract only.

Han, Jin, et al., "Vacuum nanoelectronics: Back to the future?—Gate insulated nanoscale vacuum channel transistor." Applied Physics Letters, vol. 100, Article 213505 (2012), <https://doi.org/10.1063/1.4717751>, Abstract only.

Koenig, D. R., et al., "Voltage-sustained self-oscillation of a nanomechanical electron shuttle." Applied Physics Letters, vol. 101, Article 213111 (2012), <https://doi.org/10.1063/1.4767359>.

Krantz, P.; et al., "A quantum engineer's guide to superconducting qubits." Applied Physics Reviews, vol. 6, No. 2, Article 021318, (2019), <https://doi.org/10.1063/1.5089550>, 57 pages.

Lifshitz, E. M., "The theory of molecular attractive forces between solids." Soviet Physics JETP, vol. 2, No. 1, pp. 73-83 (1956).

Narimanov, Evgenii E., et al., "Metamaterials: Naturally hyperbolic." Nature Photonics, 9, 214-216 (2015). <https://doi.org/10.1038/nphoton.2015.56>, Abstract only.

Novoselov, K. S., "Nobel Lecture: Graphene: Materials in the Flatland." Reviews of Modern Physics, 83, 837-849 (2011), <https://doi.org/10.1103/RevModPhys.83.837>.

Pedersen, Thomas G., et al., "Graphene Antidot Lattices: Designed Defects and Spin Qubits." Physical Review Letters, vol. 100, Apr. 2008, <https://journals.aps.org/prl/abstract/10.1103/PhysRevLett.100.136804>, Abstract only.

Preskill, J., "Quantum computing in the NISQ era and beyond." Quantum, vol. 2, Article 79 (2018), <https://doi.org/10.22331/q-2018-08-06-79>.

Pruvost, Benjamin, et al., "Design Optimization of NEMS Switches for Suspended-Gate Single-Electron Transistor Applications." IEEE Transactions on Nanotechnology, vol. 8, No. 2, pp. 174-184 (2009), <https://doi.org/10.1109/TNANO.2008.2010453>, Abstract only.

Rabl, P.; et al., "Strong magnetic coupling between an electronic spin qubit and a mechanical resonator." Physical Review B, vol. 79, Article 041302 (2009), <https://doi.org/10.1103/PhysRevB.79.041302>, Abstract only.

Rodriguez, Alejandro W., et al., "The Casimir effect in microstructured geometries." Nature Photonics (Focus/Review), vol. 5, (2011), pp. 211-221, <https://www.nature.com/articles/nphoton.2011.39>, Abstract only.

Simmons, J. G., "Generalized formula for the electric tunnel effect between similar electrodes separated by a thin insulating film." Journal of Applied Physics, vol. 34, No. 6, pp. 1793-1803 (1963), <https://doi.org/10.1063/1.1702682>, Abstract only.

Trauzettel, Bjorn, et al., "Spin qubits in graphene quantum dots." Nature Physics, 3, 192-196 (2007), <https://doi.org/10.1038/nphys544>, Abstract only.

Van Dijk, Jeroen, et al., "A Scalable Cryo-CMOS Controller for the Wideband Frequency-Multiplexed Control of Spin Qubits and Transmons." IEEE Journal of Solid-State Circuits, Nov. 2020, <https://infoscience.epfl.ch/handle/20.500.14299/174068>, Abstract only.

Van Spengen, W. Merlijn, "MEMS reliability from a failure mechanisms perspective." Microelectronics Reliability, vol. 43, issue 7, Jul. 2003, pp. 1049-1060, <https://www.sciencedirect.com/science/article/abs/pii/S0026271403001197?via%3Dihub>, Abstract only.

Veldhorst, M., et al., "An addressable quantum dot qubit with fault-tolerant control fidelity." Nature Nanotechnology, vol. 9, (2014), pp. 981-985.

Veldhorst, M., Yang, C., Hwang, J. et al. A two-qubit logic gate in silicon. Nature 526, (2015), pp. 410-414, <https://doi.org/10.1038/nature15263>, Abstract only.

Wang, Yu, et al., "Universal quantum control of an atomic spin qubit on a surface." npj Quantum Information, vol. 9, Article 48 (2023), <https://doi.org/10.1038/s41534-023-00716-6>.

Xu, Ji, et al., "Graphene-Based Nanoscale Vacuum Channel Transistor." Nanoscale Research Letters, vol. 13, Article 311 (2018), <https://doi.org/10.1186/s11671-018-2736-6>.

Yoneda, J., Takeda, K., Otsuka, T. et al., "A quantum-dot spin qubit with coherence limited by charge noise and fidelity higher than 99.9%." Nature Nanotech 13, (2018), pp. 102-106.

(56) References Cited

OTHER PUBLICATIONS

Zwerver, A. M. J., et al., "Shuttling an electron spin through a silicon quantum dot array." PRX Quantum, vol. 4, Article 030303 (2023), <https://doi.org/10.1103/PRXQuantum.4.030303>, Abstract only.

* cited by examiner

110

120

140⟍

150⟍

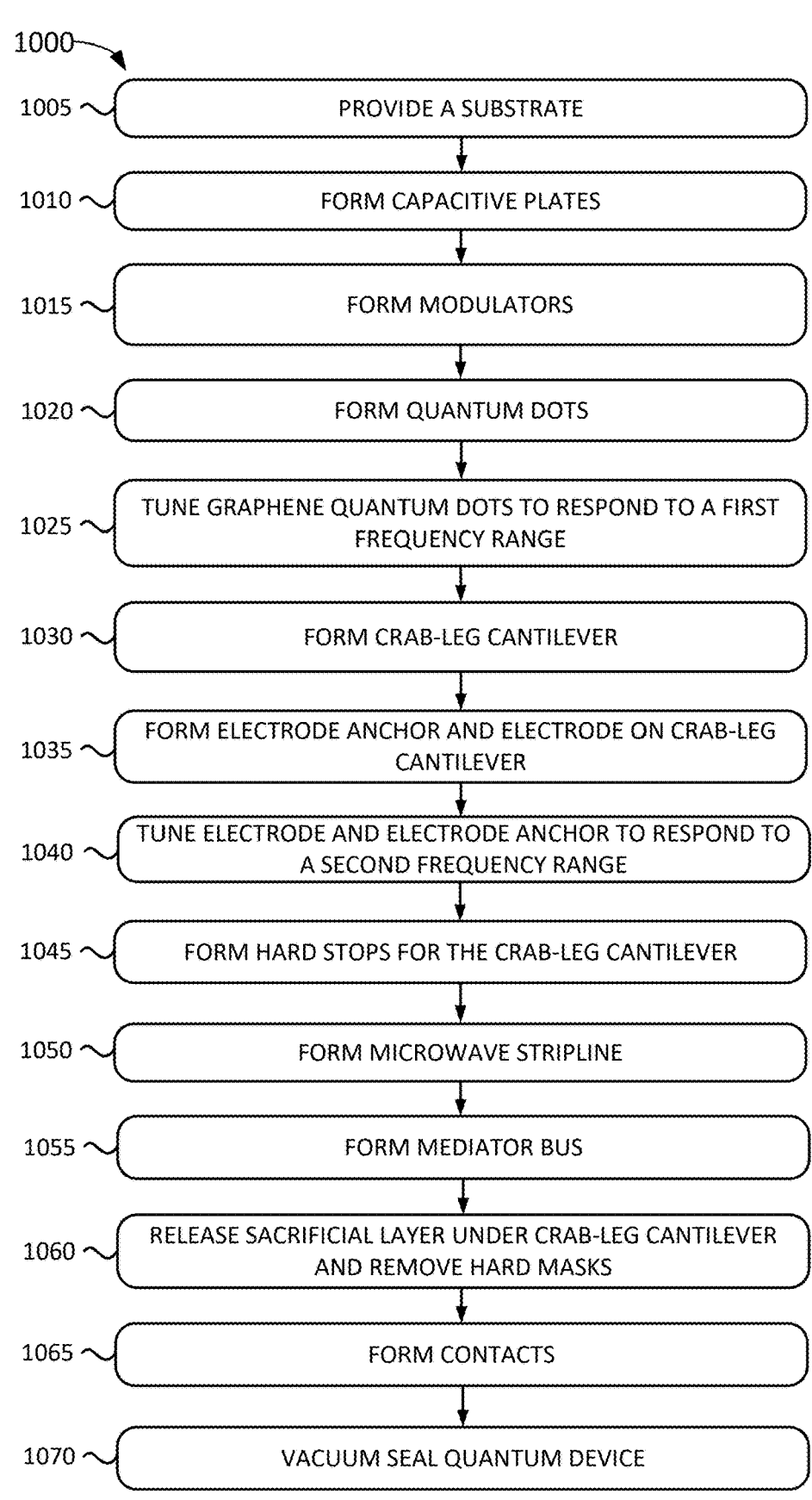

1000

1005 — PROVIDE A SUBSTRATE

1010 — FORM CAPACITIVE PLATES

1015 — FORM MODULATORS

1020 — FORM QUANTUM DOTS

1025 — TUNE GRAPHENE QUANTUM DOTS TO RESPOND TO A FIRST FREQUENCY RANGE

1030 — FORM CRAB-LEG CANTILEVER

1035 — FORM ELECTRODE ANCHOR AND ELECTRODE ON CRAB-LEG CANTILEVER

1040 — TUNE ELECTRODE AND ELECTRODE ANCHOR TO RESPOND TO A SECOND FREQUENCY RANGE

1045 — FORM HARD STOPS FOR THE CRAB-LEG CANTILEVER

1050 — FORM MICROWAVE STRIPLINE

1055 — FORM MEDIATOR BUS

1060 — RELEASE SACRIFICIAL LAYER UNDER CRAB-LEG CANTILEVER AND REMOVE HARD MASKS

1065 — FORM CONTACTS

1070 — VACUUM SEAL QUANTUM DEVICE

FIG. 10

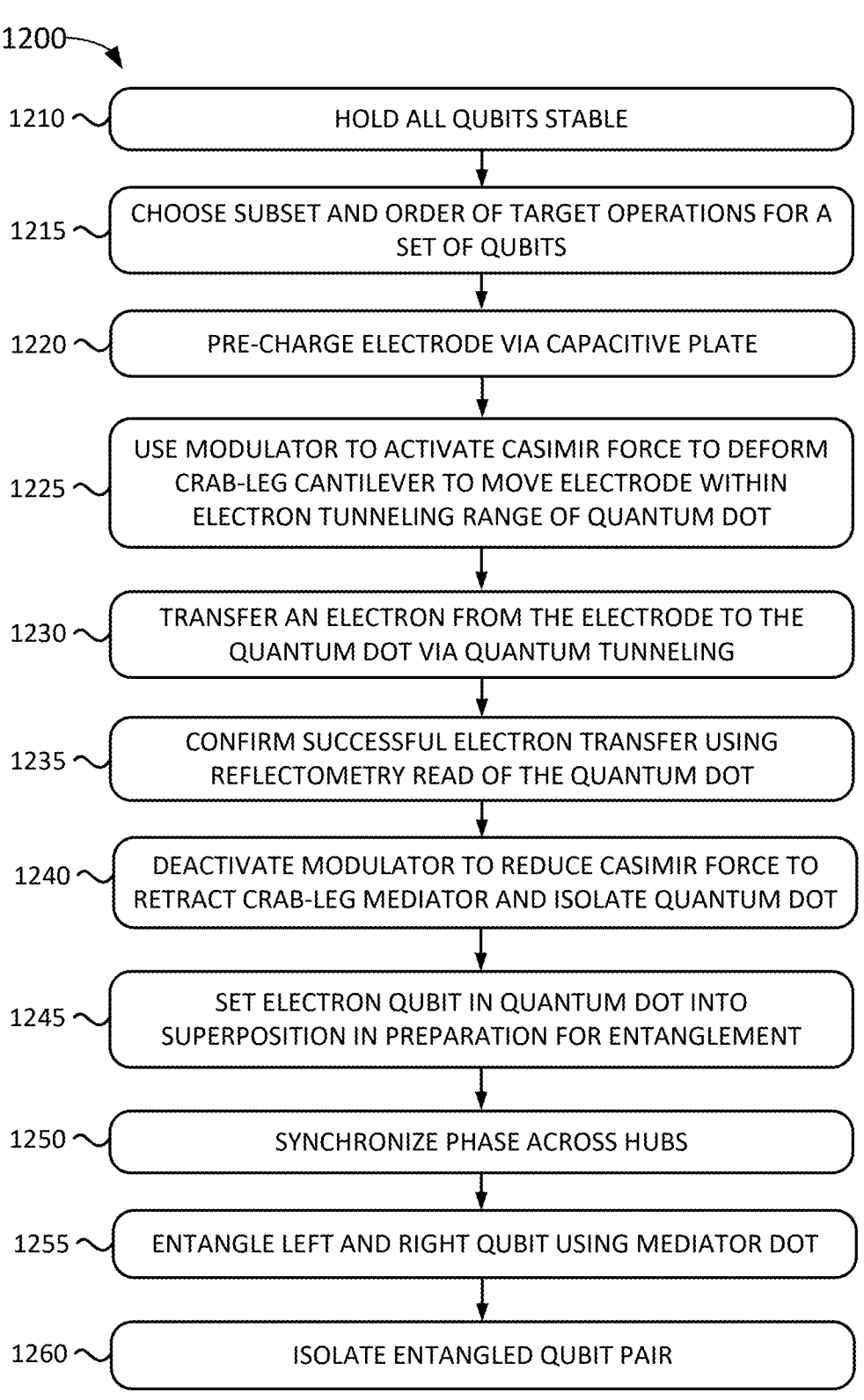

1200

1210 — HOLD ALL QUBITS STABLE

1215 — CHOOSE SUBSET AND ORDER OF TARGET OPERATIONS FOR A SET OF QUBITS

1220 — PRE-CHARGE ELECTRODE VIA CAPACITIVE PLATE

1225 — USE MODULATOR TO ACTIVATE CASIMIR FORCE TO DEFORM CRAB-LEG CANTILEVER TO MOVE ELECTRODE WITHIN ELECTRON TUNNELING RANGE OF QUANTUM DOT

1230 — TRANSFER AN ELECTRON FROM THE ELECTRODE TO THE QUANTUM DOT VIA QUANTUM TUNNELING

1235 — CONFIRM SUCCESSFUL ELECTRON TRANSFER USING REFLECTOMETRY READ OF THE QUANTUM DOT

1240 — DEACTIVATE MODULATOR TO REDUCE CASIMIR FORCE TO RETRACT CRAB-LEG MEDIATOR AND ISOLATE QUANTUM DOT

1245 — SET ELECTRON QUBIT IN QUANTUM DOT INTO SUPERPOSITION IN PREPARATION FOR ENTANGLEMENT

1250 — SYNCHRONIZE PHASE ACROSS HUBS

1255 — ENTANGLE LEFT AND RIGHT QUBIT USING MEDIATOR DOT

1260 — ISOLATE ENTANGLED QUBIT PAIR

FIG. 12

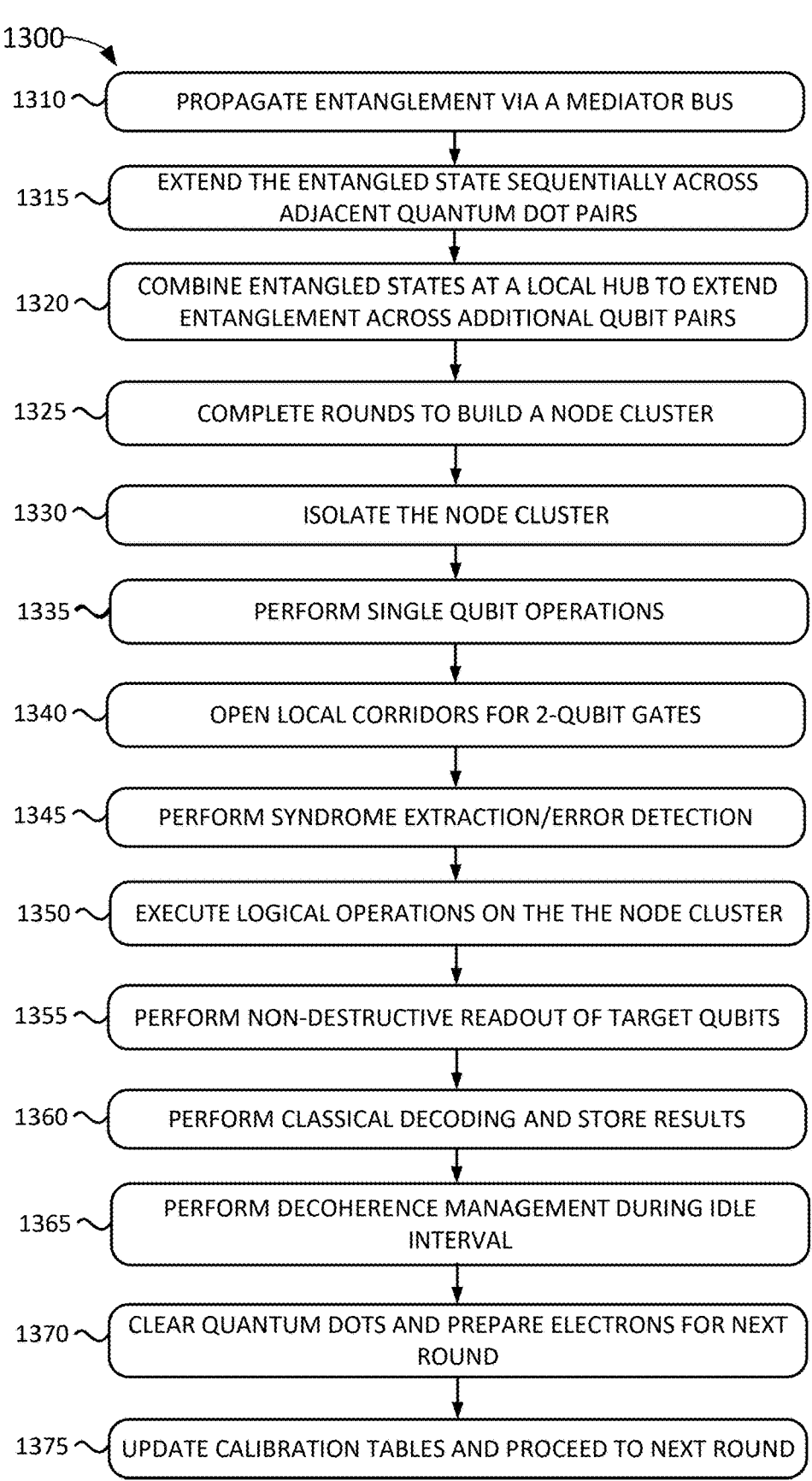

1300

1310 — PROPAGATE ENTANGLEMENT VIA A MEDIATOR BUS

1315 — EXTEND THE ENTANGLED STATE SEQUENTIALLY ACROSS ADJACENT QUANTUM DOT PAIRS

1320 — COMBINE ENTANGLED STATES AT A LOCAL HUB TO EXTEND ENTANGLEMENT ACROSS ADDITIONAL QUBIT PAIRS

1325 — COMPLETE ROUNDS TO BUILD A NODE CLUSTER

1330 — ISOLATE THE NODE CLUSTER

1335 — PERFORM SINGLE QUBIT OPERATIONS

1340 — OPEN LOCAL CORRIDORS FOR 2-QUBIT GATES

1345 — PERFORM SYNDROME EXTRACTION/ERROR DETECTION

1350 — EXECUTE LOGICAL OPERATIONS ON THE THE NODE CLUSTER

1355 — PERFORM NON-DESTRUCTIVE READOUT OF TARGET QUBITS

1360 — PERFORM CLASSICAL DECODING AND STORE RESULTS

1365 — PERFORM DECOHERENCE MANAGEMENT DURING IDLE INTERVAL

1370 — CLEAR QUANTUM DOTS AND PREPARE ELECTRONS FOR NEXT ROUND

1375 — UPDATE CALIBRATION TABLES AND PROCEED TO NEXT ROUND

FIG. 13

CASIMIR-EFFECT BASED TUNNEL TRANSISTOR UTILIZING GRAPHENE

CROSS REFERENCE TO RELATED APPLICATIONS

This patent application is a continuation-in-part of U.S. patent application Ser. No. 19/202,232, entitled "CASIMIR-EFFECT-BASED TUNNEL TRANSISTOR USING GRAPHENE-DOPED CONDUCTORS" and filed on May 8, 2025, and this application claims benefit of priority to U.S. Provisional Application No. 63/780,389, entitled "CASIMIR-EFFECT-BASED TUNNEL TRANSISTOR UTILIZING GRAPHENE-DOPED CONDUCTORS" and filed on Mar. 30, 2025, each of which is hereby incorporated herein by reference in their entireties.

TECHNICAL FIELD

These teachings relate to semiconductor devices and, more specifically, to quantum computing devices.

BACKGROUND

Classical computing relies on binary logic, where information is represented as bits that take on values of either 0 or 1. Classical computers process data sequentially through deterministic operations, making them highly effective for a wide range of tasks. As computational problems grow in complexity, however, classical architectures face significant limitations. Examples of computational problems that may strain the limits of classical computing include simulating molecular interactions, optimizing large-scale systems, and/or factoring large numbers. The time and resources required to solve such problems increase exponentially, rendering many advanced applications impractical with classical computing.

Quantum computing addresses the limitations of classical computing by harnessing quantum mechanical principles such as superposition and entanglement. Instead of bits, quantum computers use qubits, which can exist in multiple states simultaneously, enabling parallel computation on a scale not available with classical computers. Quantum algorithms exploit these properties to reduce computational complexity dramatically, solving certain problems exponentially faster than classical approaches. This capability opens transformative opportunities in fields like cryptography, materials science, and artificial intelligence, where quantum systems can deliver solutions that may be hard to achieve with classical computing.

Manufacturing quantum computers is challenging, however, because qubits may be sensitive to environmental noise, temperature fluctuations, and electromagnetic interference, which can cause decoherence and loss of quantum information. Furthermore, maintaining quantum states may require ultra-low temperatures, precise control of materials, and/or highly specialized fabrication techniques that minimize defects at the atomic scale. Thus, manufacturing a reliable and scalable quantum computing device presents various obstacles.

BRIEF DESCRIPTION OF DRAWINGS

A full and enabling disclosure of the aspects of the present description, including the best mode thereof, directed to one of ordinary skill in the art, is set forth in the specification, which refers to the appended figures, in which:

FIG. 10 is a flowchart of a process for manufacturing a quantum device according to an embodiment described herein.

FIG. 12 is a flowchart of a process for using a quantum device according to an embodiment described herein.

FIG. 13 is a flowchart of another process for using a quantum device according to an embodiment described herein.

Figure 1A:
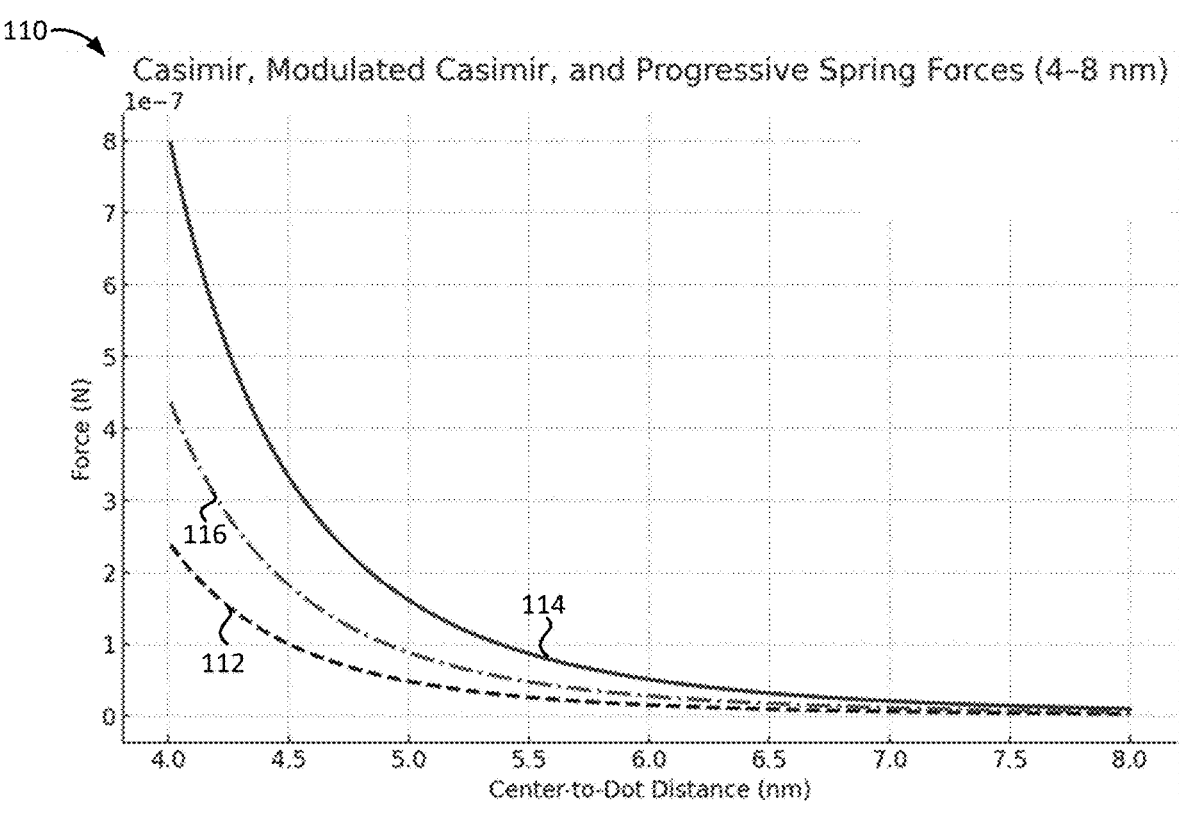
FIG. 1A is a plot diagram of a Casimir force versus distance.

Elements in the figures are illustrated for simplicity and clarity and have not necessarily been drawn to scale. For example, the dimensions and/or relative positioning of some of the elements in the figures may be exaggerated relative to other elements to help to improve understanding of various embodiments of the present teachings. Also, common but well-understood elements that are useful or necessary in a commercially feasible embodiment are often not depicted in order to facilitate a less obstructed view of these various embodiments of the present teachings. Certain actions and/or steps may be described or depicted in a particular order of occurrence while those skilled in the art will understand that such specificity with respect to sequence is not actually required. For example, while a series of blocks are described with respect to a flowchart, the order of the blocks may be modified in other implementations. Further, non-dependent blocks may be performed in parallel.

DETAILED DESCRIPTION

Reference will now be made in detail to present embodiments of the disclosure, one or more examples of which are illustrated in the accompanying drawings. The detailed description uses numerical and letter designations to refer to features in the drawings. Like or similar designations in the drawings and description have been used to refer to like or similar parts of the disclosure.

The terms and expressions used herein have the ordinary technical meaning as is accorded to such terms and expressions by persons skilled in the technical field as set forth above except where different specific meanings have otherwise been set forth herein. The word "or" when used herein shall be interpreted as having a disjunctive construction rather than a conjunctive construction unless otherwise specifically indicated. The terms "coupled," "fixed," "attached to," and the like refer to both direct coupling, fixing, or attaching, as well as indirect coupling, fixing, or attaching through one or more intermediate components or features, unless otherwise specified herein. The singular forms "a," "an," and "the" include plural references unless the context clearly dictates otherwise. Further, the phrase "based on" is intended to mean "based, at least in part, on" unless explicitly stated otherwise. No element, act, or instruction in the present application should be construed as critical or essential to the embodiments described herein unless explicitly described as such.

Approximating language, as used herein throughout the specification and claims, is applied to modify any quantitative representation that could permissibly vary without resulting in a change in the basic function to which it is related. Accordingly, a value modified by a term or terms such as "about," "approximately," and "substantially," are not to be limited to the precise value specified. In at least some instances, the approximating language may correspond to the precision of an instrument for measuring the value, or the precision of the methods or machines for constructing or manufacturing the components and/or systems. For example, the approximating language may refer to being within a 1, 2, 5, or 10 percent margin. These approximating margins may apply to a single value, either or both endpoints defining numerical ranges, and/or the margin for ranges between endpoints. Here and throughout the specification and claims, range limitations are combined and interchanged, such ranges are identified and include all the sub-ranges contained therein unless context or language indicates otherwise. For example, all ranges disclosed herein are inclusive of the endpoints, and the endpoints are independently combinable with each other.

It is additionally noted that the term "substantially" is also utilized herein to represent an inherent degree of uncertainty that may be attributed to any quantitative comparison, value, measurement, or other representation. The term "substantially" is also utilized herein to represent the degree by which a quantitative representation may vary from a stated reference without resulting in a change in the basic function of the subject matter at issue.

The word "exemplary" is used herein to mean "serving as an example, instance, or illustration." Any implementation described herein as "exemplary" is not necessarily to be construed as preferred or advantageous over other implementations. Additionally, unless specifically identified otherwise, all embodiments described herein should be considered exemplary. As used herein, the terms "first," "second," and "third" may be used interchangeably to distinguish one component from another and are not intended to signify location or importance of the individual components.

A class of quantum computing devices uses spin qubits based on the spin state of a single electron in a quantum dot. As semiconductor devices approach the limits of miniaturization, traditional transistor architectures face challenges related to power efficiency, quantum tunneling leakage, and heat dissipation. The Casimir effect, which arises from quantum vacuum fluctuations between closely spaced conductive surfaces, presents an opportunity to develop novel transistor architectures that leverage this force for electronic switching.

Graphene-doped conductors exhibit exceptional electrical and mechanical properties, making them suitable for enhancing the stability and efficiency of nanoscale electronic components. By integrating the Casimir effect into transistor gate operation, an energy-efficient and/or high-speed alternative to conventional field-effect transistors (FETs) is described herein.

Implementations described herein provide a tunnel transistor in which vacuum fluctuations induce a dynamically tunable gate potential. The transistor includes source and drain electrode that includes a graphene-doped conductor, a vacuum tunneling barrier situated between the source and drain electrode, and a central graphene quantum dot. This approach is engineered to exploit the Casimir effect for gate modulation, with a central graphene layer enabling controlled single electron tunneling, and a gate structure that dynamically alters the separation of the source and drain by switching the Casimir force, thereby controlling the electron tunneling probability.

By varying the distance between the source and drain with a vacuum tunneling barrier, the device enables rapid and low-power electronic state transitions without requiring traditional electrostatic gating mechanisms. With finely tuned gap separation, single electron tunneling across the vacuum can be achieved creating preserved spin coherence. The vacuum environment mitigates decoherence that material conducting barriers create due to vibration. The graphene doped conductors enhance spin-orbit coupling and the gate voltage can control the tunneling and induce Rashba spin-orbit interactions. Varying the barrier width and the Fermi level in a local area of the middle graphene layer can control the time and place of the trapped electron, effectively initializing, manipulating, and reading out a electron spin based qubit. The graphene doping enables electron spin control in the source and spin filtering on the drain. Electron spin resonance (ESR) enables coherent manipulation of the electron spin state. Non-destructive readout may be performed separately using capacitive/reflectometry sensing (e.g., via a sub-dot capacitive plate), optionally combined with spin-to-charge conversion schemes depending on the implementation.

The transistor operates by harnessing the Casimir force to regulate quantum tunneling. When the gate structure is adjusted, the Casimir force changes, modifying the potential landscape of the tunneling barrier. This modulation alters the probability of electron tunneling from the source to the drain, effectively switching the transistor on or off.

The source and drain electrodes are composed of graphene-doped conductors, providing high conductivity and low electron scattering. The tunneling barrier consists of a nanometer-scale insulating layer engineered to maximize sensitivity to Casimir forces. The gate structure uses nanoscale elements whose controlled separation sets the effective tunneling gap and therefore the tunneling probability. This movement can be controlled via nanomechanical switches for precise electronic modulation. The applications of the device described herein include Ultra-Low Power computing, resulting in reducing energy consumption in logic circuits and/or quantum computing that enables tunable electron spin qubits.

The quantum device may include a quantum tunneling transistor comprising a source electrode and a drain electrode comprising graphene-doped conductive materials, spaced to define a vacuum tunneling gap; a suspended monolayer graphene gate electrode positioned above the vacuum tunneling gap, wherein said graphene gate is electrically coupled to a voltage source to dynamically modulate its surface conductivity, wherein modulation of the gate conductivity alters the Casimir force between the gate and the source electrode, thereby adjusting the effective tunneling barrier between the source and the drain; and wherein the monolayer graphene gate further comprises a laterally confined region defining a quantum dot configured to localize a single electron whose spin or charge state encodes quantum information. The quantum dot may be formed by lateral electrostatic confinement applied to the suspended graphene sheet, providing Fermi level local control. The gate voltage in the quantum device may induce mechanical displacement of the graphene gate via Casimir attraction, thereby dynamically varying the tunneling gap between the gate and the source. The quantum state of the trapped electron may be read out via spin-dependent tunneling between the quantum dot and the source and the drain electrodes or via a capacitive plate located under the quantum dot. A radio frequency modulated pulse on the source and/or drain electrodes modulates the Casimir force between the source and/or drain electrode and the quantum dot, drawing the source and/or drain electrodes within electron tunneling range, and ceasing the pulse demodulates the Casimir force to cause the source and/or drain electrode to withdraw after injecting an electron into the quantum dot. The quantum device transistor may be integrated into a low-power logic circuit and/or in a quantum computing architecture.

By utilizing Casimir forces to precisely move the source and drain in a vacuum with a central graphene layer to control electron flow, the transistor represents a breakthrough in low-power, high-speed electronic switching. The integration of graphene-doped conductors and a Fermi level controlled central graphene layer further enhances performance, making this technology suitable for next-generation computing applications.

Implementations described herein further include a quantum device that includes an actuator comprising a graphene material and having a proximal end mounted to an actuator anchor; an electrode disposed on a distal end of the actuator; a quantum dot configured to localize a single electron, wherein the quantum dot and the electrode are disposed within a common vacuum to define a tunneling gap; a quantum dot anchor, comprising the graphene material, wherein the quantum dot anchor is disposed in a same plane as the quantum dot relative to the electrode; and a modulator configured to emit electromagnetic signaling within a particular frequency range, wherein the graphene material is tuned to increase a Casimir force between the electrode and the quantum dot anchor in response to the modulator emitting the electromagnetic signaling within the particular frequency range, and wherein the increased Casimir force causes the actuator to deform to bring the electrode within an electron tunneling range of the quantum dot. The quantum device may be enclosed in a vacuum environment and configured to maintain a spin coherence of the single electron for at least 1 to 3 milliseconds.

The actuator may include a crab-leg cantilever with a set of segments connected by joints, configured to extend the electrode toward the quantum dot through deformation of the joints. The crab-leg cantilever may include progressive spring biasing of the segments toward the electrode. The crab-leg cantilever may further include at least one angular stop configured to prevent the crab-leg cantilever from extending beyond a position selected to prevent stiction between the electrode and the quantum dot anchor, and/or at least one hard stop configured to prevent the crab-leg cantilever from extending beyond a position selected to prevent stiction between the electrode and the quantum dot anchor. The crab-leg cantilever may be configured to move the electrode from a position approximately 8 nanometers from the quantum dot to a position approximately 2 nanometers from the quantum dot.

The quantum device may further include a substrate and an electrode capacitive plate located on the substrate at a position aligned with the electrode when the electrode is within the electron tunneling range of the quantum dot. The electrode capacitive plate may be configured to charge the electrode and cause an electron to tunnel from the electrode to the quantum dot to store a qubit in the quantum dot. The quantum device may further include a quantum dot capacitive plate located on the substrate at a position aligned with the quantum dot. The quantum dot capacitive plate (also referred to herein as a "sub-dot capacitive plate") may be configured to capacitively sense a charge state or electron occupancy of the quantum dot and/or to perform mid-circuit non-destructive readout without removing the electron from the qubit. The quantum device may further include a microwave stripline located at a position aligned with the quantum dot. The microwave stripline may be configured to deliver an oscillating magnetic field for ESR-based X/Y rotations of a qubit stored in the quantum dot, while Z operations may be implemented using capacitive biasing. Readout may be performed using the sub-dot capacitive plate in a non-destructive mode during operation and a final projective measurement at the end of the cycle.

The quantum device may further include a mirror quantum dot positioned opposite the actuator with respect to the quantum dot and a mediator quantum dot, located within a dispersive coupling range of the quantum dot and within a dispersive coupling range of the mirror quantum dot. The mediator quantum dot may enable entanglement between a first qubit stored in the quantum dot and a second qubit stored in the mirror quantum dot. The mediator quantum dot may include a second graphene material, different from the electrode graphene material, and a mediator quantum dot modulator configured to emit electromagnetic frequency at a second frequency range, different from the particular frequency range. The second graphene material may be tuned to increase the dispersive interaction strength, enabling detuned dispersive ZZ coupling while maintaining energetic detuning and preventing electron tunneling or exchange coupling to propagate entanglement between adjacent quantum dots, in response to the mediator quantum dot modulator emitting the electromagnetic frequency at the second frequency range. Detuned dispersive ZZ coupling refers to coupling two qubits which are kept from being in resonance with each other so that the two qubits do not swap excitations. Instead, the coupling occurs through virtual and off-resonant transitions, which produce an effective conditional phase interaction governed by the equation:

$$H_{eff} \approx 2\omega_1\sigma_{z1} + 2\omega_2\sigma_{z2} + 4\chi_{zz}\sigma_{z1}\sigma_{z2},$$

where $H_{eff}$ is the effective Hamiltonian, $\omega 1$ and $\omega 2$ are the angular frequencies of qubit 1 and qubit 2, $\sigma_{z1}$ and $\sigma_{z2}$ the Pauli-Z operators acting on qubit 1 and qubit 2 (which measure the state along the Z-axis), and $X_{ZZ}$ is the ZZ coupling strength, also referred to as the cross-Kerr interaction between the two qubits, which determines how strongly the phase of one qubit depends on the state of the other qubit (e.g., whether the other qubit is in the |0> state or the |1> state). A dispersive condition occurs when $|\Delta|>>g$ (e.g., $|\Delta|\geq5$ g, for example), where g corresponds to the coupling rate and where A corresponds to the detuning between the interacting modes of the two qubits. Detuning, expressed in radians per second, refers to the difference in the angular frequencies between the two qubits: $\Delta=\omega_1-\omega_2$. The coupling rate g, expressed in radians per second, quantifies how strongly the two qubits interact and how fast the two qubits can exchange energy if they were on resonance.

The quantum device may further include a mediator bus of sets of pairs of quantum dots. The mediator bus may be configured to propagate an entanglement of the first qubit and the second qubit to an adjacent pair of addressable quantum dots. The quantum device may include sets of addressable quantum dots, and the mediator bus may be configured to propagate entanglement between adjacent pairs of the sets of pairs of addressable quantum dots through sequential detuned dispersive ZZ interactions, and without wavefunction overlap, electron transport, or exchange coupling, wherein the sets of pairs of addressable quantum dots includes the quantum dot and the mirror quantum dot as a pair of the sets of pairs of addressable quantum dots. The sets of pairs of quantum dots of the mediator bus may also include the second graphene material. The entanglement is mediated through a detuned dispersive ZZ coupling mechanism in which each qubit remains localized and no electron transfer occurs between qubits. Thus, as used herein, references to a qubit wavefunction describe the localized quantum state of an individual electron. Entanglement and coupling do not rely on sustained spatial wavefunction overlap or exchange coupling, but instead arise from dispersive, detuned interactions producing effective ZZ-type phase coupling through virtual charge admixture.

Implementations described herein further include a quantum system that includes a first quantum device comprising a first quantum dot configured to localize a single electron; and a first actuator comprising a graphene material, wherein the graphene material is tuned to increase a Casimir force in response electromagnetic signaling within a frequency range, and wherein the increased Casimir force causes the first actuator to deform to bring a first electrode within an electron tunneling range of the first quantum dot; and a second quantum device comprising a second quantum dot configured to localize a single electron; and a second actuator comprising the graphene material, wherein the graphene material is tuned to increase the Casimir force in response electromagnetic signaling within the frequency range, and wherein the increased Casimir force causes the second actuator to deform to bring a second electrode within an electron tunneling range of the second quantum dot; and a mediator quantum dot, located within a dispersive coupling range of the quantum dot and within a dispersive coupling range of the mirror quantum dot, wherein the mediator quantum dot enables entanglement between a first qubit stored in the first quantum dot and a second qubit stored in the second quantum dot. The first quantum dot, the second quantum dot, and the mediator quantum dot comprise a second graphene material that is different from a graphene material of the electrodes, wherein the second graphene material is tuned, in response to electromagnetic signaling in a second frequency range, to increase an effective detuned dispersive ZZ coupling strength between electron-spin qubits, thereby enabling entanglement propagation between adjacent quantum dots without electron tunneling or exchange coupling.

Implementations described herein further include a quantum system that includes multiple quantum devices, each of which includes an actuator comprising a graphene material and having a proximal end mounted to an actuator anchor; an electrode disposed on a distal end of the actuator; a quantum dot configured to localize a single electron, wherein the quantum dot and the electrode are disposed within a common vacuum to define a tunneling gap; a quantum dot anchor, comprising the graphene material, wherein the quantum dot anchor is disposed in a same plane as the quantum dot relative to the electrode; and a modulator configured to emit electromagnetic signaling within a particular frequency range, wherein the graphene material is tuned to increase a Casimir force between the electrode and the quantum dot anchor in response to the modulator emitting the electromagnetic signaling within the particular frequency range, and wherein the increased Casimir force causes the actuator to deform to bring the electrode within an electron tunneling range of the quantum dot; and a mediator bus of multiple pairs of quantum dots, wherein the mediator bus is configured to propagate an entanglement of qubits stored by the quantum devices.

Implementations described herein further include a method of using a quantum device that includes charging an electrode located at an end of an actuator comprising a graphene material; activating a modulator to emit electromagnetic signaling within a particular frequency range, wherein the graphene material is tuned to increase a Casimir force between the electrode and a quantum dot anchor in response to the modulator emitting the electromagnetic signaling within the particular frequency range, wherein the quantum dot anchor comprises the graphene material; deforming the actuator toward the quantum dot anchor, in response to the increased Casimir force, wherein deforming the actuator brings the electrode within an electron tunneling range of a quantum dot; and causing an electron to tunnel from the charged electrode to the quantum dot to store a qubit in the quantum dot.

The method may further include confirming a successful transfer of the electron from the charged electron to the quantum dot by performing a reflectometry read of the quantum dot using a quantum dot capacitive plate located on a substrate at a position aligned with the quantum dot; and deactivating the modulator to retract the actuator away from the quantum dot, based on confirming the successful transfer of the electron from the charged electron to the quantum dot.

The method may further include setting the qubit in the quantum dot using an oscillating magnetic field generated by a microwave stripline located at a position aligned with the quantum dot, entangling the qubit with a mirror qubit located in a mirror quantum dot using a mediator quantum dot located between the qubit and the mirror qubit, and propagating the entanglement to a mediator bus of quantum dots, wherein the mediator bus is configured to propagate the entanglement to an adjacent pair of quantum dots.

The method may further include entangling the entangled qubit with another entangled qubit to generate a set of entangled qubits, generating a cluster of entangled qubits using the mediator bus, wherein the cluster of entangled qubits includes at least three hundred qubits, performing a quantum computing operation on the cluster of entangled qubits, performing non-destructive readout for mid-circuit error correction, and reading out a result of the quantum computing operation on the cluster of entangled qubits.

Implementations described herein further include a method of making a quantum device that includes forming, on a substrate, a quantum dot configured to localize a single electron, wherein the quantum dot comprises a first graphene material; forming, on the substrate, a quantum dot anchor comprising a second graphene material; forming, on the substrate, an actuator comprising the second graphene material; forming an electrode on the actuator; and forming a modulator configured to emit electromagnetic signaling within a particular frequency range, wherein the second graphene material is tuned to increase a Casimir force between the electrode and the quantum dot anchor in response to the modulator emitting the electromagnetic signaling within the particular frequency range, and wherein the increased Casimir force causes the actuator to deform to bring the electrode within an electron tunneling range of the quantum dot.

Forming the actuator may include forming a crab-leg cantilever with a plurality of segments connected by joints, wherein the crab-leg cantilever is configured to extend the electrode toward the quantum dot through deformation of the joints, configuring the crab-leg cantilever to include a progressive spring biasing of the plurality of segments toward the electrode, and/or configuring the crab-leg cantilever to include at least one angular stop configured to prevent the crab-leg cantilever from extending beyond a position selected to prevent stiction between the electrode and the anchor.

The method may further include forming, on the substrate, at least one hard stop, wherein the at least one hard stop is configured to prevent the crab-leg cantilever from extending beyond a position selected to prevent stiction between the electrode and the anchor. The method may further include forming an electrode capacitive plate on the substrate at a position aligned with the electrode when the actuator is within the electron tunneling range of the quantum dot, wherein the electrode capacitive plate is configured to charge the electrode and cause an electron to tunnel from the electrode to the quantum dot to store a qubit in the quantum dot.

The method may further include forming a quantum dot capacitive plate on the substrate at a position aligned with the quantum dot, wherein the quantum dot capacitive plate is configured to capacitively sense a charge state or electron occupancy of the quantum dot and to perform mid-circuit non-destructive readout without removing the electron. The method may further include forming a microwave stripline at a position aligned with the quantum dot, wherein the microwave stripline is configured to deliver an oscillating magnetic field to a qubit stored in the quantum dot to manipulate the stored qubit, after a non-destructive readout occurs by ESR excitation via the microwave stripline and capacitive sensing via the via the sub-dot capacitive plate for dynamic control and error correction prior to a final destructive readout.

The method may further include forming a mirror quantum dot positioned opposite the quantum dot actuator with respect to the quantum dot, and a mirror actuator and electrode, wherein the mirror quantum dot comprises the first graphene material; and forming a mediator quantum dot, located within the dispersive coupling range of the quantum dot and within the dispersive coupling range of the mirror quantum dot, wherein the mediator quantum dot comprises a second graphene material different from the graphene material of the electrodes, and wherein the mediator quantum dot enables entanglement between a first qubit stored in the quantum dot and a second qubit stored in the mirror quantum dot.

The method may further include forming a mediator quantum dot modulator configured to emit an electromagnetic signal within a second frequency range that is different from the particular frequency range, wherein a second graphene material associated with a plurality of quantum dots is tuned, in response to the mediator quantum dot modulator emitting the electromagnetic signal within the second frequency range, to increase an effective detuned dispersive ZZ coupling strength that propagates entanglement between adjacent quantum dots through sequential ZZ interactions, without enabling electron tunneling or exchange coupling. The method may further include forming a mediator bus of pairs of quantum dots, wherein the mediator bus is configured to propagate an entanglement of the first qubit and the second qubit to an adjacent pair of addressable quantum dots. The method may further include forming pairs of addressable quantum dots, wherein the mediator bus is configured to propagate entanglement between adjacent pairs of the plurality pairs of addressable quantum dots, and wherein the pairs of addressable quantum dots includes the quantum dot and the mirror quantum dot as a pair of the pairs of addressable quantum dots.

In further implementations, a quantum device may employ a static Casimir-bias configuration in which the electrode remains fixed relative to the substrate and the quantum dot, while the electron tunneling probability is controlled through dynamic modulation of the Casimir force. Rather than relying on mechanical displacement of the electrode, the electrode remains fixed in a location separated from the quantum dot by a nanoscale electrode-to-dot tunneling gap in the range from approximately 6 nanometers (nm) to approximately 10 nm and field-induced variations in graphene conductivity are used to alter the effective vacuum pressure across the tunneling gap. The electrode includes a graphene material and the dielectric and/or optical properties of the graphene material may be tuned so that graphene material responds to electromagnetic signaling in a particular frequency range. A modulator that emits electromagnetic signaling in the particular frequency range modulates the Casimir force between the electrode and the quantum dot to adjust the tunneling probability in the graphene material of the electrode to increase the effective tunneling probability, across the tunneling gap, of an electron to tunnel from the electrode to the quantum dot.

The static configuration of the quantum device includes an electrode with a monolayer or bilayer of graphene that functions as a tunable Casimir gate. When a radio frequency (RF), terahertz frequency, or optical modulation signal is applied to the graphene material, the surface conductivity and corresponding permittivity tensor changes dynamically, resulting in a variable Casimir coefficient (n) that modulates the potential energy landscape experienced by the electrons in the graphene material. The change in the Casimir force alters the local electron tunneling barrier height and thus the electron tunneling probability between the electrode and the quantum dot. As used herein, the Casimir coefficient n corresponds to a dimensionless factor representing an effective strength of a Casimir force normalized to a reference state. For example, a Casimir coefficient $\eta$ of 1.0 may correspond to an unmodulated state (and a high electron tunneling barrier) and a Casimir coefficient with a lower n value (e.g., $\eta$=0.3) corresponds to a modulated low-barrier state, with a higher electron tunneling probability, as a result of a modulation signal.

In the static Casimir-bias configuration, the quantum dot may be defined electrostatically within a suspended graphene gate, configured to trap a single electron whose spin or charge state encodes quantum information. Because the electrode remains stationary, mechanical fatigue and stiction risks are eliminated, providing improved reliability for cryogenic operation. The modulation of tunneling probability through Casimir-bias control enables precise and repeatable tuning of qubit injection and readout cycles without introducing mechanical noise.

In operation, the static Casimir-bias quantum device operates as follows. During idle mode, the graphene electrode is biased to a high-barrier state ($\eta_H \approx 1.0$) to prevent electron tunneling. During injection or entanglement phases, an applied modulation pulse reduces the Casimir coefficient to a low-barrier state ($\eta_L \approx 0.3$), effectively lowering the potential tunneling barrier and enabling electron tunneling between the electrode and the quantum dot. When the modulation signal ceases, the Casimir force returns to the high-barrier state, isolating the qubit in the quantum dot and maintaining coherence. The injection process enables sub-nanosecond (ns) modulation speeds with no physical motion, making the static Casimir-bias quantum device well suited for scalable qubit arrays.

The static Casimir-bias quantum device may incorporate layered materials such as hBN or dielectric heterostructures to maintain mechanical rigidity and/or to define optical or plasmonic resonance conditions that enhance Casimir tunability. The static Casimir-bias quantum device may be enclosed within an ultra-high vacuum cavity to preserve the integrity of the Casimir interaction and suppress thermal noise. The static Casimir-bias quantum device may enable the same fundamental operation as the quantum device with a movable electrode, while reducing fabrication complexity and increasing integration density for large-scale quantum processors.

Furthermore, the quantum devices described herein may be incorporated into a quantum information processor that is configured for large-scale entanglement and Hilbert space expansion. Each static Casimir-bias graphene qubit may operate as a quantum tunneling transistor with non-destructive capacitive sensing and Casimir-modulated control, enabling rapid and coherent operations across hundreds or thousands of quantum device units.

A representative configuration may include clusters of approximately three hundred and twenty qubits, each cluster forming a tile-level entangled fabric interconnected through mediator bus quantum dots. The tiles may be stitched via synchronized Casimir-bias couplers to form meta-clusters and high-order arrays, enabling coherent superposition states extending across hundreds of thousands of qubits.

The accessible Hilbert space dimensionality scales as $2^N$, where N represents the number of coherent qubits. For N=320, the system achieves an effective state space dimensionality of approximately $10^{100}$. At 320,000 qubits, representing one thousand linked tiles, the dimensionality approaches $10^{96300}$, providing an exponential computational domain that far exceeds classical simulation capacity.

The quantum processor architecture enables near-real-time construction of global entangled states within less than one hundred microseconds. Casimir-bias modulation and ESR control are synchronized with less than ten picoseconds skew, ensuring coherent phase propagation across all tiles. The synchronization supports scalable quantum error correction and entanglement depth sufficient for cryptographically significant computation. The quantum processor architecture also enables execution of algorithms such as Shor's integer factorization and lattice-based cryptographic reductions on key sizes exceeding two hundred fifty six bits in partially error-corrected configurations, and up to one thousand twenty four bits under fully corrected operation. The static Casimir-bias quantum device has a low error rate (e.g., an error rate of approximately $10^{-5}$) and stability at temperatures in the millikelvin (mK) range, which provide the necessary coherence time and gate fidelity for such operations. The resulting Hilbert space expansion and entanglement scalability demonstrate that the quantum processor architecture, utilizing the Casimir-bias graphene quantum devices described herein, accordingly achieves cryptographically significant computation. The cryptographic significance arises when the effective Hilbert-space dimensionality accessible under maintained coherence and entanglement depth supports modular-exponentiation operations on integers exceeding 256 bits, executed with gate fidelities above 99.9%. The quantum processor architecture combines vacuum field control, non-destructive measurement, and Casimir modulation to deliver both physical and logical scalability across modular quantum systems.

In some implementations, the quantum devices and/or quantum systems described herein may be configured to operate within a cryogenic environment between 1 mK and 4 mK to reduce phonon occupation and Johnson noise.

Referring now to the drawings, wherein identical numerals indicate the same elements throughout the figures, FIG. 1A is a plot diagram 110 of a Casimir force versus distance. Plot diagram 110 includes an unmodulated Casimir force 112, a modulated Casimir force 114, and a progressive spring force 116 of a cantilever extended as a result of a modulated Casimir force. The Casimir force between two parallel plates is given by $F=(\pi^2 \hbar c A)/(240 d^4)$, where F is the Casimir force, $\hbar$ is the reduced Planck's constant ($\hbar$=h/2$\pi$), c is the speed of light, A is the area of the plates, and d is the distance between the plates. For 100 nm×100 nm plates, this results in a strong force gradient useful for nanoscale actuation. At a 10 nm spacing, the Casimir force corresponds to approximately 1.3 nanonewtons (nN), which may be sufficient to cause a nanoelectromechanical (NEMS) actuator to move.

As shown in FIG. 1A, a Casimir force is increased through modulation, for example, by tuning a graphene material to respond to electromagnetic (EM) radiation in a particular frequency range. Such modulation can occur when the graphene material is tuned to increase the polarizability of the graphene, to increase the magnetic and/or plasmonic response of the graphene, and/or by increasing the Fermi level in the graphene material. As an example, boron, nitrogen, and/or hydrogen dopants may increase the polarizability of graphene, resulting in a stronger Casimir force. As another example, iron, nickel, cobalt, silver, and gold may increase the magnetic and/or plasmonic response of graphene, resulting in a stronger Casimir force. As yet another example, nitric acid ($HNO_3$), titanium dioxide nanoparticles ($TiO_2$), and/or polyacrylic acid (PAA) may induce a Fermi level shift in graphene, resulting in a stronger Casimir force. As yet another example, thin layers of metal, such as gold, palladium, or tungsten may tune the Fermi level of graphene via charge transfer, resulting in a stronger Casimir force. The progressive spring force 116 of a cantilever illustrates that a restoring spring force of a cantilever may return a cantilever to an original position after the cantilever has been deformed with a modulated Casimir force.

Figure 1B:
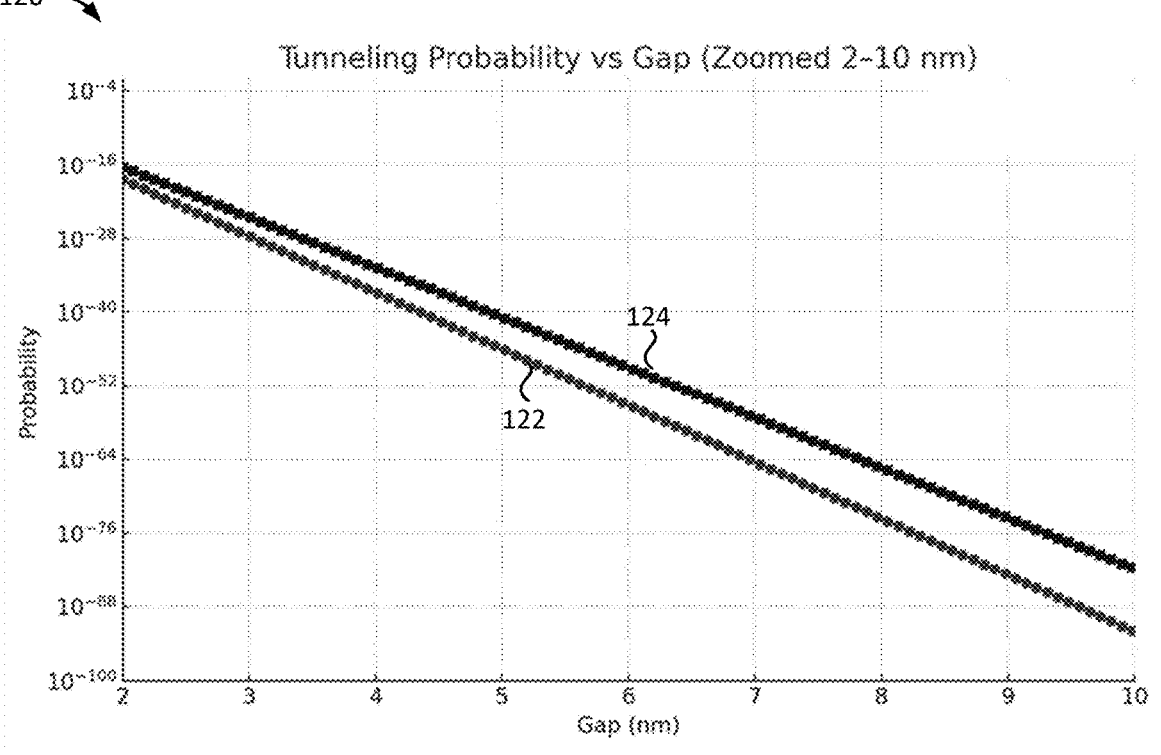
FIG. 1B is a plot diagram of tunneling probability versus distance.

FIG. 1B is a plot diagram 120 of electron tunneling probability versus distance. Plot diagram 120 includes an unmodulated electron tunneling probability 122 and a modulated electron tunneling probability 124. As shown in FIG. 1B, the tunneling probability is increased, and therefore the electron tunneling distance may be decreased, by adjusting the Fermi level of graphene. Therefore, by tuning a graphene material to respond to EM radiation in a particular frequency range to change the Fermi level of the graphene material, the electron tunneling distance in the graphene material is decreased.

In the graphene qubit architecture described herein, anisotropic and hyperbolic material properties are employed to enable dynamic modulation of the Casimir force between qubit elements. In an implementation that includes a movable electrode, as well as in an implementation that includes a static electrode, engineered anisotropic materials (e.g., one or more graphene layers and/or hexagonal boron nitride layers) alter the electromagnetic vacuum mode density between facing surfaces. As a result, the Casimir force or pressure is modulated in real time with minimal external noise, heat, or applied fields to enable quantum tunneling and entanglement behavior of electrons in the qubit. By optically or RF tuning the graphene's carrier density and/or permittivity, the quantum device creates a variable "Casimir pressure actuator" that effectively serves as a gate for electron tunneling.

The Casimir pressure between two plates can depend on the frequency-dependent reflectivity for electromagnetic modes. In anisotropic or hyperbolic materials, the dielectric permittivity tensor (ε) is direction-dependent, which changes the local density of electromagnetic states (LDOS) in the vacuum gap. An anisotropic medium can become hyperbolic when one principal component of ε is negative while the orthogonal component remains positive (for example, $\varepsilon_\perp<0$ and $\varepsilon_\parallel>0$ in a given frequency range, where is $\varepsilon_\perp$ the perpendicular component of the ε, and $\varepsilon_\parallel$ is the parallel component of the ε). In a hyperbolic regime, the vacuum may support high-wavevector electromagnetic modes that alter the Casimir energy gradient between the surfaces. Entering a hyperbolic dispersion regime may increase or suppress the Casimir force. Thus, by using graphene and hBN, a quantum device can achieve an on-demand Casimir force tuning mechanism. When one of the tensor components is driven negative (via optical or electrical biasing of the graphene's Fermi level), the Casimir attraction may be either enhanced or nearly nullified without any physical contact or large power dissipation.

Hyperbolic Casimir modulation may be implemented using graphene-hBN-graphene metamaterial stacks, which provide a tunable top graphene electrode, a mid-layer that can exhibit hyperbolic dispersion (e.g., multilayer hBN has $\varepsilon_\perp<0$ in parts of the infrared spectrum), and a bottom graphene layer as reference. Other implementations may employ metasurfaces or thin films, such as, for example, lithographically patterned graphene plasmonic metasurfaces, to achieve similar ε modulation. Yet other implementations may employ phase-change materials, such as, for example, vanadium oxide, MXene (e.g., two-dimensional transition metal carbides, nitride, and/or carbonitrides), and/or other types of phase-change materials, to modulate the Casimir force by altering optical properties of the phase-change material in response to applied EM signaling in a particular frequency range.

Leveraging anisotropy and hyperbolic materials for Casimir control enables scaling up of quantum processors. These material properties enable a form of "vacuum pressure transistor" where quantum vacuum forces are the medium of qubit control, rather than currents or voltages. By shaping the electromagnetic mode spectrum to modulate the Casimir force, the quantum device modulates the Casimir force to turn quantum tunneling on and off. This strategy yields low-noise, high-speed qubit control with non-invasive actuation and leaves the qubit in a coherent state until a final readout. Moreover, the approach inherently supports entanglement, in that multiple qubits can be coupled via Casimir-mediated buses or shared Casimir bias fields without requiring additional active qubit-to-qubit coupling hardware, by employing a first graphene material configured to modulate Casimir force and a second, differently tuned graphene material associated with the quantum dots, wherein the second graphene material responds to electromagnetic signaling in a different frequency range by increasing an effective detuned dispersive ZZ coupling strength between adjacent quantum dots. The use of anisotropic and hyperbolic materials in a quantum device provides a device that exhibits tunable, ultrafast, and decoherence-free qubit actuation, and enables scalability that results in coherent operation of arrays with millions of qubits through a parallel Casimir control scheme.

One example for tuning a graphene material is as follows. Adding a materials-dependent efficiency factor $\eta(\omega, E_F)$ yields the equation $F(d, \omega) \approx \eta(\omega, E_F, \text{stack}) \cdot (\pi^2 \hbar c/240) \cdot A/d^4$, for the Casimir force, where ω is the angular drive frequency and EF is the Fermi level of the graphene. The in-plane conductivity $\sigma(\omega, E_F)$ of graphene is expressed as $\sigma(\omega, E_F)=$Cintra $(\omega, E_F)+\sigma_{intera}(\omega, E_F)$, where Cintra $(\omega, E_F)$ corresponds to the intra-band conductivity and the $\sigma_{intera}(\omega), E_F)$ corresponds to the inter-band conductivity. At cryogenic temperatures with $\hbar\omega<<2|E_F|$, Pauli blocking suppresses inter-band absorption such that graphene behaves as a high-reflectivity metal. Near $\hbar\omega \approx 2|E_F|$, inter-band absorption increases and reflectivity decreases, lowering η.

An example design strategy includes setting $E_F$ and cavity thickness differently for two graphene materials, a first graphene material and a second graphene material. The first graphene material, used to increase the Casimir force and move an electrode within a tunneling range of a quantum dot, or lower the effective tunneling barrier (in fixed-electrode embodiments) to enable tunneling, is set to be reflective at the actuation band $f_{SD}$ and to be absorptive at a bus band $f_B$. The second graphene material, used to enable detuned dispersive ZZ coupling between quantum dots for a mediator quantum dot and/or a mediator bus, is set to be reflective at the bus band $f_B$ and absorptive at the actuation band $f_{SD}$. By selecting a first channel in a first frequency range $@_1$ with $\eta_A(\omega_1)$ to drive the motion of the electrode, and a second channel in a second frequency range $@_2$ with $\eta_B(\omega_2)$ to drive entanglement, a first graphene material and a second graphene material are used in the same device for two different purposes.

A stack of graphene, hexagonal Boron Nitride (hBN), and a metal may be applied to act as a sub-wavelength cavity. A quarter-wave condition enhances reflectivity at a target band $t=\lambda/(4\cdot\eta_{hBN})$, where $\eta_{hBN}$ is materials-dependent efficiency factor for hBN. By adjusting the thickness of hBN, the reflectivity at either the actuation band $f_{SD}$ or the bus band f are boosted while being suppressed in off-band frequencies. For example, an actuation channel may be set to the frequency range 100-200 gigahertz (GHz) and a bus channel may be set to the frequency range 2-5 terahertz (THz). Thus, a first graphene material is tuned to respond to EM signals in the 100-200 GHz range (e.g., to increase the Casimir force), and a second graphene material is tuned to respond to EM signals in the 2-5 THz range to increase an effective detuned dispersive coupling strength between adjacent quantum dots, without enabling electron tunneling or exchange. The first and second graphene materials may each be tuned using dopants and/or by tuning the thickness of an underlying hBN layer.

The resulting graphene materials can be tested to ensure that the desired response has been achieved. The graphene materials may be characterized using ellipsometry, Fourier Transform Infrared Spectroscopy (FTIR), and/or THz time-domain spectroscopy. Furthermore, the Casimir force and/or electron tunneling distances may be tested to ensure the proper response of the graphene materials. The reflectivity spectra of the graphene materials may be tested using ellipsometry and/or THz time-domain spectroscopy. The Casimir force may be tested on NEMS test devices. The electron tunneling distances may be tested using quantum dots and electrodes mounted to movable NEMS actuators.

Figure 1C:
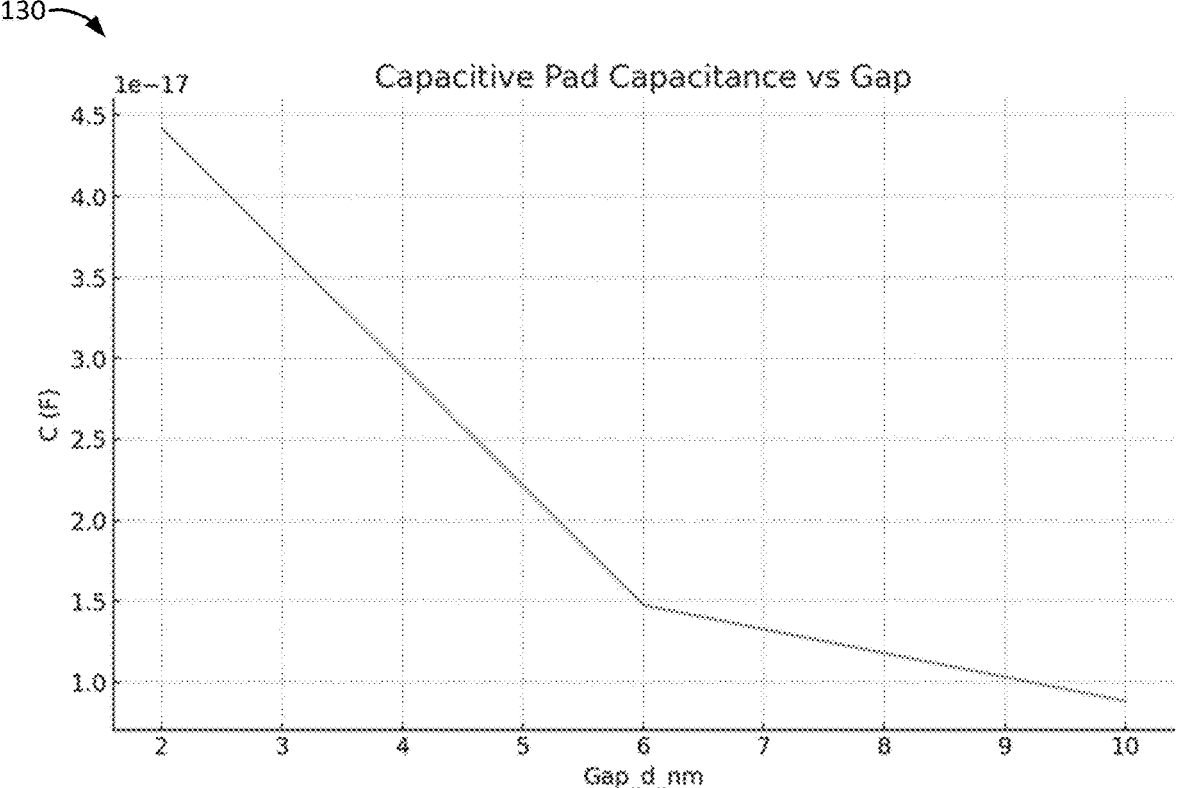
FIG. 1C is a plot diagram of capacitance versus distance.

FIG. 1C is a plot diagram 130 of capacitance versus distance between a capacitive pad and an electrode used for capacitive injection. As shown in FIG. 1C, at 2 nm, the capacitance is sufficient to achieve resistor-capacitor (RC) constants at less than a femtosecond with 50Ω lines, and the energy per pulse is on the order of $10^{-19}$ J at 0.1 V bias. This enables efficient non-contact electron injection to charge an electrode and cause an electron to tunnel from the electrode to a quantum dot. In contrast to quantum devices that require direct wiring, capacitive pad injection enables robust operation with reduced thermal load, resulting in longer coherence times for qubits.

Figure 1D:
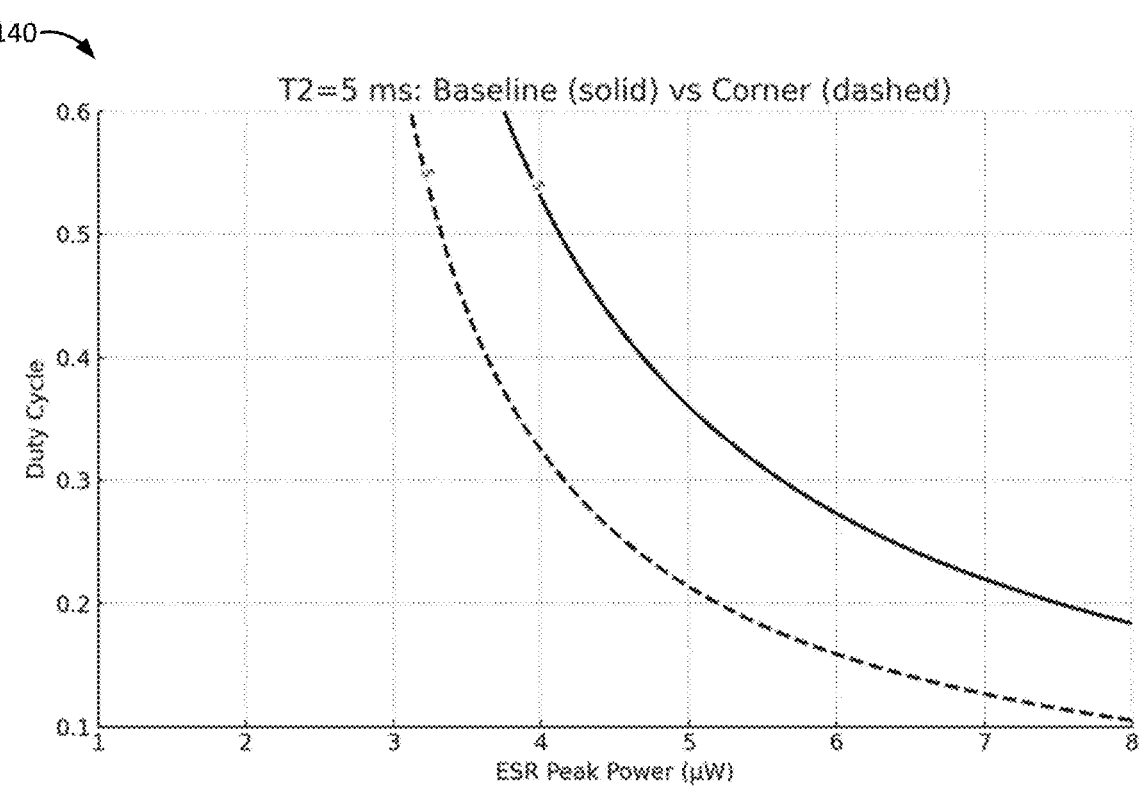
FIG. 1D is a plot diagram of duty cycle versus Electron Spin Resonance (ESR) peak power.
Figure 1E:
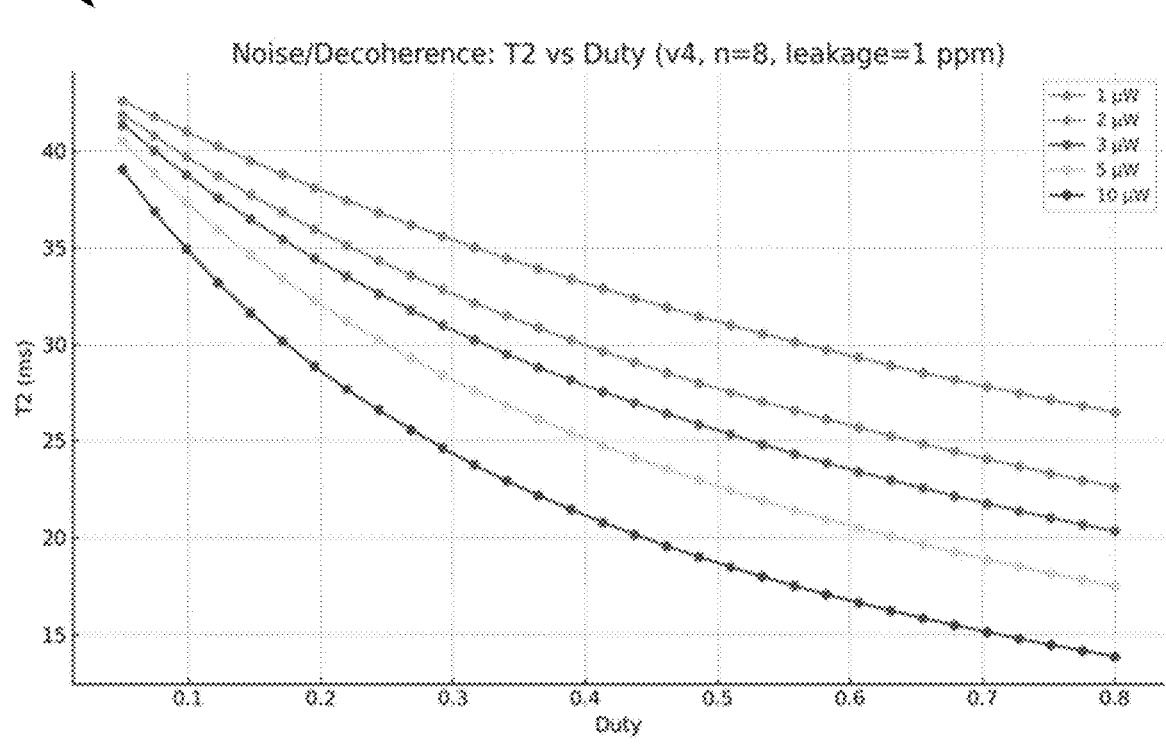
FIG. 1E is a plot diagram of T2 coherence time versus duty cycle.

FIG. 1D is a plot diagram 140 of duty cycle versus Electron Spin Resonance (ESR) peak power. FIG. 1E is a plot diagram 150 of T2 coherence time versus duty cycle. Electron Spin Resonance (ESR) enables precise control and readout of electron spin states, which serve as qubits in the quantum devices described herein. ESR operates by applying a microwave field at the electron's Larmor frequency, inducing transitions between spin states, while readout is performed separately via capacitive/reflectometry sensing (non-destructive, when configured for non-destructive readout) and/or a final projective measurement (destructive, when configured for destructive readout). This controlled manipulation allows for high-fidelity quantum gate operations, facilitates non-destructive state measurement through capacitive or magnetic sensing methods, provides for thermal and electrical efficiency, and readout enables mid-circuit control prior to a final destructive readout.

The integration of ESR into quantum devices addresses critical challenges in qubit control and scalability. By leveraging ESR, quantum systems can achieve accurate spin manipulation while preserving coherence, enabling error correction and reliable computation. Furthermore, ESR-based approaches are compatible with semiconductor fabrication processes, making them a promising pathway for large-scale quantum processor development.

In quantum devices, $T_2$ coherence time refers to the time over which a qubit maintains its phase coherence—that is, the relative phase between quantum states in a superposition remains well-defined. While $T_1$ (relaxation time) measures how long a qubit stays in its excited state before decaying to the ground state, $T_2$ focuses on how long the qubit can preserve the interference patterns that enable quantum computation.

Maximizing $T_2$ enables quantum algorithms that rely on maintaining phase relationships for operations like interference and entanglement to perform more operations. Loss of phase coherence (dephasing) occurs due to interactions with the environment, such as magnetic field fluctuations, charge noise, or thermal vibrations. A short $T_2$ limits the number of gate operations that can be performed before errors dominate, making error correction and isolation strategies essential.

In a quantum device architecture described herein, two modes of quantum state readout are distinguished: Non-Destructive Readout (NDR) and a final destructive Readout (R). Non-Destructive Readout may be implemented as a capacitive or spin-sensitive measurement that infers the qubit state indirectly via field coupling instead of extracting the electron, thereby preserving the qubit's coherence. In contrast, the final Readout includes a full measurement that collapses the qubit's wavefunction into a classical bit value, terminating the quantum coherence for that operation cycle. NDR events may be interspersed throughout the qubit's coherent operation (e.g., after each manipulation step) without disturbing the quantum state, whereas only a single R event may be performed at the end of each operational cycle to yield the result of the quantum operation. The NDR+R scheme can maximize use of the qubit's coherence time by enabling continuous monitoring without collapse, while simultaneously minimizing input and output (I/O) overhead and improving scalability toward very large (e.g., million-qubit) systems.

Within the quantum device, NDR may be realized by capacitive/reflectometry sensing using a sub-dot capacitive plate, optionally coordinated with ESR control pulses. A sub-dot capacitive plate detects the spin-dependent impedance or phase shift produced by the confined electron's state without drawing any tunneling current, so the electron stays localized in the quantum dot and maintains phase coherence during NDR measurements. By contrast, the final readout drives the ESR measurement to the point of wavefunction collapse, yielding a definite classical state output and ending the quantum operation window.

An operational cycle of the capacitive-assist spin qubit begins with injecting an electron into the quantum dot, followed by a series of quantum gate manipulations (each optionally accompanied by an NDR state check), and ends with a single final readout (R). For a quantum device with a coherence time T2 of at least 1 millisecond and gate operation durations on the order of 30 to 100 nanoseconds (ns), the breakdown of events and timing in one cycle may be given in the example table below:

| Cycle Step | Event Type | Duration (ns) | Effect on Coherence |
|---|---|---|---|
| 1 | Injection | 30 | Begins coherence window |
| 2-21 | Manipulation + NDR (~1000 events) | ~100,000 | State sensed; coherence preserved |
| 22 | Final Readout (R = 1) | 50 | Collapses coherence |
| 23 | Optional reset | 20-50 | Prepares next cycle |

In this example cycle, on the order of $10^3$ non-destructive readout (NDR) operations may occur per single final readout when coherence is ms-class and the system uses us-class interaction windows for conditional operations. This corresponds to a high duty cycle (e.g., a majority of the coherence interval spent in active control and measurement cycles, rather than repeated collapse/reinitialize). Enabling numerous NDR measurements without collapsing the state allows a qubit to execute substantially more logic operations within one coherence window, increasing effective circuit depth and throughput by reducing time lost to stopping and reinitializing. Maintaining a single final readout at the end of each cycle can reduce timing complexity and help keep qubits synchronized across modules. Multiple intermediate NDR checkpoints also support feedback-based error mitigation during operation, because a qubit's state and drift can be monitored and corrected mid-cycle without destroying coherence.

Furthermore, the use of NDR may significantly lower the cryogenic I/O burden by eliminating per-qubit current-based sensing in favor of capacitive coupling, enabling thousands of qubits to share a single controller line with minimal heat generation. At the scale of millions of qubits, the resulting reduction in per-qubit I/O and power dissipation can directly translate into much lower total power requirements and a simpler multiplexed readout/control architecture for the entire quantum system.

Figure 1F:
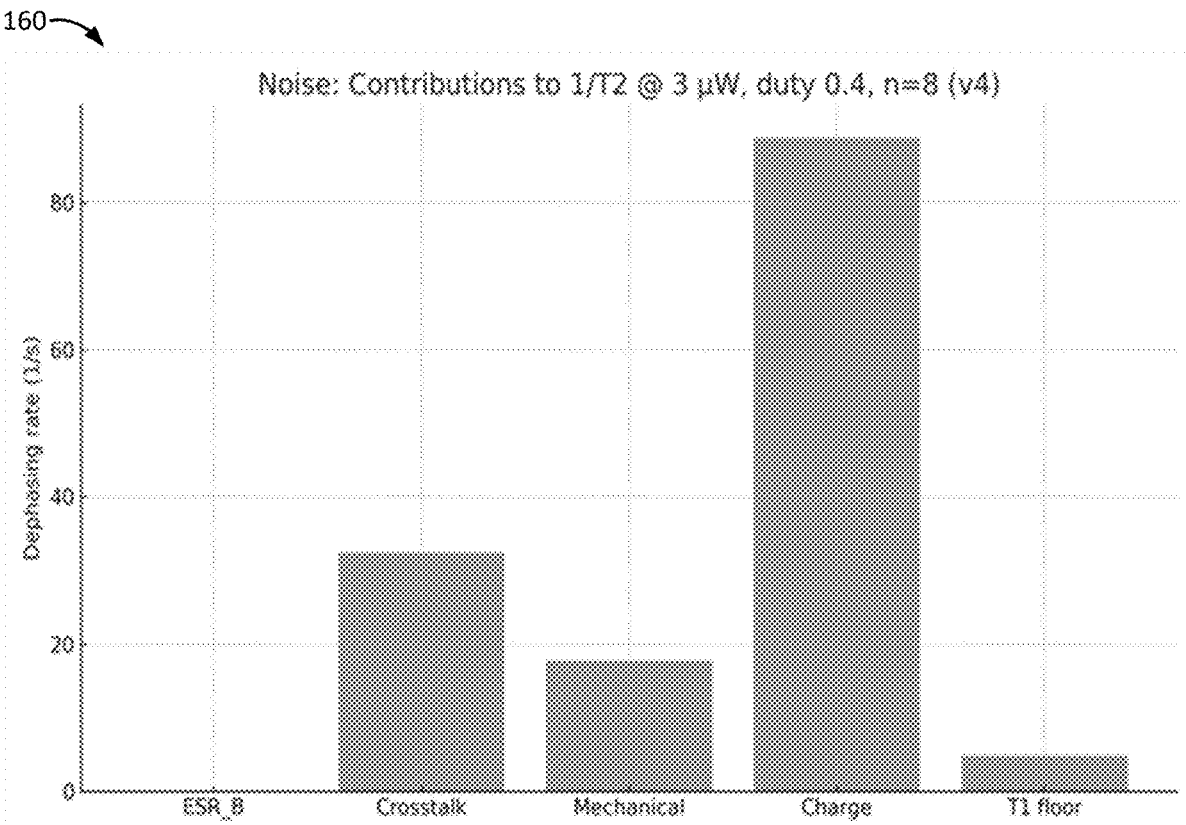
FIG. 1F is a histogram plot diagram of the source of noise for a qubit.

FIG. 1F is a histogram plot diagram 160 of the source of noise for a qubit. As shown in FIG. 1F, the noise that contribute to loss of coherence include noise from crosstalk, mechanical sources, and charge sources. Coherence losses may be reduced by isolating a qubit from mechanical, electrical, and/or thermal sources of noise. Implementations described herein may enable $T_2$ coherence times in the millisecond class (e.g., on the order of 1 ms to 5 ms), subject to fabrication quality, vacuum integrity, and electromagnetic noise suppression. Implementations described herein may enable $T_2$ coherence times in the millisecond class (e.g., on the order of 1 ms to 5 ms), subject to fabrication quality, vacuum integrity, and electromagnetic noise suppression by isolating qubits in a vacuum environment with no wired connections to the qubits. An actuator is able to inject an electron into a quantum dot by approaching within electron tunneling distance of the quantum dot, causing an electron to tunnel into the quantum dot, and withdrawing the actuator away from the quantum dot. Furthermore, by using capacitive pad injection and/or ESR control and readout of electron spin states, long coherence times may be maintained by minimizing physical contact with qubits stored in the quantum dots.

Figure 2A:
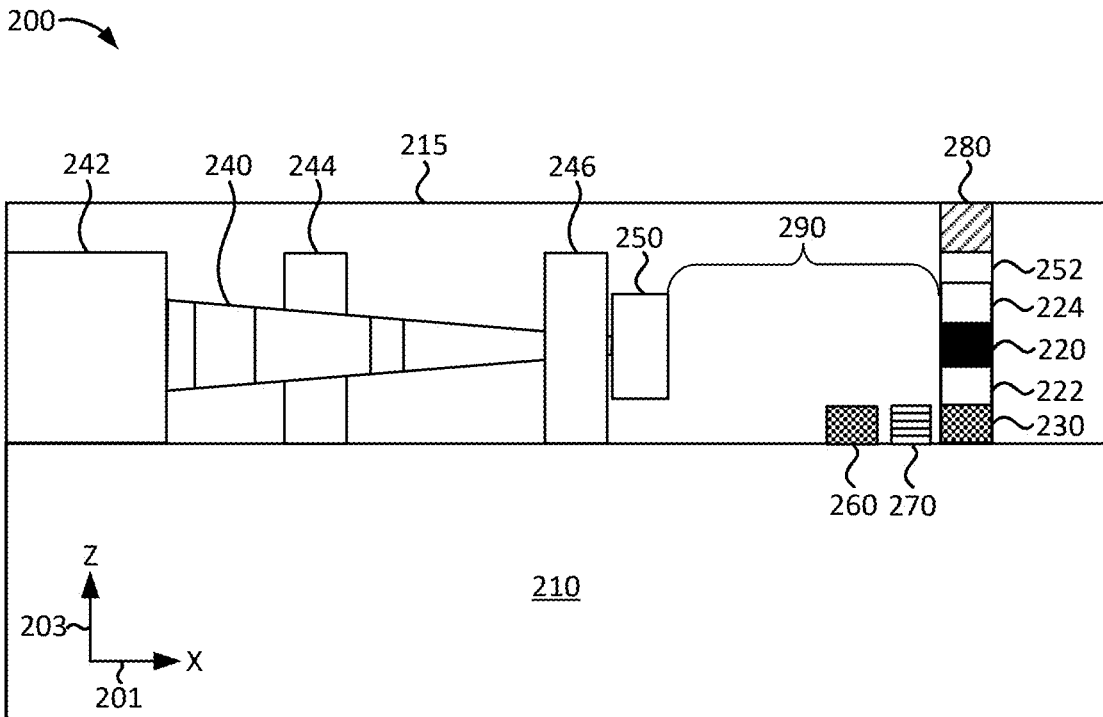
FIG. 2A is a schematic diagram of a side view of a quantum device with a retracted actuator according to an embodiment described herein.
Figure 2B:
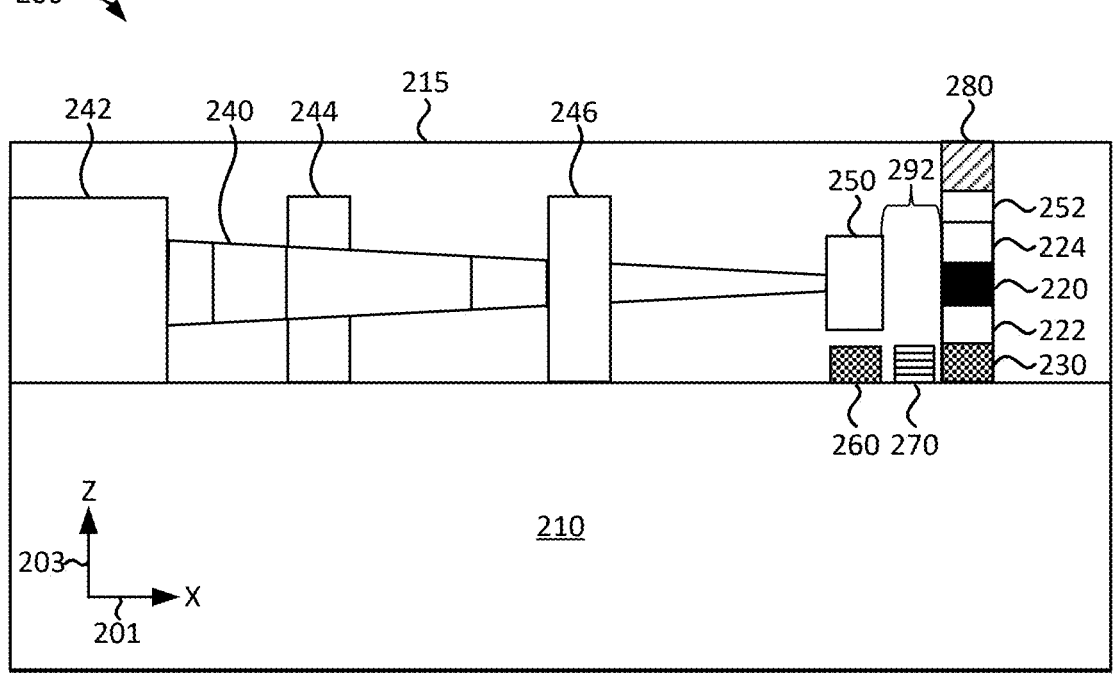
FIG. 2B is a schematic diagram of a side view of the quantum device of FIG. 2A with an extended actuator.
Figure 3A:
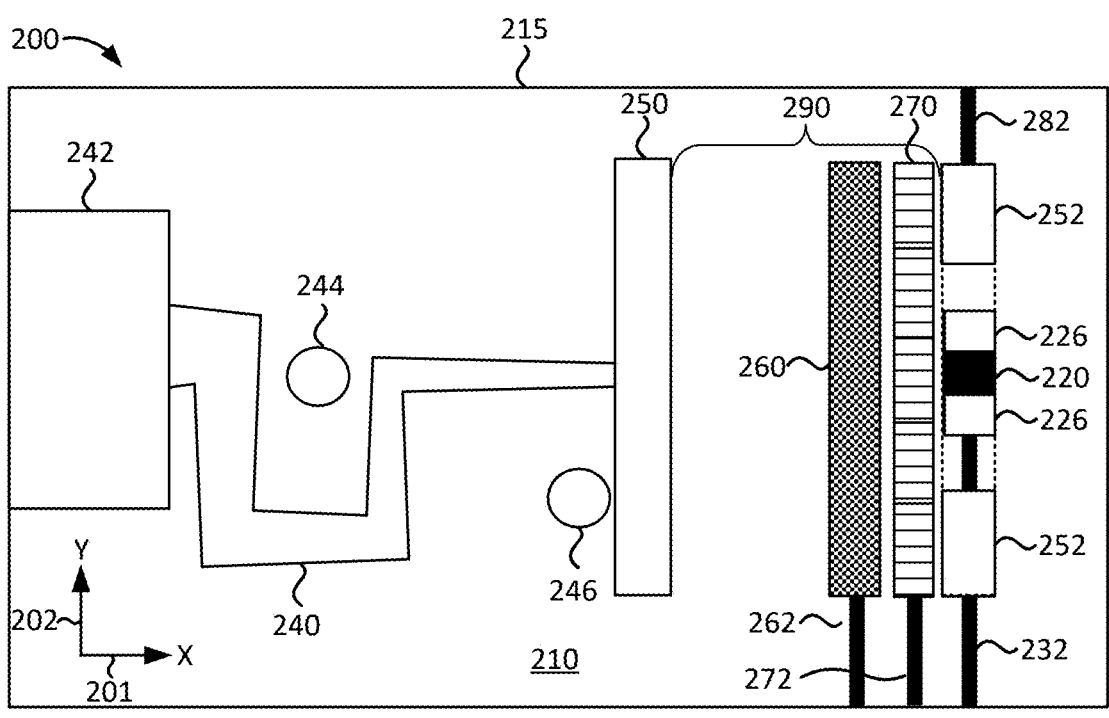
FIG. 3A is a schematic diagram of a top view of the quantum device of FIG. 2A with a retracted actuator.
Figure 3B:
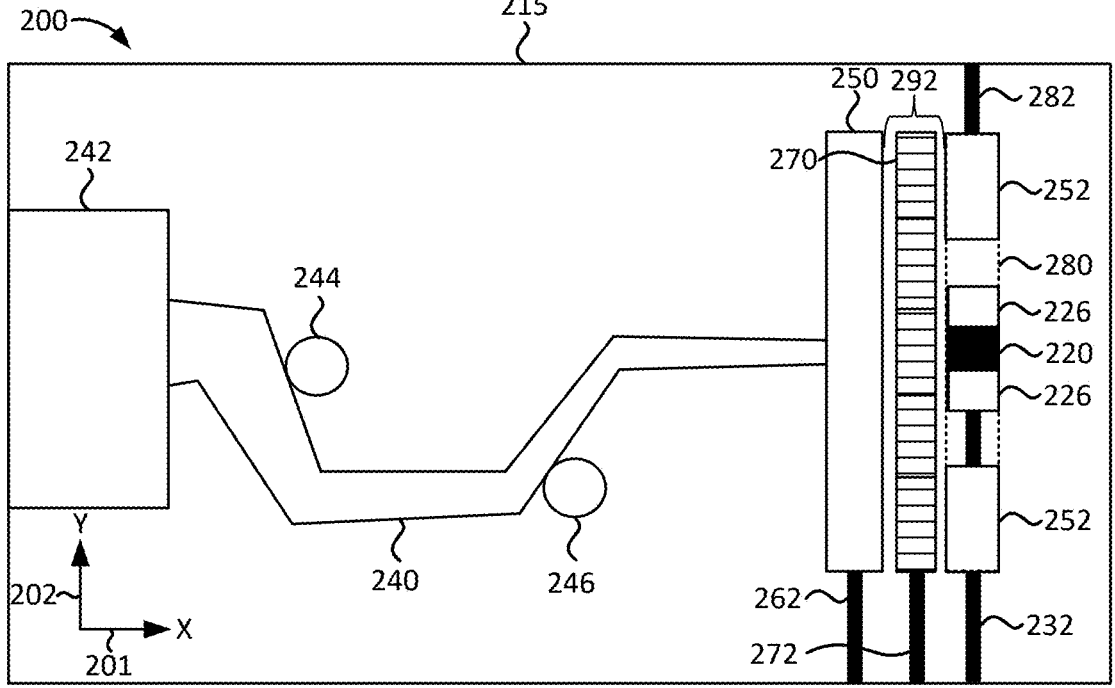
FIG. 3B is a schematic diagram of a top view of the quantum device of FIG. 2A with an extended actuator.
Figure 4:
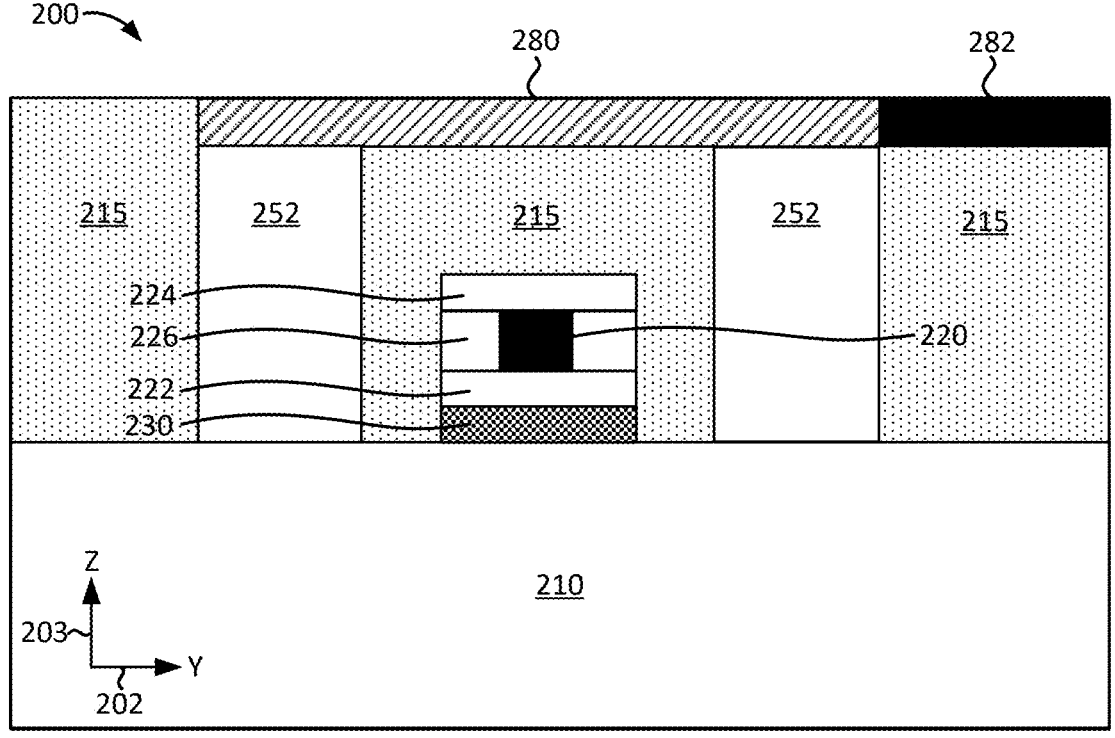
FIG. 4 is a schematic diagram of an end view of the quantum device of FIG. 2A.

FIG. 2A is a schematic diagram of a side view of an example quantum device 200 with a retracted actuator. FIG. 2B is a schematic diagram of a side view of the quantum device 200 with an extended actuator. The side view corresponds to a view of a plane that includes an x-axis 201 and a z-axis 203, with a y-axis 202 pointing into the page. FIG. 3A is a schematic diagram of a top view of the quantum device 200 with a retracted actuator. FIG. 3B is a schematic diagram of a top view of the quantum device 200 with an extended actuator. The top view corresponds to a view of a plane that includes the x-axis 201 and the y-axis 202, with a z-axis 203 pointing out of the page. FIG. 4 is a schematic diagram of an end view of the quantum device 200. The end view corresponds to a view of a plane that includes the z-axis 203 and the y-axis 202, with a x-axis 201 pointing out of the page.

As shown in FIGS. 2A, 2B, 3A, 3B, and 4, the quantum device 200 includes a substrate 210 and a vacuum enclosure 215. The vacuum enclosure 215 includes a quantum dot 220, a dielectric layer 222, a cap layer 224, edge clamping 226, a quantum dot capacitive plate 230, a quantum dot capacitive plate lead 232, a crab-leg actuator 240, an actuator anchor 242, a hard stop 244, a hard stop 246, an electrode 250, an electrode anchor 252, an electrode capacitive plate 260, an electrode capacitive plate lead 262, a modulator 270, a modulator lead 272, a microwave stripline 280, and a microwave stripline lead 282.

The substrate 210 forms the base supporting structure of the quantum device 200. The substrate 210 includes a flat wafer that provides a planar platform for building all other components of the quantum device 200. The substrate 210 includes a high-resistivity semiconductor, such as, for example, silicon, and/or an insulating crystalline material, such as, for example, sapphire. The substrate 210 may be coated with a 200 to 500 nanometer (nm) oxide layer to prevent stray conduction and/or to make the quantum device 200 cryogenically compatible. In some implementations, the substrate 210 may include a silicon-on-insulator (SOI) substrate. In some implementations, the substrate 210 may be polished to ultra-low roughness (e.g., to less than 0.2 nanometers (nm) Root Mean Square (RMS) roughness) to maintain uniform quantum gaps.

The vacuum enclosure 215 includes a sealed chamber or cavity inside a housing that surrounds the quantum dot 220, the electrode 250, and/or all other components of the quantum device 200 to enclose the components of the quantum device 200 in a vacuum environment and maintain the components of the quantum device 200 under a common vacuum environment. In particular, the vacuum enclosure 215 ensures a vacuum environment around the quantum dot 220. The vacuum environment enables the Casimir force effect, which requires clean, unobstructed vacuum space between surfaces and preserves the quantum coherence of the electron spin of an electron in the substrate 210 by eliminating air molecules or impurities that could cause decoherence. The vacuum environment may be maintained at ultra-high vacuum (UHV) pressures that are lower than $1\times10^{-9}$ Torr. The UHV pressure may be reduced to below $1\times10^{-11}$ Torr at cryogenic temperatures (e.g., below a temperature of 120° K) at which the quantum device 200 may operate. The vacuum enclosure 215 may be formed as a micron-scale cavity in a chip hermetically sealed while inside a cryostat using getters to absorb potential contaminant gasses such as $H_2O$ and/or $CO_2$. The housing of the vacuum enclosure 215 may alternatively be formed using a bonded cap wafer over the substrate 210.

The quantum dot 220 is configured to store a single electron and act as a qubit. The quantum dot 220 is formed from a monolayer of graphene with a diameter of 20 to 100 nm. The quantum dot 220 is positioned across an electrode tunneling gap from the movable electrode 250 and held in place by adhering to the dielectric layer 222 and/or the edge clamping 226 (see FIG. 4). In some implementations, the graphene material of the quantum dot 220 may be doped or otherwise modified to respond to electromagnetic signaling to increase an electron tunneling range between the quantum dot 220 and the electrode 250 and/or between the quantum dot 220 and another quantum dot. In some implementations, the graphene material may include isotopically purified 12 C graphene for improved coherence. The graphene material provides the quantum dot 220 with spin coherence of at least 1 millisecond (ms) and up to 6 ms. The quantum dot 220 has in this example a lateral width along the y-axis 202 of 180 to 260 nm and a thickness of 0.34 nm. In some implementations, a smaller quantum dot 220 may be used for faster charging at a cost of shorter coherence times.

The dielectric layer 222 is located between the quantum dot 220 and the quantum dot capacitive plate 230 and functions as a spacer and electric insulator between the quantum dot 220 and the quantum dot capacitive plate 230. The dielectric layer 222 reduces substrate-induced charge noise and stabilize the environment of the quantum dot 220. The dielectric layer 222 may include hexagonal Boron Nitride (hBN) with a thickness between 5 and 15 nm. The hBN offers an atomically smooth, chemically inert insulating surface for the graphene of the quantum dot 220. In other implementations, a different type of material may be used, such as, for example, $SiO_2$, $Al_2O_3$, $HfO_2$, and/or another type of material with a high dielectric constant (e.g., a relative permittivity $\varepsilon_r > 3.5$). In yet other implementations, a vacuum gap may be used in place of the dielectric layer 222 with support posts supporting the quantum dot 220 on the quantum dot capacitive plate 230.

The cap layer 224 includes a thin covering layer on top of the quantum dot 220 as a passivation and/or encapsulation layer. The cap layer 224 protects the quantum dot 220 from contaminants, stabilizes the edges of the quantum dot 220, and defines a consistent dielectric environment above the quantum dot 220. In some implementations, the cap layer 224 may include $Al_2O_3$ layer that is 5 to 8 nm thick. In other implementations, the cap layer 224 may include a different capping material, such as, for example, hBN, $SiO_2$, $HfO_2$, $Si_3N_4$, and/or another type of suitable material. In other implementations, the quantum device 200 may not include the cap layer 224.

The edge clamping 226 in this example is located on both sides of the quantum dot 220 along the y-axis 202. The edge clamping 226 includes mechanical constraint structures that secure the quantum dot 220 in place at the perimeter of the quantum dot 220. The edge clamping 226 maintains stable spacing between the quantum dot 220 and the electrode 250 during temperature changes or external vibrations. The edge clamping 226 also reduces motion or distortion of the quantum dot 220 caused by electrostatic forces or Casimir forces at the edges of the quantum dot 220. In some implementations, the edge clamping 226 may include an $Al_2O_3$ material. In other implementations, the edge clamping 226 may include different materials, such as, for example, hBN, $SiO_2$, $HfO_2$, $Si_3N_4$, and/or another type of suitable material. In other implementations, instead of being located along the edges of the quantum dot 220 along the y-axis 202, the edge clamping 226 forms a continuous ring around the quantum dot 220 or forms multiple anchors or posts at the edges of the quantum dot 220. In still other implementations, the quantum device 200 may not include the edge clamping 226.

The quantum dot capacitive plate 230, also referred to herein as the sub-dot capacitive plate 230, is configured to perform capacitive coupling with the quantum dot 220 for non-destructive readout. In other words, the quantum dot capacitive plate 230 functions as one plate of a capacitor with the quantum dot 220 acting as the second plate of the capacitor. The quantum dot capacitive plate 230 in this example is located underneath the quantum dot 220 on the substrate 210. The quantum dot capacitive plate 230 may correspond to a flat electrode with a surface area substantially the same size as the quantum dot 220 in the x-y place or with a surface area that is larger than the quantum dot 220. The quantum dot capacitive plate 230 is used to confirm that an electron has been transferred to the quantum dot 220 from the electrode 250, for example, by measuring the capacitance or a change in induced charge of the quantum dot 220. When an electron has tunneled to the quantum dot 220, the quantum dot capacitive plate 230 may detect an additional charge in the quantum dot 220, thus serving as a readout gate to confirm that the qubit of the quantum dot 220 is loaded. In some implementations, the quantum dot capacitive plate 230 may include a gold layer. In other implementations, the quantum dot capacitive plate 230 may include a different material layer, such as, for example, aluminum, titanium, platinum, molybdenum, niobium, lead, vanadium, tantalum, NbTiN, and/or another type of material configured to maintain superconductivity at low temperatures. In some implementations, the size of the quantum dot capacitive plate 230 is tuned to increase or decrease the sensitivity of the readout signal.

The quantum dot capacitive plate lead 232 provides an electrical connection between the quantum dot capacitive plate 230 and external circuitry. The quantum dot capacitive plate lead 232 may include a narrow metal trace that runs across the substrate 210 from the quantum dot capacitive plate 230 to a bonding pad or connector outside the vacuum enclosure 215. The electrical connection to the quantum dot capacitive plate 230 enables the quantum dot capacitive plate 230 to perform non-destructive and/or destructive readouts of the quantum dot 220. The quantum dot capacitive plate lead 232 may include a gold trace or a superconducting trace made from the same material as the quantum dot capacitive plate 230 or made from a different material. In some implementations, the quantum dot capacitive plate lead 232 is engineered as a controlled impedance line to enable high frequency pulses. For example, the quantum dot capacitive plate 230 and the quantum dot capacitive plate lead 232 may be designed so that the RC constant is less than a femtosecond on a 50Ω connection. In some implementations, the quantum dot capacitive plate lead 232 routes through a via to a different conductive layer.

The crab-leg actuator 240 includes a NEMS cantilever configured to move the electrode 250 toward or away from the quantum dot 220. The crab-leg actuator 240 includes multiple segments joined in a zigzag or folding pattern resembling the leg of a crab. The crab-leg actuator 240 may include at least five segments connected at approximately right angles to each other to form a springy structure configured to extend and retract in the horizontal direction of the x-axis 201 with minimal movement in the direction of the vertical z-axis 203. A proximal end of the crab-leg actuator 240 connects to the actuator anchor 242, which is fixed to the substrate 210. A distal end of the crab-leg actuator 240 is suspended in the free space of the vacuum enclosure 215 with the electrode 250 located on the distal end. The crab-leg actuator 240 moves from a contracted position shown in FIGS. 2A and 3A to an extended position shown in FIGS. 2B and 3B. When retracted, the distance between the electrode 250 and the quantum dot 220 corresponds to the open gap 290. The open gap 290 corresponds to distances in the range from approximately 15 nm to approximately 8 nm. When extended, the distance between the electrode 250 and the quantum dot 220 corresponds to the closed gap 292. The closed gap 292 corresponds to distances in the range from approximately 7 nm to approximately 2 nm. Thus, the crab-leg actuator 240 may travel a distance in the range from approximately 4 nm to approximately 12 nm.

The crab-leg actuator 240 functions to bring the electrode 250 within an electron tunneling range of the quantum dot 220 when extended to inject a qubit into the quantum dot 220 and to retract once an electron has tunneled to the quantum dot 220 to isolate the qubit and minimize sources of decoherence noise to the qubit in the quantum dot 220. The extension of the crab-leg actuator 240 relies on the modulated Casimir force. When the modulator 270 is activated to emit an electromagnetic signal in a frequency range to which the crab-leg actuator 240 and the electrode anchor 252 are tuned, the Casimir force between the crab-leg actuator 240 and the electrode anchor 252 increases and the crab-leg actuator 240 extends toward the electrode anchor 252. When the modulator 270 is deactivated and the emission of the electromagnetic signal ceases, the modulated Casimir force decreased to the unmodulated Casimir force and the attraction between the crab-leg actuator 240 and the electrode anchor 252 decreases. As a result, the crab-leg actuator 240 retracts based on the restoring spring force of the crab-leg actuator 240 caused by the geometry of the crab-leg actuator 240. The geometry of the crab-leg actuator 240 may provide a progressive spring bias to generate the restoring spring force when the crab-leg actuator 240 is extended. For example, each more distal segment of the crab-leg actuator 240 (with respect to the actuator anchor 242) may have a smaller diameter than the proximal segment, resulting in a shape that tapers from the actuator anchor 242 toward the electrode 250. The segments of the crab-leg actuator 240 may be designed such that when the crab-leg actuator 240 is extended, the restoring force increases progressively to ensure smooth motion and a tendency to retract when the Casimir force is not modulated.

In some implementations, the segments of the crab-leg actuator 240 have a length in the range from approximately 100 nm to approximately 150 nm and a width or diameter in the range from approximately 20 nm to approximately 40 nm. The crab-leg actuator 240 may include a body made from Si, $Si_3N_4$, SiC, and/or another type of material with high stiffness and low thermal expansion and a layer of graphene tuned to respond to the modulated Casimir force. In some implementations, the graphene material is formed on all segments of the crab-leg actuator 240. In other implementations, the graphene material is formed on only some of the segments of the crab-leg actuator 240 (e.g., the most distal segment). In still other implementations, the graphene material is formed only on the electrode 250 located on the distal tip of the crab-leg actuator 240.

The actuator anchor 242 secures the base or proximal end of the crab-leg actuator 240 to the substrate 210. The proximal end of the crab-leg actuator 240 is mounted on the actuator anchor 242, which may be shaped as a pad or post at the proximal end of the crab-leg actuator 240 and fixed to the substrate 210, making the base or proximal end of the crab-leg actuator 240 fixed in position. The actuator anchor 242 provide a rigid attachment point that withstands the forces of actuation to enable the crab-leg actuator 240 to extend and withdraw to move the electrode 250. The actuator anchor 242 may be formed from Si, $Si_3N_4$, SiC, and/or another type of material with high stiffness and low thermal expansion. The size of the actuator anchor 242 may be larger than the width or diameter of the crab-leg actuator 240 for structural integrity.

Hard stops 244 and 246 prevent the crab-leg actuator 240 from extending past a maximum extension distance to prevent the crab-leg actuator 240 from contacting the electrode anchor 252 or the quantum dot 220. Furthermore, the hard stops 244 and 246 also prevent the crab-leg actuator 240 from withdrawing past a minimum extension distance to prevent the crab-leg actuator 240 from contacting other structures, such as the actuator anchor 242. Thus, the hard stops 244 and 246 prevent stiction between the electrode 250 and other structures, such as the electrode anchor 252, the quantum dot 220, and/or the actuator anchor 242. The particular positions for the hard stops 244 and 246 may be selected to define the traveling limits of the crab-leg actuator 240.

The hard stops 244 and 246 may be implemented as posts formed on the substrate 210 and positioned to contact the crab-leg actuator 240 when the crab-leg actuator 240 is in the extended position (and/or when the crab-leg actuator 240 is in the retracted position). For example, the hard stop 244 may be positioned on one side of the crab-leg actuator 240 and configured to contact a second segment of the crab-leg actuator 240, and the hard stop 246 may be positioned on the other side of the crab-leg actuator 240 and configured to contact the fourth segment of the 240, when the crab-leg actuator 240 is extended. Furthermore, the hard stop 246 may be configured to contact the electrode 250 when the crab-leg actuator 240 is withdrawn. While two hard stops 244 and 246 are shown in FIGS. 2A, 2B, 3A, and 3B, a different number of hard stops may be used (e.g., one hard stop, three hard stops, etc.). The hard stops 244 and 246 may be formed from the same material as the crab-leg actuator 240 and/or the actuator anchor 242 or from a different material (such as, for example, the same material as the dielectric layer 222). In some implementations, the hard stops 244 and 246 may be coated with an anti-stiction coating to prevent the crab-leg actuator 240 from sticking to the hard stops 244 and 246 when the crab-leg actuator 240 contacts the hard stops 244 and 246. An anti-stiction coating may include, for example, a hydrophobic self-assembled monolayer (SAM), such as a fluorinated silane material, an alkylsilane material, a parylene material, a fluoropolymer material, and/or another type of anti-stiction material.

The electrode 250 corresponds to a conductive element disposed on the distal tip of the crab-leg actuator 240. The electrode 250 functions as a combination source and drain electrode for the quantum device 200. For example, the electrode 250 acts as a source electrode and supplies the electron that tunnels to the quantum dot 220 when the crab-leg actuator 240 extends into the closed gap 292 of the electron tunneling range of the quantum dot 220, after which the crab-leg actuator 240 withdraws to the open gap 290. After a quantum operation, the crab-leg actuator 240 may again extend into the closed gap 292 and the electrode 250 may act as a drain electrode to retrieve the electron from the quantum dot 220 to reset the quantum dot 220. Thus, the electrode 250 may act as the source and drain electrode of a quantum transistor, in which, rather than controlling the gate voltage, the tunneling of an electron is controlled.

Thus, the electrode 250 may be configured to face the quantum dot 220 across the closed gap 292 when the crab-leg actuator 240 is extended. The electrode 250 may have a width that is wider than the width of the quantum dot 220 in order to face across from the electrode anchor 252 located on both sides of the quantum dot 220. The electrode 250 may include a graphene material tuned to respond to the electromagnetic signaling emitted by the modulator 270 with an increased Casimir force. The electrode anchor 252 may also include the graphene material tuned to respond to the electromagnetic signaling emitted by the modulator 270 with an increased Casimir force. Thus, the increased Casimir force between the electrode 250 and the electrode anchor 252 may cause the electrode 250 to move from the open gap 290 to the closed gap 292 as the crab-leg actuator 240 extends.

The electrode 250 may include a conducting layer, such as, for example, a gold layer. In other implementations, the electrode 250 may include a different material layer, such as, for example, aluminum, titanium, platinum, molybdenum, niobium, lead, vanadium, tantalum, NbTiN, and/or another type of material configured to maintain superconductivity at low temperatures. In some implementations, the conducting layer may be approximately 4 nm thick. Furthermore, the electrode 250 may include an insulating layer of hBN on the conducting layer, and a tuned graphene layer on top of the insulating layer.

In some implementations, the quantum dot 220 and/or the electrode 250 may include an hBN layer that functions as a mechanical spacer and/or as a hyperbolic optical medium. The hBN film may define the vacuum-like separation for the Casimir force interaction while simultaneously altering the density of electromagnetic modes within the nanogap of the graphene material. The anisotropic dielectric tensor, expressed as $\varepsilon=\text{diag}(\varepsilon_\perp,\varepsilon_\perp,\varepsilon_\parallel)$, supports direction-dependent propagation of zero-point field modes. The Casimir energy per unit area between two planar surfaces separated by distance d in an anisotropic medium may be written as:

$$E(d) = 2\pi^2\hbar \int_0^\infty d\xi \int_0^\infty k_\perp dk_\perp \ln\left[1 - r_1(\xi, k_\perp)r_2(\xi, k_\perp)e^{-2kd}\right]$$

where $\hbar$ is Planck's constant, $\xi$ represents the imaginary frequencies, and $r_1$ and $r_2$ are the reflection coefficients for each surface, where $k_\perp$ represents the in-plane wavevector of electromagnetic modes in the cavity, and where $$k = \sqrt{k_\perp^2 + \varepsilon_\parallel(i\xi)\frac{\xi^2}{c^2}}.$$

In the hBN cavity, the dispersion relation becomes hyperbolic when $\varepsilon_\perp\cdot\varepsilon_\parallel<0$, permitting high-k vacuum modes that enhance the Casimir pressure gradient. The resulting Casimir pressure (e.g., Casimir force per unit area) acting on the graphene gate may be approximated by:

$$P(d) = -\frac{\partial}{\partial d} E \approx \frac{240}{d^4}\pi 2\hbar c \cdot \eta(\varepsilon_\perp, \varepsilon_\parallel, \sigma(\omega, E_F)),$$

where $\eta$ represents the modulation coefficient dependent on the anisotropic permittivities and the graphene surface conductivity $\sigma(\omega,E_F)$. Variations in o induced by optical or RF bias dynamically alter $\eta$, thereby tuning the Casimir pressure without mechanical motion of the electrodes.

The hBN layer's hyperbolic regime may occur for mid-infrared photon energies between 90-200 meV, corresponding to optical phonon resonances that produce negative $\varepsilon_\perp$ while maintaining positive $\varepsilon_\parallel$. In this frequency range, modulation of the graphene Fermi energy by $\pm0.3$ eV shifts the Casimir force by up to 70 percent over 2-8 nm gaps, resulting in a high-bandwidth Casimir-force modulator operating on sub-nanosecond timescales.

The hBN cavity may not participate in direct electronic tunneling or wave-function overlap. The hBN material's wide band gap (>5 eV) and dielectric isolation may ensure negligible carrier transmission through the layer. The graphene material may electronically isolated, with tunneling current controlled exclusively by Casimir-induced potential modulation across the vacuum barrier. This configuration prevents unintended decoherence and preserves qubit isolation during entanglement operations.

The net effect of the hBN cavity may be to enhance Casimir coupling efficiency while maintaining electronic insulation. By confining vacuum electromagnetic modes and enabling tunable optical boundary conditions, the cavity may function as a Casimir-field amplifier rather than a tunneling conduit, enabling the Casimir force to be modulated cleanly and reversibly, and controlling the quantum tunneling rate via field geometry instead of mechanical displacement or wave-function overlap.

The electrode anchor 252 functions as an anchor for the electrode 250 and causes the electrode 250 to move toward the electrode anchor 252 when the modulator 270 is activated. Thus, the electrode anchor 252 may include the graphene material tuned to respond to the electromagnetic signaling emitted by the modulator 270 with an increased Casimir force. In other words, the electrode anchor 252 may include a graphene material tuned in the same manner as the graphene material included in the electrode 250. As shown in FIG. 4, the electrode anchor 252 is implemented as two pillars or posts on either side of the quantum dot 220. The electrode anchor 252 may be configured to face the electrode 250 and have a face in the y-z plane that is parallel to a face of the electrode 250 in the y-z plane. Furthermore, the plane of the electrode anchor 252 that faces the electrode 250 may be positioned in the same y-z plane as the face of the quantum dot 220 that faces the electrode 250. In other words, the quantum dot 220 and the electrode anchor 252 may be positioned co-planar with respect to each other. The two pillars or posts of the electrode anchor 252 may extend past the height of the quantum dot 220 in order to support the microwave stripline 280 and provide a vacuum gap between the 280 and the cap layer 224 of the quantum dot 220. The electrode anchor 252 may include a structural material formed from the same material as the crab-leg actuator 240 and/or the actuator anchor 242, or from a different material (such as, for example, the same material as the dielectric layer 222). The structural material may include a layer of the tuned graphene material on the plane of the electrode anchor 252 that faces the electrode 250.

The electrode capacitive plate 260 is configured to perform capacitive coupling with the electrode 250 to charge the electrode 250. In other words, the electrode capacitive plate 260 functions as one plate of a capacitor with the electrode 250 acting as the second plate of the capacitor. The electrode capacitive plate 260 may be located underneath the electrode 250 on the substrate 210 at the location of the electrode 250 when the crab-leg actuator 240 is in the extended position. The electrode capacitive plate 260 may correspond to a flat electrode with a surface area substantially the same size as the electrode 250 in the x-y place or with a surface area that is larger than the electrode 250.

By applying a bias to the electrode capacitive plate 260, a charge can be induced on the electrode 250. In operation, before the electrode 250 comes close to the quantum dot 220, the electrode capacitive plate 260 may be pulsed to put a negative charge on the electrode 250, ensuring an electron is sitting on the electrode 250 and ready to tunnel into the quantum dot 220 when distance between the electrode 250 and the quantum dot 220 changes from the open gap 290 to the closed gap 292. In simpler terms, the electrode capacitive plate 260 charges the electrode 250 and causes the electron to tunnel across from the electrode 250 to the quantum dot 220. After a quantum operation, the electrode capacitive plate 260 may be used to attract the electron back and/or to null the charge of the electrode 250. By charging the electrode 250 through capacitive coupling, the quantum device 200 avoids any physical wired connection to the electrode 250 or the quantum dot 220, ensuring longer coherence times for the qubit stored in the quantum dot 220.

In some implementations, the electrode capacitive plate 260 may include a gold layer. In other implementations, the electrode capacitive plate 260 may include a different material layer, such as, for example, aluminum, titanium, platinum, molybdenum, niobium, lead, vanadium, tantalum, NbTiN, and/or another type of material configured to maintain superconductivity at low temperatures. Furthermore, in some implementations, the quantum dot capacitive plate 230 and the electrode capacitive plate 260 may be combined into a single capacitive plate that extends on the surface of the substrate between the areas shown as being occupied by the quantum dot capacitive plate 230 and the electrode capacitive plate 260. Thus, a single capacitive plate may be used for charging the electrode 250 and for the confirming successful electron tunneling to the quantum dot 220.

The electrode capacitive plate lead 262 may provide an electrical connection between the electrode capacitive plate 260 and external circuitry. The electrode capacitive plate lead 262 may include a narrow metal trace that runs across the substrate 210 from the electrode capacitive plate 260 to a bonding pad or connector outside the vacuum enclosure 215. The electrical connection to the electrode capacitive plate 260 enables the electrode capacitive plate 260 to be charged to charge the electrode 250. The electrode capacitive plate lead 262 may include a gold trace or a superconducting trace made from the same material as the electrode capacitive plate 260 or made from a different material. In some implementations, the electrode capacitive plate lead 262 may be engineered as a controlled impedance line to enable high frequency pulses. For example, the electrode capacitive plate 260 and the electrode capacitive plate lead 262 may be designed so that an electron may be transferred on the order of $10^{-15}$ seconds with negligible energy dissipation over a 50$\Omega$ connection. In some implementations, the electrode capacitive plate lead 262 routes through a via to a different conductive layer.

The modulator 270 is configured to generate an electromagnetic (EM) signal in a particular frequency range (referred to herein as $f_1$) to increase the Casimir force between the electrode 250 and the electrode anchor 252. The frequency range $f_1$ emitted by the modulator 270 may be in a range from the RF range to the optical frequency range. For example, in some implementations, the modulator 270 emits a signal in the 100 to 200 gigahertz (GHz) range. In other implementations, the modulator 270 may emit a signal in a different frequency range. Thus, the modulator 270 generates an electric field and/or photons that oscillate the carrier density in the graphene material of the electrode 250 and the electrode anchor 252 to change the permittivity of the graphene material, increase the resonant polarization, and/or excite plasmons in the graphene material to increase the Casimir force between the electrode 250 and the electrode anchor 252.

The modulator 270 includes a loop, dipole, a coplanar waveguide, a diffraction grating, a light emitting diode (LED) and/or another type of wave-emitting structure formed on the substrate 210. The modulator 270 may be located inside the vacuum enclosure 215 at a position at which the electrode 250 and the electrode anchor 252 may both receive the EM signal transmitted by the modulator 270 and at which the modulator 270 minimizes interference with the coherence of the qubit stored in the quantum dot 220. In some implementations, the modulator 270 may be located at a position between the electrode 250 and the electrode capacitive plate 260. In other implementations, the modulator 270 may be located at a different position on the substrate 210 or within the vacuum enclosure 215. For example, the modulator 270 may be located between the electrode capacitive plate 260 and the electrode 250 when the crab-leg actuator 240 is in the retracted position. In some implementations, the modulator 270 may have a length in the direction of the y-axis 202 in the range from approximately 1 micrometers (µm) to approximately 3 µm (e.g., the size of the modulator 270 in FIGS. 3A and 3B may not necessarily be to scale). In some implementations, the modulator 270 may have a thickness in the range from approximately 150 nm to approximately 250 nm. The modulator 270 may be formed from a conductive material, such as gold, aluminum, titanium, platinum, molybdenum, niobium, lead, vanadium, tantalum, NbTiN, and/or another type of material configured to maintain superconductivity at low temperatures.

The modulator lead 272 provides an electrical or optical connection between the modulator 270 and external circuitry. In some implementations, the modulator lead 272 includes a pair of narrow metal traces that runs across the substrate 210 from the modulator 270 to a bonding pad or connector outside the vacuum enclosure 215. The electrical connection to the modulator 270 enables the modulator 270 to generate EM signals in a particular frequency range. The modulator lead 272 may include a gold trace or a superconducting trace made from the same material as the modulator 270 or made from a different material. In some implementations, the modulator lead 272 may be engineered as a controlled impedance line to enable high frequency pulses. In other implementations, the modulator lead 272 may include an optical fiber waveguide to deliver photons to the modulator 270. In some implementations, the modulator lead 272 may route through a via to a different conductive layer of the quantum device 200.

The microwave stripline 280 may corresponds to an ESR readout assembly that is configured to deliver energy in the microwave frequency range, such as, for example, in the frequency range from approximately 10 GHz to approximately 20 GHz, to deliver ESR signals to the qubit stored in the quantum dot 220. For example, the microwave stripline 280 may include a coplanar waveguide configured to emit microwave signals. The microwave stripline 280 may be used to deliver an oscillating magnetic field to a qubit stored in the quantum dot 220 to manipulate the spin state of the electron or to determine the spin state of the electron after a quantum operation. For example, the microwave stripline 280 may set the qubit to a particular value. As another example, the 280 may induce a Rabi oscillation in the qubit to cause the qubit to cycle between its quantum states. Furthermore, the microwave stripline 280 may perform a destructive readout of the qubit using microwave spectroscopy to perform a spin-to-charge conversion.

The microwave stripline 280 is configured to measure a qubit state by inducing microwave excitation of an electron localized in the quantum dot 220 and to detect a reflected or transmitted signal amplitude without removing the electron from the quantum dot 220. The microwave stripline 280 is physically distinct from the quantum dot capacitive plate 230 to minimize crosstalk. In some implementations, the reflected or transmitted signal may be amplified by a cryogenic parametric amplifier or graphene-based low-noise amplifier. The microwave stripline 280 may be configured to measure a qubit state within 50 nanoseconds and maintain a coherence time of the qubit state that is greater than 1 millisecond.

The microwave stripline 280 may measure a qubit state in the quantum dot 220, without collapsing the electron wavefunction, by applying an ESR pulse at the Larmor frequency of the electron and detecting a reflected microwave phase shift correlated with the qubit spin orientation. The measurement produces a phase-shift signature corresponding to spin-up or spin-down states while preserving the trapped electron in the quantum dot 220 for repeated measurement cycles. In some implementations, the quantum device 200 may employ phase-sensitive detection using a lock-in amplifier synchronized with the ESR excitation frequency.

The microwave stripline 280 may be positioned in the vacuum enclosure 215 at a location to directly apply the microwave signal to the quantum dot 220 across a vacuum gap. For example, as shown in FIG. 4, the microwave stripline 280 is positioned on top of the posts of the electrode anchor 252 over the quantum dot 220 in the same y-z plane as the quantum dot 220. In other implementations, the microwave stripline 280 may be located at a different position, such as, for example, below the quantum dot 220, offset from the y-z plane toward or away from the electrode 250, or in any other location inside the vacuum enclosure 215 where the microwave stripline 280 does not contact the quantum dot 220, the electrode 250, the quantum dot capacitive plate 230, or the electrode capacitive plate 260. For example, the microwave stripline 280 may be offset from the y-z plane of the quantum dot 220 by a distance in the range from approximately 1.5 μm to approximately 5 μm. In some implementations, the microwave stripline 280 may have a length in the y-axis 202 in the range from approximately 0.6 μm to approximately 1.6 μm and/or a thickness from approximately 150 nm to approximately 1200 nm. In some implementations, the separation between the microwave stripline 280 and the quantum dot 220 may be in the range from approximately 6 nm to approximately 15 nm. The dimensions of the microwave stripline 280 may be tuned to configure the microwave stripline 280 to emit microwave signals in a particular frequency range. The microwave stripline 280 may be formed from a conductive material, such as gold, aluminum, titanium, platinum, molybdenum, niobium, lead, vanadium, tantalum, NbTiN, and/or another type of material configured to maintain superconductivity at low temperatures. In some implementations, the microwave stripline 280 may be implemented using air bridges and/or via stitching to maintain a particular microwave mode, prevent slotline modes, and/or ensuring that ground planes stay at equal potential.

The microwave stripline lead 282 provides an electrical connection between the microwave stripline 280 and external circuitry. In some implementations, the microwave stripline lead 282 includes a pair of narrow metal traces that runs from the microwave stripline 280 to a bonding pad or connector outside the vacuum enclosure 215. The electrical connection to the microwave stripline 280 enables the microwave stripline 280 to generate microwave signals in a particular frequency range. As shown in FIG. 4, the microwave stripline lead 282 is elevated from the substrate 210 to connect to the microwave stripline 280. In some implementations, the microwave stripline lead 282 may be deposited on a sacrificial layer that is removed during manufacture. In other implementations, the microwave stripline lead 282 may rest on a supporting layer deposited on the substrate 210. The microwave stripline lead 282 may include a gold trace or a superconducting trace made from the same material as the microwave stripline 280 or made from a different material.

In other implementations, the quantum device 200 may include fewer components, different components, differently arranged components, or additional components than depicted in FIGS. 2A, 2B, 3A, 3B, and 4. Additionally, or alternatively, one or more of the components of the quantum device 200 may perform functions described as being performed by one or more other components of the quantum device 200.

Figure 5A:
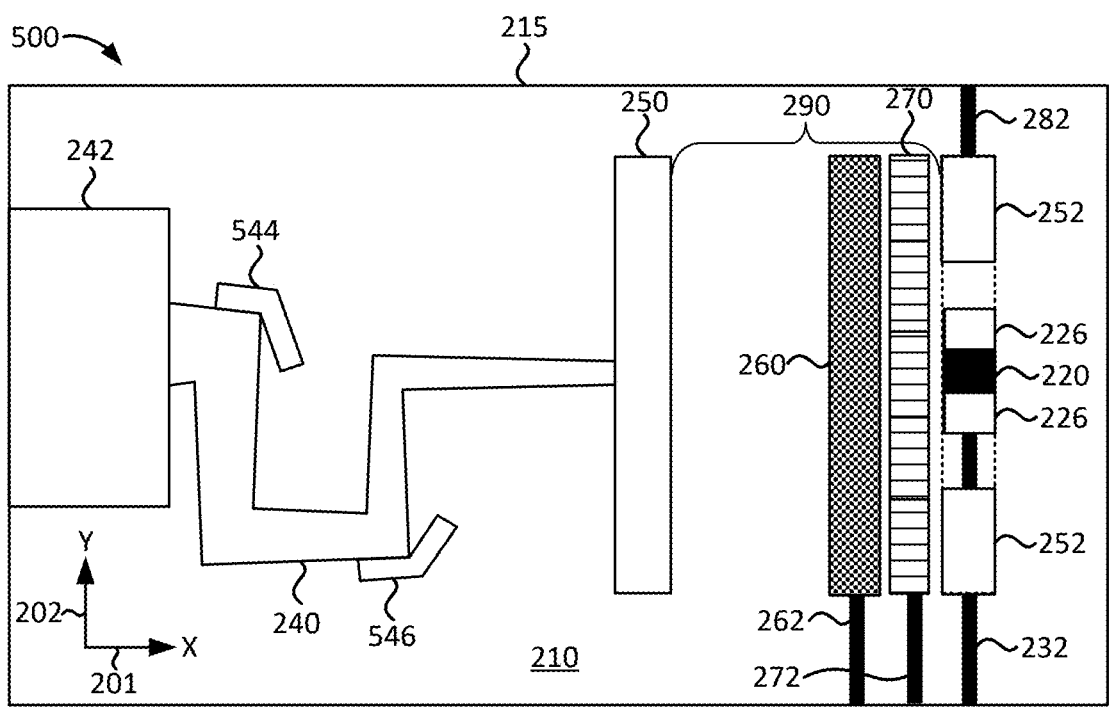
FIG. 5A is a schematic diagram of a side view of a quantum device with a retracted actuator according to another embodiment described herein.
Figure 5B:
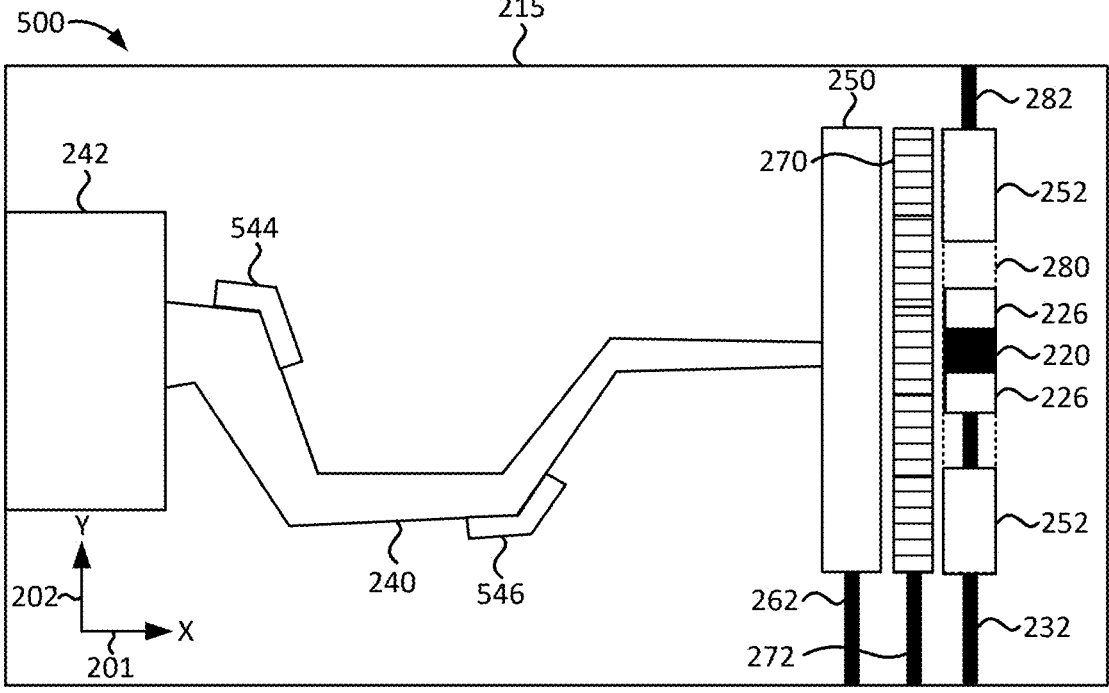
FIG. 5B is a schematic diagram of a side view of the quantum device of FIG. 5A with an extended actuator.

FIG. 5A is a schematic diagram of a side view of a quantum device 500 with the crab-leg actuator 240 in a retracted position. FIG. 5B is a schematic diagram of a side view of the quantum device 500 with the crab-leg actuator 240 in an extended position. As shown in FIGS. 5A and 5B, the quantum device 500 includes a crab-leg actuator 240 that includes angular stops 544 and 546, rather than hard stops 244 and 246 to limit the motion of the crab-leg actuator 240. The angular stops 544 and 546 are located on segments of the crab-leg actuator 240 and prevent the crab-leg actuator 240 from extending past a maximum extension distance to prevent the crab-leg actuator 240 from contacting the electrode anchor 252 or the quantum dot 220. Thus, the angular stops 544 and 546 may prevent stiction between the electrode 250 and other structures, such as the electrode anchor 252, the quantum dot 220, and/or the actuator anchor 242. The particular positions, sizes, and/or shapes of the angular stops 544 and 546 may be selected to define the traveling limits of the crab-leg actuator 240.

The angular stop 544 may be located at the outside of a first joint between a first segment and a second segment of the crab-leg actuator 240. The angular stop 544 may be located at the outside of a second joint between a third segment and a fourth segment of the crab-leg actuator 240. The angular stops 544 and 546 limit the angle to which the first and second joints of the crab-leg actuator 240 can open, as shown in FIG. 5B. While two angular stops 544 and 546 are shown in FIGS. 5A and 5B, a different number of angular stops may be used (e.g., one angular stop, three angular stops, etc.). The angular stops 544 and 546 may be formed from the same material as the crab-leg actuator 240 and shaped and patterned at the same time as the crab-leg actuator 240. In some implementations, the angular stops 544 and 546 may be coated with an anti-stiction coating to prevent the crab-leg actuator 240 from sticking to the angular stops 544 and 546 when the crab-leg actuator 240 extends and contacts the angular stops 544 and 546. An anti-stiction coating may include, for example, a SAM, such as a fluorinated silane material, an alkylsilane material, a parylene material, a fluoropolymer material, and/or another type of anti-stiction material.

In other implementations, the quantum device 500 may include fewer components, different components, differently arranged components, or additional components than depicted in FIGS. 5A and 5B. Additionally, or alternatively, one or more of the components of the quantum device 500 may perform functions described as being performed by one or more other components of the quantum device 500.

Figure 6:
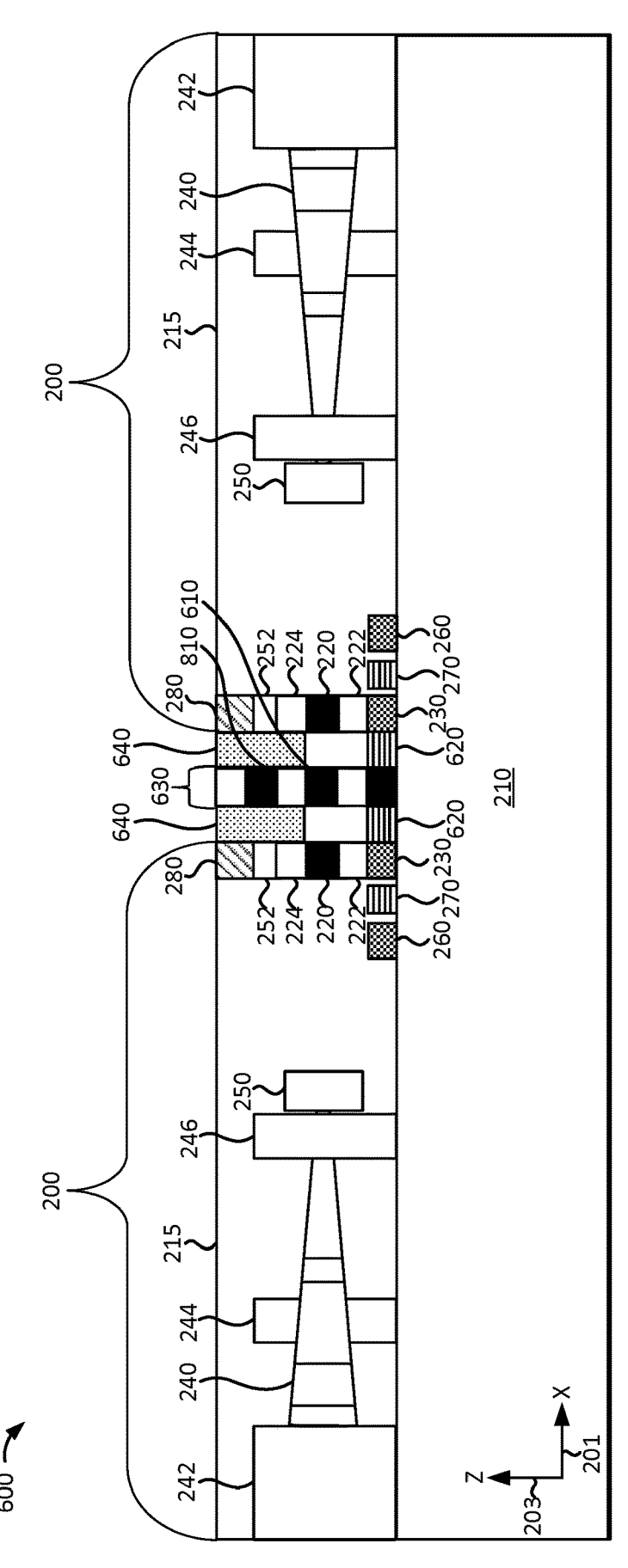
FIG. 6 is a schematic diagram of a side view of a quantum device with a mediator quantum dot and a mediator bus according to an embodiment described herein.

FIG. 6 is a schematic diagram of a side view of a quantum system 600 with a mediator quantum dot and a mediator bus. As shown in the example of FIG. 6, the quantum system 600 includes two quantum devices 200 formed as mirror images of each other on the substrate 210. A first quantum device 200 on a left side of the substrate 210 along the x-axis 201 includes the electrode 250 facing to the right along the x-axis 201 and a first quantum dot 220 (also referred to herein as a left quantum dot or left qubit), and a second quantum device 200 on a right side of the substrate 210 along the x-axis 201 includes the electrode 250 facing to the left along the x-axis 201 and a second quantum dot 220 (also referred to herein as a right quantum dot or right qubit). The quantum system 600 further includes a mediator quantum dot 610, a mediator modulator 620, a mediator bus 630, and a mediator bus edge clamping 640.

The mediator quantum dot 610 enables entanglement between a first quantum dot 220 of the first quantum device 200 and a second quantum dot 220 of the second quantum device 200. The first quantum dot 220, the second quantum dot 220, and the mediator quantum dot 610 may be formed from a second graphene material that is different from the graphene material included in the electrode 250 and the electrode anchor 252. The second graphene material may be tuned to increase the detuned dispersive ZZ coupling that propagates entanglement between adjacent quantum dots through sequential ZZ interactions, in response to an electromagnetic signal in a particular frequency range.

The first quantum dot 220 and the mediator quantum dot 610 may be within dispersive coupling range of each other. The second quantum dot 220 and the mediator quantum dot 610 may also be within dispersive coupling range of each other. The mediator quantum dot 610 may be within dispersive coupling range of the mediator bus 630. The quantum dots 810 (see FIG. 8) of the mediator bus 630 may be within dispersive coupling range of each other. In some implementations, the dispersive coupling range may be set in the range from 10 to 50 nm. In other implementations, the dispersive coupling range may be set in the range from 10 to 20 nm. In yet other implementations, dispersive coupling range may be sent in the range from 10 to 15 nm. Furthermore, it should be understood that the FIGS. are not necessarily to scale. In particular, the modulator 270, the microwave stripline 280, and/or the mediator modular 620 may be located outside of the effective dispersive coupling range in order to not interfere with qubit coherence and/or entanglement propagation.

In a detuned dispersive ZZ coupling mechanism, each qubit remains localized and no direct electron transfer occurs. Instead, the interaction between the electrons, which results in entanglement of the electrons, arises through state-dependent electrostatic energy shifts induced by virtual charge polarization of the qubit electrons. In dispersive coupling, no wavefunction overlap is required between the quantum dots and no real electron tunneling events take place. The dispersive coupling mechanism produces a coupling that is different from exchange-based interactions and is tuned to avoid particle exchange between quantum dots.

At a physical level, the first quantum dot 220, the second quantum dot 220, the mediator quantum dot 610, and/or the quantum dots of the mediator bus 630 may be operated under conditions such that the effective Hamiltonian $H_{eff}$ between two qubits follows $$H_{eff} \sim \frac{g^2}{\Delta},$$

where g corresponds to the coupling strength between the qubits and A corresponds to the detuning between the two qubits. Detuning refers to the energy difference between the quantum states of the coupled qubits, such that their natural frequencies are offset. When $\Delta \gg g$, the system enters a dispersive regime in which real tunneling is energetically suppressed and only virtual transitions contribute to the interaction between the qubits. The virtual transitions do not involve particle exchange but lead to state-dependent shifts in energy levels, enabling entanglement through second-order effects. The detuning ensures the qubits remain isolated, preserving coherence while enabling the qubits to influence each other through a shared environment. Each confined electron can polarize its environment slightly differently depending on the quantum state of the electron (e.g., the spin orientation and/or occupancy of the electron) and the virtual polarizations generate a small but significant electrostatic influence on neighboring qubits. Because the qubits remain spatially separated by nanometer-scale distances with intervening dielectric or vacuum gaps, the mutual interaction between the qubits corresponds to capacitive coupling through the modified electric field between the qubits. The obtained effective interaction energy may depend on the combined quantum state of the qubits, as if each qubit carries a state-dependent effective charge that electrostatically influence each other. Qubit detuning is applied via a sub-dot capacitive plate (e.g., quantum dot capacitive plate 230), while mediator modulation independently controls interaction strength and the mediator quantum dots 610 and pairs of quantum dots 810 remain detuned at all times. For example, a small bias voltage may be applied by the quantum dot capacitive plate 230 to detune the quantum dot 220 with respect to the mediator quantum dot 610.

The result of the virtual, state-contingent coupling between two adjacent qubits corresponds to an entangling interaction of the ZZ type in the two-qubit Hamiltonian between the two qubits. The conditional energy shift of the qubit pair leads to phase accumulation on the joint quantum states of the qubit pair. By controlling the duration for which the dispersive coupling is active, a desired relative phase may be imparted to the qubit pair. For example, driving the interaction for a calibrated interval enables a state where both qubits acquire a x phase relative to other states, resulting in the implementation of a two-qubit CZ gate through phase evolution. This entanglement process does not involve real particle exchange or wavefunction overlap as the coupling leverages vacuum electromagnetic modes (vacuum fluctuations) in a detuned regime to generate quantum correlation between the qubits.

Tuning of the Casimir force between adjacent qubits may be used to enhance and control a detuned dispersive ZZ coupling between the qubits by modulating an effective mutual capacitance and/or interaction strength, without altering the physical placement of the qubits and without wavefunction overlap or exchange coupling. Modulating the Casimir force results in modified vacuum field modes between the quantum dots to enable control of the interaction strength between the quantum dots. The mediator bus 630 is configured to extend the detuned dispersive ZZ coupling across a sequence of adjacent qubits to propagate entanglement without introducing exchange errors. The mediator bus 630 thus propagates entanglement through virtual interactions and state-dependent energy shifts, while ensuring the qubits of the first quantum dot 220, the second quantum dot 220, the mediator quantum dot 610, and/or the quantum dots of the mediator bus 630 remain isolated and coherent while acquiring conditional couplings that can be selectively activated to perform entangling gates, such as, for example, CZ gates. The mediator bus 630 uses second-order electrostatic shifts resulting from virtual charge fluctuations and/or polarization to achieve a controlled interaction between qubits that is robust against minor geometric variations and/or noise, does not introduce additional sources of decoherence, and does not require wavefunction overlap or particle exchange. Therefore, the mediator bus 630 facilitates a scalable quantum device architecture built on detuned dispersive ZZ coupling entanglement principles.

Thus, a first graphene material associated with an electrode 250 and an electrode anchor 252 is tuned, in response to an electromagnetic signal in a first frequency range, to increase a Casimir force between the electrode 250 and the electrode anchor 252. A second graphene material associated with a first quantum dot 220, a second quantum dot 220, and a mediator quantum dot 610 is separately tuned, in response to an electromagnetic signal in a second frequency range, to increase an effective detuned dispersive ZZ coupling strength for electrons confined in the quantum dots, thereby enabling propagation of entanglement through sequential ZZ interactions between adjacent quantum dots, including between the first quantum dot 220 and the mediator quantum dot 610 and between the second quantum dot 220 and the mediator quantum dot 610, without electron tunneling or exchange coupling.

For example, in some implementations, the first graphene material is tuned to increase a Casimir force experienced by the first graphene material in response to electromagnetic signals in a frequency range from approximately 100 GHz to approximately 200 GHz, and the second graphene material is tuned to modulate an effective interaction strength that produces detuned dispersive ZZ coupling between quantum dots while remaining energetically detuned, in response to electromagnetic signals in a frequency range from approximately 2 THz to approximately 5 THz, without enabling electron tunneling or real particle exchange. In other implementations, the first and second graphene materials may be tuned to two different ranges that do not overlap with each other.

The mediator modulator 620 is configured to generate an electromagnetic signal within a particular frequency range ($f_2$) to modulate an effective interaction strength that produces detuned dispersive ZZ coupling between electron-spin qubits, including between a first quantum dot 220 and a mediator quantum dot 610 and between a second quantum dot 220 and the mediator quantum dot 610, while the quantum dots remain energetically detuned and without enabling electron tunneling or exchange coupling. For example, in some implementations, the mediator modulator 620 emits a signal in the 2 to 5 THz range. In other implementations, the mediator modulator 620 may emit a signal in a different frequency range, such as a mid-infrared hyperbolic regime (e.g., 25 to 120 THz). Thus, the mediator modulator 620 generates an electric field and/or photons that oscillate the carrier density in the graphene material of the electrode 250 and the electrode anchor 252 to change the permittivity of the graphene material, increase the resonant polarization, and/or excite plasmons in the graphene material to increase the Casimir force between the electrode 250 and the electrode anchor 252. In some implementations, the quantum system 600 may include a first mediator modulator 620 located on the substrate 210 between the first quantum dot 220 and the mediator quantum dot 610 and a second mediator modulator 620 located on the substrate 210 between the second quantum dot 220 and the mediator quantum dot 610.

The mediator modulator 620 includes a wave-emitting structure as described above with respect to the modulator 270 but configured to emit EM signals in a different frequency range than the modulator 270. The mediator modulator 620 may be connected to a mediator modulator lead (not shown in FIG. 6) similar to the modulator lead 272 described above.

In some implementations, the mediator modulator 620 may be configured to generate electromagnetic signals within a particular frequency range ($f_2$). The mediator modulator 620 is configured to emit the electromagnetic signals at the particular frequency range ($f_2$) with a first amplitude ($a_1$) to modulate an effective interaction strength that produces detuned dispersive ZZ coupling involving a quantum dot 220, including for entanglement generation or propagation. The mediator modulator 620 is not used to perform single-qubit Z-axis rotations, which are instead implemented via electrostatic detuning using a quantum dot capacitive plate aligned with the quantum dot 220. In some implementations, differentiation between interaction-strength modulation and single-qubit control is achieved through separation of control pathways, spatial targeting, and timing of applied signals.

The mediator bus 630 may include a series of pairs of quantum dots 810 positioned above the mediator quantum dot 610 and extending into the direction of the z-axis 203. The mediator bus 630 may be configured to enable entanglement and/or transfer of information between multiple qubits stored in quantum dots 220. The mediator bus 630 may function as a communication line for quantum states, enabling qubits to interact, share information, and become entangled. For example, the mediator bus 630 may be configured to propagate an entanglement of a pair of qubits to an adjacent pair of addressable quantum dots. The mediator bus edge clamping 640 may secure the mediator bus 630 in position. The mediator bus 630 and the mediator bus edge clamping 640 are further described below with reference to FIGS. 7, 8, and 9.

In other implementations, the quantum system 600 may include fewer components, different components, differently arranged components, or additional components than depicted in FIG. 6. Additionally, or alternatively, one or more of the components of the quantum system 600 may perform functions described as being performed by one or more other components of the quantum system 600.

Figure 7:
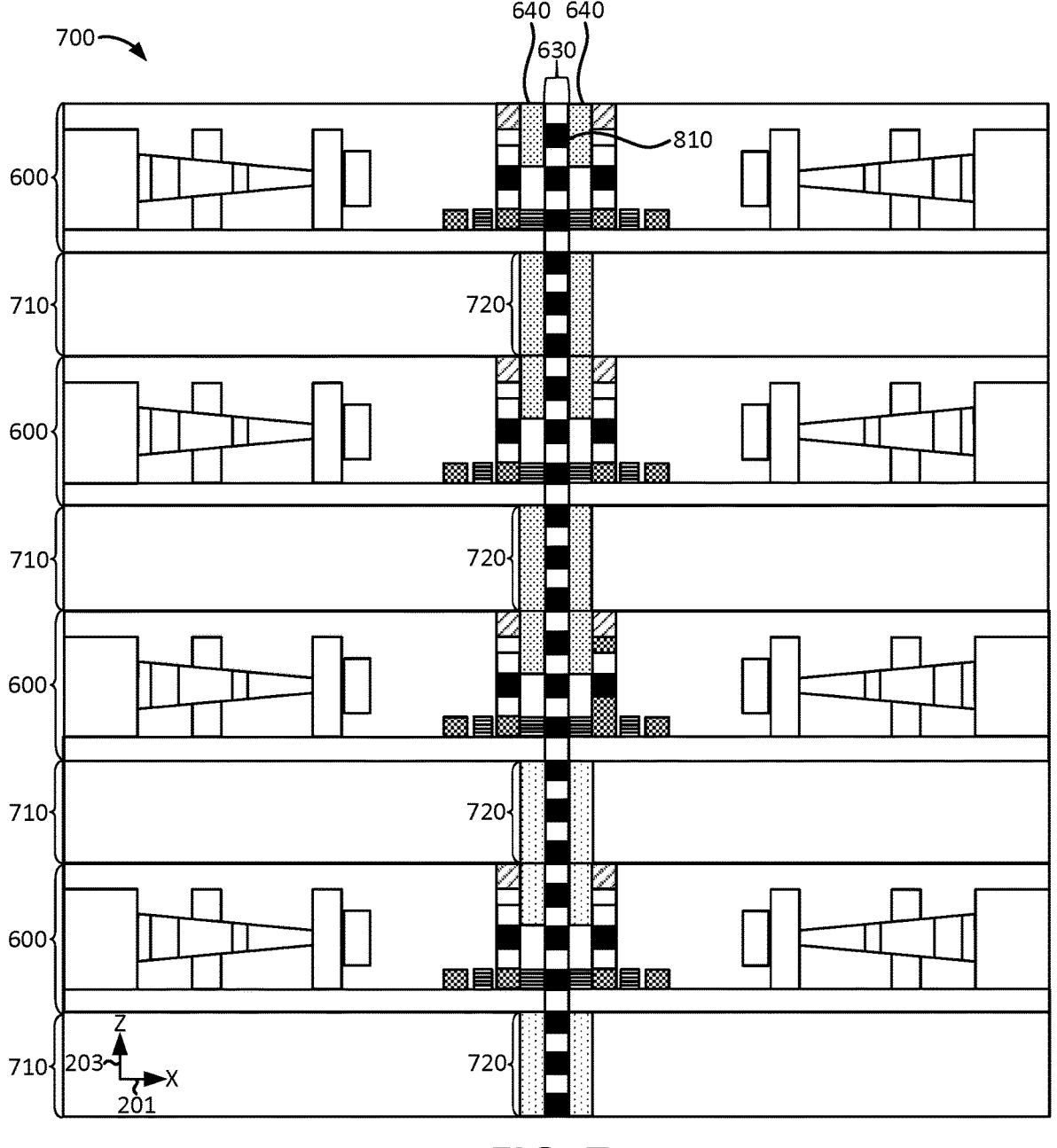
FIG. 7 is a schematic diagram of a set of quantum devices with a mediator bus according to an embodiment described herein.
Figure 8:
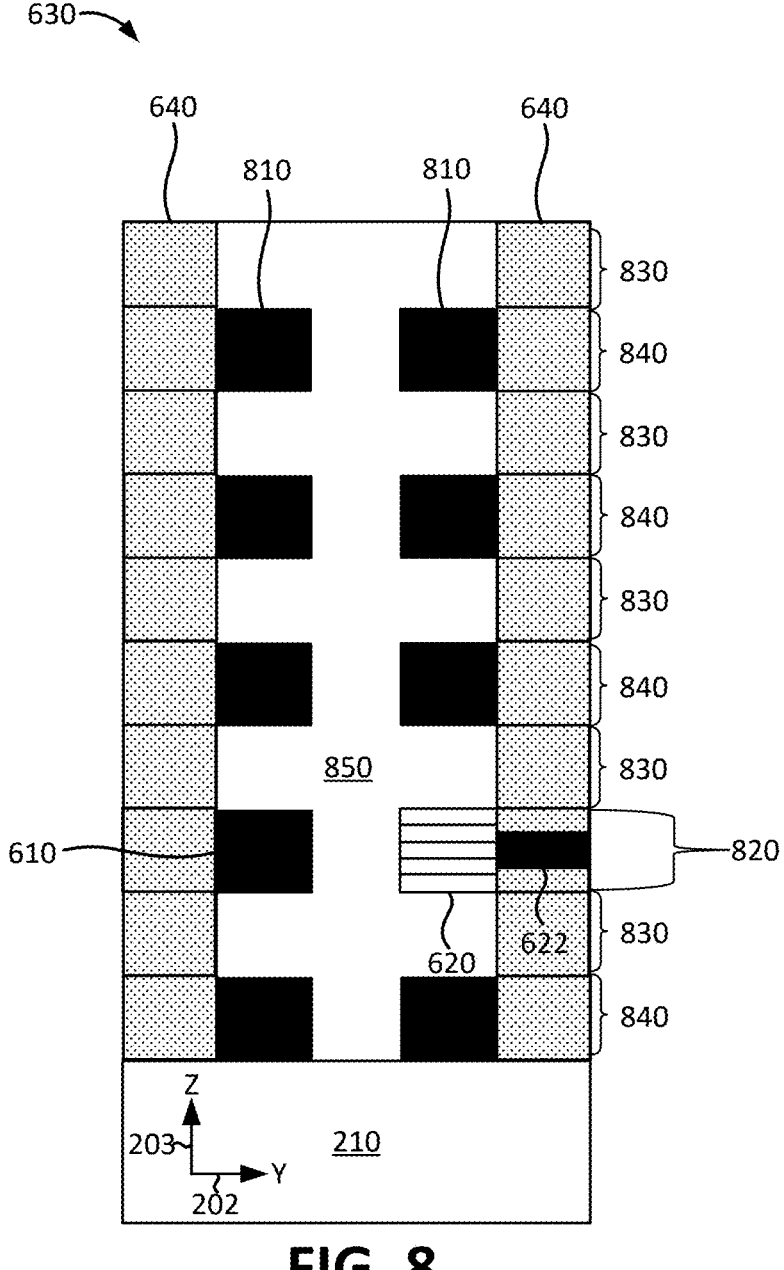
FIG. 8 is a schematic diagram of an end view of the mediator bus of FIG. 7.
Figure 9:
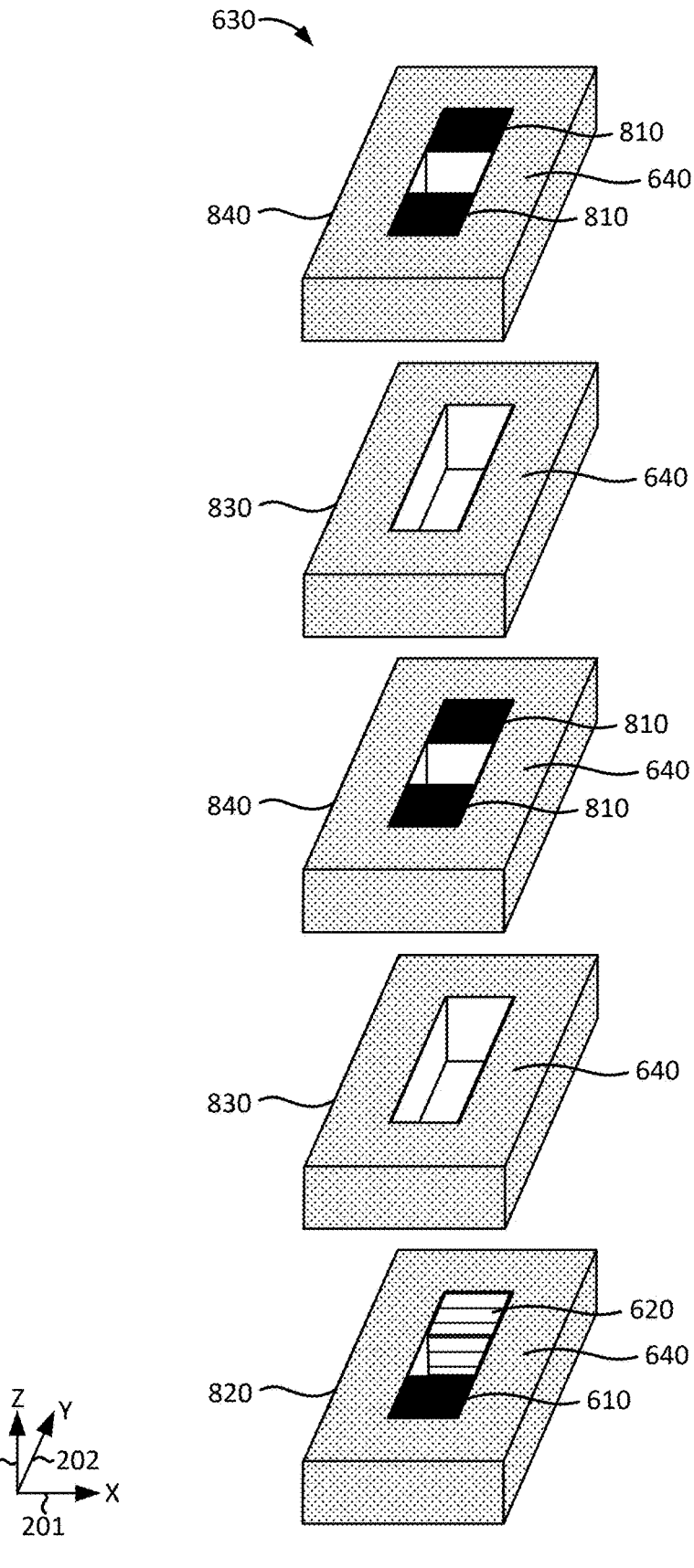
FIG. 9 is an exploded view diagram of the mediator bus of FIG. 7.

FIG. 7 is a schematic diagram of an example quantum system 700 with the mediator bus 630. FIG. 8 is a schematic diagram of an end view of the mediator bus 630 of FIG. 7. FIG. 9 is an exploded view diagram of the mediator bus 630 of FIG. 7. As shown in FIG. 7, the quantum system 700 includes a set of stacked quantum systems 600. Each quantum system 600 include a pair of quantum dots addressable via the microwave stripline 280. Each quantum system 600 may be stacked on an intervening substrate 710, which may be stacked on another quantum system 600. While four quantum systems 600 are shown in FIG. 7 for illustrative purposes, the quantum system 700 may include fewer (e.g., two or three) or additional quantum systems 600. The quantum system 600 may be communicatively coupled through the mediator bus 630. For example, each pair of quantum devices 200 comprising the quantum system 600 may be communicatively coupled to the mediator bus 630 via the mediator quantum dot 610 located between the quantum dots 220 of the quantum system 600. The mediator bus 630 may enable qubits stored in the quantum dots 220 to become entangled. Thus, the mediator bus 630 may propagate an entanglement state between the qubits of the quantum dots 220.

In some implementations, the quantum system 600 may be formed on a SOI substrate. After forming the quantum system 600, the buried oxide layer of the SOI substrate may be etched away to release the quantum system 600 from the SOI substrate to obtain a thin substrate that may be stacked on the intervening substrate 710 using direct wafer bonding.

The intervening substrate 710 may include a via 720 that includes the mediator bus 630. The quantum system 600 may be wafer bonded to the intervening substrate 710 such that the mediator bus 630 in the quantum system 600 aligns with the mediator bus 630 in the via 720 of the intervening substrate 710 at the top surface of the intervening substrate 710 and a bottom pair of quantum dots in the mediator bus 630 of the quantum system 600 is communicatively coupled with a top pair of quantum dots in the mediator bus 630 of the intervening substrate 710. The intervening substrate 710 may then be wafer bonded to a second quantum system 600 such that the mediator bus 630 in the second quantum system 600 aligns with the mediator bus 630 in the via 720 of the intervening substrate 710 at the bottom surface of the intervening substrate 710 and a bottom pair of quantum dots in the mediator bus 630 of the intervening substrate is communicatively coupled with a top pair of quantum dots in the mediator bus 630 of the second quantum system 600.

FIG. 8 depicts the mediator bus 630 in the y-z plane according to some implementations. As shown in FIG. 8, the mediator bus 630 includes the mediator quantum dot 610 and pairs of quantum dots 810. The mediator quantum dot 610 and the quantum dots 810 are positioned inside a vacuum space 850. Thus, each quantum dot in the mediator bus 630 is separated from other quantum dots by a vacuum gap. The mediator quantum dot 610 and the quantum dots 810 may be secured to the mediator bus edge clamping 640 on one or more sides while the other sides of the mediator quantum dot 610 and the quantum dots 810 are exposed to the vacuum space 850.

The quantum dots 810, and the mediator quantum dot 610, may be detuned with respect to each other through shared DC bias planes, fabrication-defined confinement, or dielectric engineering without requiring individual electrical connections to each quantum dot 810. For example, the quantum dots 810 may be detuned with respect to each other by an alternating pattern of two different quantum dot sizes in which each second quantum dot 810 on the left side of the mediator bus 630 is larger and in which each second quantum dot 810 on the right side of the mediator bus 630 is larger and is offset from the larger quantum dots 810 on the left side, so that the larger sized quantum dots 810 form a zigzag pattern across the mediator bus 630. As another example, the quantum dots 810 may be detuned with respect to each other by an alternating pattern of thickness difference in the dielectric hBN layer separating the quantum dot 810 from the edge clamping 640, such that each second quantum dot 810 on the left side of the mediator bus 630 has a thicker dielectric hBN layer and in which each second quantum dot 810 on the right side of the mediator bus 630 has a thicker dielectric hBN layer and is offset from the quantum dots 810 with the thicker dielectric hBN layer on the left side, so that the quantum dots 810 with the thicker dielectric hBN layers form a zigzag pattern across the mediator bus 630.

As further shown in FIG. 8 and FIG. 9, the mediator bus 630 includes mediator modulators 620 at particular intervals along the mediator bus 630. Each mediator modulator 620 is coupled to a mediator modulator lead 622, and the mediator modulator leads 622 connect to a modulator synchronization circuit. The mediator modulators 620 are located adjacent a mediator quantum dot 610 (as shown in FIG. 8 and FIG. 9) or adjacent a quantum dot of the mediator bus 630 that is not a mediator quantum dot 610. The mediator modulator 620 modulates the quantum dots of the mediator bus 630 to increase the interaction strength detuned between the quantum dots of the mediator bus 630. Thus, the mediator modulators 620 propagate entanglement along the mediator bus 630 through detuned dispersive ZZ coupling, without causing actual electron tunneling between the quantum dots of the mediator bus 630.

In some implementations, the spacing between the quantum dots of the mediator bus 630 may be on the order of 10 to 50 nm, and the mediator modulators 620 may emit electromagnetic signals in the RF range, microwave range, infrared range, or optical range. The wavelengths at these frequencies range from 500 nm to the centimeter range. Thus, one mediator modulator 620 may be able to reach a large number (e.g., hundreds, etc.) of mediator dots in the mediator bus 630. In some implementations, one mediator modulator 620 may be provided per 320 qubit tile. In other implementations, one mediator modulator 620 may be provided per bus branch in an array of mediator buses 630. In yet other implementations, a different spacing of the mediator modulators 620 may be used. The number of mediator modulators 620 may be increased, and/or the spacing between the mediator modulators 620 may be decreased, to add local control of specific segments of the mediator bus 630, to reduce cross-talk between adjacent mediator buses 630, and/or to enable use of different frequencies or phases across different segments of the mediator bus 630.

As shown in FIG. 9, the mediator bus 630 may be formed from layers of the mediator bus edge clamping 640. A mediator quantum dot layer 820 may include the mediator quantum dot 610, or another quantum dot in the mediator bus 630, and the mediator modulator 620. In this example, a spacer layer 830 includes the mediator bus edge clamping 640 surrounding the vacuum space 850 without quantum dots. A quantum dot pair layer 840 includes a pair of quantum dots 810. The mediator quantum dot layers 820, spacer layers 830, and quantum dot pair layers 840 are formed on top of each other to form the mediator bus 630. While FIG. 9 shows the mediator bus edge clamping 640 surrounding the vacuum space 850 and contacting the mediator quantum dot 610 and the quantum dots 810 on three sides, in other implementations, the mediator bus edge clamping 640 secure the mediator quantum dots 610 and/or quantum dots 810 in a different manner. For example, the mediator bus edge clamping 640 may include two separate columns to which the mediator quantum dots 610 and/or quantum dots 810 are attached with one side only.

In other implementations, the quantum system 700 may include fewer components, different components, differently arranged components, or additional components than depicted in FIGS. 7, 8, and 9. Additionally, or alternatively, one or more of the components of the quantum system 700 may perform functions described as being performed by one or more other components of the quantum system 700.

FIG. 10 is a flowchart of an example process 1000 for manufacturing the quantum device 200, the quantum device 500, the quantum system 600, and/or the quantum system 700. The process 1000 may be performed by one or more apparatuses configured to perform thin film deposition processes, such as, for example, a chemical vapor deposition (CVD) system, a physical vapor deposition system (PVD), an atomic layer deposition (ALD) system, a photolithography system, wet etching and/or dry etching system, an ion implantation system, a diffusion furnace, and/or other types of thin film processing systems.

The process 1000 includes providing a substrate (block 1005). For example, the quantum device 200, the quantum device 500, the quantum system 600, and/or the quantum system 700 may be formed on a silicon substrate, an SOI substrate, a sapphire substrate, and/or another type of insulating substrate.

The process 1000 further includes forming capacitive plates (block 1010). For example, the electrode capacitive plate 260 and/or the electrode capacitive plate lead 262 are formed on the substrate 210 by depositing a conductive layer, forming a photoresist on top of the conductive layer, patterning the photoresist layer, etching the exposed areas of the conductive layer, and removing the remaining photoresist. In other implementations, the conductive layer may be patterned using another process, such as, for example, laser ablation.

The process 1000 further includes forming modulators (block 1015). For example, a hard mask may be formed and patterned over the electrode capacitive plate 260 and/or the electrode capacitive plate lead 262 to protect the electrode capacitive plate 260 and/or the electrode capacitive plate lead 262 from further processing. The modulator 270 and/or the mediator modulator 620 are formed by depositing a selected EM emission layer on the substrate 210, forming a photoresist on top of the conductive layer, patterning the photoresist layer, etching the exposed areas of the conductive layer, and removing the remaining photoresist. In other implementations, the conductive layer may be patterned using another process, such as, for example, laser ablation. A hard mask may then be formed and patterned over the modulator 270 and/or the mediator modulator 620 to protect the modulator 270 and/or the mediator modulator 620 from further processing.

The process 1000 further includes forming quantum dots (block 1020). The dielectric layer 222 may first be formed on the substrate 210 and a graphene layer may be formed on the dielectric layer 222. In some implementations, the graphene layer may be grown on a metal substrate and transferred from the metal substrate to the dielectric layer 222. In other implementations, the graphene layer may be grown directly on the dielectric layer 222 using CVD, plasma-enhanced CVD, or molecular beam epitaxy.

The process 1000 further includes tuning graphene quantum dots to respond to a first frequency range (block 1025). For example, the formed graphene layer are tuned to respond to the frequency range $f_2$ of EM signals which the mediator modulator 620 is to be configured to emit. In some implementations, the graphene layer may be doped with a selected concentration of one or more dopants, such as boron, nitrogen, hydrogen, iron, nickel, cobalt, silver, gold, palladium, tungsten, $HNO_3$, $TiO_2$, PAA and/or another dopant selected to increase the Casimir force of the graphene layer in response to the first frequency range. The doping may be performed through vapor doping, liquid doping, ion implantation doping, etc. In other implementations, a thin metallic layer may be deposited on the graphene layer to tune the graphene layer.

Alternatively, the doping may be performed through substitutional doping during the growth of the graphene layer. Additionally, or alternatively, the graphene layer may be tuned by adjusting the thickness of the dielectric layer 222 (e.g., by adjusting the thickness of a hBN layer forming the dielectric layer 222) during the deposition of the dielectric layer 222. The cap layer 224 may then be deposited on top of the graphene layer. The dielectric layer 222, the graphene layer, and the cap layer 224 may then be patterned and etched to form the quantum dots 220 and/or the mediator quantum dot 610. The edge clamping 226 may then be formed on the sides of the quantum dots 220 and/or mediator quantum dot 610 by forming a layer of the edge clamping material and patterning the edge clamping material. The quantum dots 220 and/or the mediator quantum dot 610 may then be protected with a hard mask during further processing.

The process 1000 further includes forming the crab-leg cantilever (block 1030), forming the electrode anchor and the electrode on the crab-leg cantilever (block 1035), and tuning the electrode and the electrode anchor to respond to a second frequency range (block 1040). For example, a sacrificial layer is deposited on the substrate 210 and patterned to form a support for the crab-leg actuator 240. A material forming the actuator anchor 242, the crab-leg actuator 240, and/or the electrode anchor 252 may then be deposited on the substrate 210. The actuator anchor 242, the crab-leg actuator 240, and/or the electrode anchor 252 may then be patterned and etched. The arm segments of the crab-leg actuator 240 may be shaped on top of the sacrificial layer. If angular stops 544 and 546 are being used, the angular stops 544 and 546 may be formed during the patterning of the crab-leg actuator 240. In implementations that do not use a movable electrode (e.g., see FIGS. 14A, 14B, and 15), process 1000 may exclude block 1030, and block 1035 may exclude forming the electrode anchor and include forming the fixed electrode 1410 over the electrode capacitive plate 260 with the dielectric layer 1420 or a vacuum gap interposed between the electrode capacitive plate 260 and the fixed electrode 1410.

The electrode 250 and the electrode anchor 252 may be formed by forming a layer of hBN and forming a layer of graphene on the hBN layer. The second graphene material may be tuned to respond to the frequency range $f_1$ of EM signals which the modulator 270 is to be configured to emit. As explained above, tuning the second graphene layer may include doping the second graphene layer with a selected concentration of a selected dopant, selecting a thickness of the hBN layer, and/or by forming a thin layer of metal on top of the second graphene layer. The electrode 250 and/or the electrode anchor 252 may then be patterned and etched. The crab-leg actuator 240, the electrode 250, and/or the electrode anchor 252 may then be protected with a hard mask during further processing.

In some implementations, the first graphene layer and/or the second graphene layer are deposited and doped or otherwise tuned such that the graphene doping and layer uniformity are controlled within ±0.3 nanometers across a three hundred millimeter wafer. Furthermore, in some implementations a cryogenic stress-management layer is deposited to maintain alignment of the vacuum gap during cooling to below ten millikelvin.

The process 1000 further includes forming hard stops for the crab-leg cantilever (block 1045). For example, the hard stops 244 and 246 are formed on the substrate 210 by depositing and patterning the material for the hard stops 244 and 246. In implementations that do not use a movable electrode (e.g., see FIGS. 14A, 14B, and 15), process 1000 may exclude block 1045. The process 1000 may further include forming microwave stripline (block 1050). The 280 may be formed by depositing a sacrificial layer on top of the quantum dot 220 between the posts of the electrode anchor 252 and forming and patterning the microwave stripline 280 on top of the sacrificial layer. The microwave stripline lead 282 may also be formed on top of a sacrificial layer.

The process 1000 further includes forming a mediator bus (block 1055). The mediator bus 630 may be formed in a series of steps that include forming a layer of the mediator bus edge clamping 640, patterning the layer of mediator bus edge clamping 640, forming a graphene layer of the patterned layer of the mediator bus edge clamping 640, and patterning and tuning the quantum dots 810 (or the mediator quantum dot 610 if the layer corresponds to the quantum dot pair layer 840). The spacer layers 830 between the quantum dot pair layers 840 may be filled with a sacrificial layer that is later removed to form the vacuum space 850.

The process 1000 further includes releasing the sacrificial layer under the crab-leg cantilever and removing hard masks (block 1060). The sacrificial layer under the crab-leg actuator 240 may be released by etching. The sacrificial layer under the microwave stripline 280 and/or microwave stripline lead 282 may also be released. Furthermore, hard masks protecting the components of the quantum system 700 during further manufacture may also be removed by etching.

The process 1000 further includes forming contacts (block 1065) and a vacuum sealing quantum device (block 1070). For example, the quantum dot capacitive plate lead 232, the electrode capacitive plate lead 262, the modulator lead 272, a lead for the mediator modulator 620, and/or the microwave stripline lead 282 may be formed and patterned on the substrate 210. Furthermore, the quantum system 700 may be sealed by forming the vacuum enclosure 215 in a UHV pressure environment.

While a series of blocks have been described with respect to FIGS. 10, the order of the blocks may be modified in other implementations. Further, non-dependent blocks may be performed in parallel. Additionally, in some implementations, the process 1000 may not include all of the blocks, may include additional blocks, one or more blocks may be combined, and/or one or more blocks may be repeated.

Figure 11:
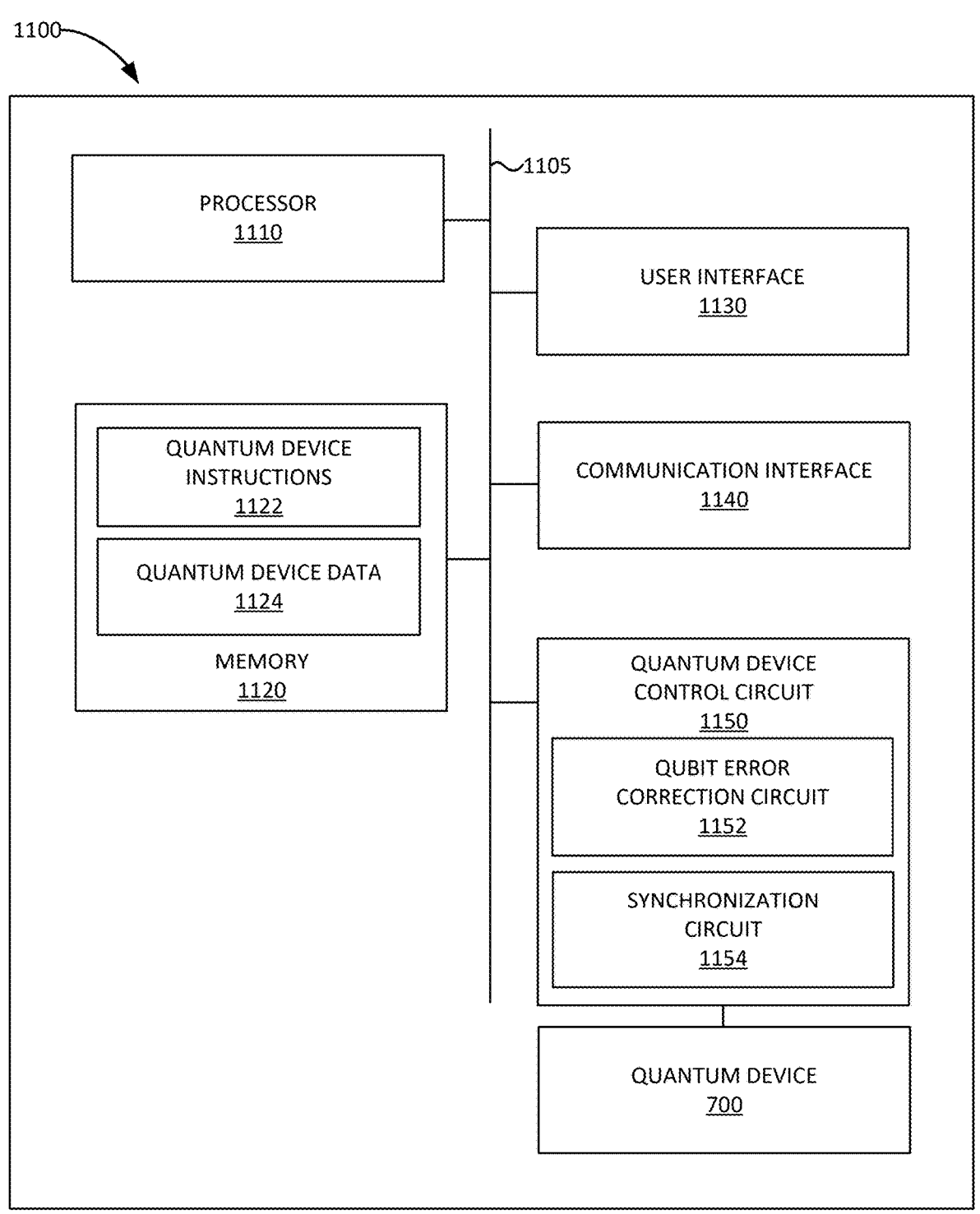
FIG. 11 is a block diagram of a computer device configured to control a quantum device according to an embodiment described herein.

FIG. 11 is a block diagram of a computer device 1100 configured to control a quantum device according to an embodiment described herein. As shown in FIG. 11, the computer device 1100 may include a communication path 1105, a processor 1110, a memory 1120, a user interface 1130, a communication interface 1140, a quantum device control circuit 1150, and the quantum system 700.

The communication path 1105 may enable communication between the components of the computer device 1100. For example, the communication path 1105 may include a bus. In some implementations, the components of the computer device 1100 may be electrically connected to each other with the communication path 1105. In other implementations, the components of the computer device 1100 may be connected to each other directly and/or a first component of the computer device 1100 may be included within a second component of the computer device 1100.

The processor 1110 may include any type of single-core processor, multi-core processor, microprocessor, CPU, GPU, tensor processing unit (TPU), quantum processing unit (QPU), hardware accelerator, and/or processing logic (or families of processors, microprocessors, and/or processing logic) that interprets and executes instructions. In other implementations, processor 1110 may include an Application Specific Integration Circuit (ASIC), a Field Programmable Gate Array (FPGA), and/or another type of integrated circuit or processing logic.

The memory 1120 may include any type of dynamic storage device that stores information and/or instructions, for execution by the processor 1110, and/or any type of non-volatile storage device that stores information for use by the processor 1110. For example, the memory 1120 may include a RAM or another type of dynamic storage device, a ROM device or another type of static storage device, a magnetic and/or optical recording memory device and its corresponding drive (e.g., a hard disk drive, optical drive, etc.), and/or a removable form of memory, such as a flash memory. The memory 1120 may include quantum device instructions 1122 and quantum device data 1124. The quantum device instructions 1122 may be used to control the operation of the computer device 1100. The quantum device data 1124 may store data to be used during the operation of the computer device 1100.

The user interface 1130 may include an input device that enables an operator to input information into the computer device 1100. The input device may include, for example, a keyboard, a mouse, a pen, a microphone, a remote control, an audio capture device, an image and/or video capture device, a touchscreen display, and/or another type of input device. In some implementations, the computer device 1100 may be managed remotely and may not include the input device. In other words, computer device 1100 may be "headless" and may not include a keyboard, for example.

The user interface 1130 may further include an output device that provides information to an operator of the computer device 1100. The output device may include a display, a touchscreen display, a printer, a speaker, and/or another type of output device. For example, computer device 1100 may include a liquid-crystal display (LCD), a Light Emitting Diode (LED) display, an organic LED (OLED) display, and/or another type of display. In some implementations, the computer device 1100 may be managed remotely and may not include an output device. In other words, the computer device 1100 may be "headless" and may not include a display, for example. In some implementations, the computer device 1100 may be managed by biofeedback and can be controlled by external electronic devices such as smartphones, mobile phones, and/or tablets.

The communication interface 1140 may include a transceiver that enables the computer device 1100 to communicate with other devices and/or systems via wireless communications (e.g., radio frequency, infrared, and/or visual optics, etc.), wired communications (e.g., conductive wire, twisted pair cable, coaxial cable, transmission line, fiber optic cable, and/or waveguide, etc.), or a combination of wireless and wired communications. Communication interface 1140 may include a transmitter that converts baseband signals to RF signals and/or a receiver that converts RF signals to baseband signals. The communication interface 1140 may be coupled to an antenna for transmitting and receiving RF signals.

The communication interface 1140 may include a logical component that includes input and/or output ports and/or other input and output components that facilitate the transmission of data to other devices. For example, the communication interface 1140 may include a network interface card (e.g., Ethernet card) for wired communications and/or a wireless network interface (e.g., a Wi-Fi®) card for wireless communications. Communication interface 1140 may also include a USB port for communications over a cable, a Bluetooth™ wireless interface, an RFID interface, an NFC wireless interface, and/or any other type of interface.

The quantum device control circuit 1150 interfaces with and control the quantum system 700. The quantum device control circuit 1150 translates computation instructions into quantum operation instructions for the quantum system 700. For example, the quantum device control circuit 1150 may convert computation instructions into qubit operation instructions that include instructions to generate particular qubits using the electrode capacitive plate 260 and electrode 250, to set qubits to particular values using the microwave stripline 280, entangle qubits using the mediator modulator 620, read out the results of a quantum operation using the microwave stripline 280, and/or other types of qubit operations.

The quantum device control circuit 1150 may include a qubit error correction circuit 1152 and a synchronization circuit 1154. The qubit error correction circuit 1152 may perform error correction for qubit operations performed by the quantum system 700. For example, the qubit error correction circuit 1152 may use non-destructive readout during qubit operations to detect errors and may use ESR manipulation to correct detected qubit errors in the quantum system 700. The synchronization circuit 1154 may synchronize the operation of the mediator modulators 620 of the mediator bus 630. For example, the mediator bus modulation synchronization circuit 1154 may synchronize EM pulses emitted by the mediator modulators 620 to propagate entanglement along the mediator bus 630 via detuned dispersive ZZ coupling. The synchronization circuit 1154 may control the mediator modulators 620 to emit electromagnetic pulses having a phase alignment of less than 10 picoseconds to synchronize the entanglement propagation in the mediator bus 630. Furthermore, the synchronization circuit 1154 may synchronize the operation of the microwave striplines 280 to perform ESR readouts of the qubits in the quantum system 700.

As described herein, the computer device 1100 may perform operations relating to the operation of a quantum device. The computer device 1100 may perform these operations in response to the processor 1110 executing software instructions contained in a computer-readable medium, such as the memory 1120. A computer-readable medium may be defined as a non-transitory memory device. A non-transitory memory device may be implemented within a single physical memory device or spread across multiple physical memory devices. The software instructions may be read into the memory 1120 from another computer-readable medium or from another device. The software instructions contained in the memory 1120 may cause the processor 1110 to perform processes described herein. Alternatively, hardwired circuitry may be used in place of, or in combination with, software instructions to implement processes described herein. The operation of processor 1110 executing the software instructions in the memory 1120, and/or hardwired circuitry used in place of, or in combination with, the software instructions, may be referred to herein as a "processing resource" or as a "control circuit." Thus, implementations described herein are not limited to any specific combination of hardware circuitry and software.

In other implementations, the computer device 1100 may include fewer components, different components, differently arranged components, or additional components than depicted in FIG. 11. Additionally, or alternatively, one or more of the components of the computer device 1100 may perform functions described as being performed by one or more other components of the computer device 1100.

FIG. 12 is a flowchart of an example process 1200 for using a quantum device according to an embodiment described herein. In some implementations, the process 1200 may be performed by the quantum device 200, the quantum device 500, the quantum system 600, the quantum system 700, and/or the computer device 1100. In other implementations, some or all of the process 1200 may be performed by another device or groups of devices. The operation of process 1200 may be performed by maintaining the quantum device 200, the quantum device 500, the quantum system 600, and/or the quantum system 700 at cryogenic temperatures.

The process 1200 includes holding all qubits stable (block 1210). For example, the computer device 1100 may instruct the quantum system 700 to hold all current qubits in a stable state by withdrawing all crab-leg actuators 240, deactivating modulators 270, deactivating mediator modulators 620, and/or deactivating microwave striplines 280.

The process 1200 further includes choosing subset and order of target operations for a set of qubits (block 1215). For example, the computer device 1100 may instruct the quantum device control circuit 1150 to implement a quantum operation and the quantum device control circuit 1150 may convert the instructions into a set of operations to be performed by the quantum system 700. In some implementations, the target operations may be selected to be performed by at least 320 qubits. In other implementations, a different number of qubits may be selected.

The process 1200 further includes pre-charging electrode via capacitive plate (block 1220), using a modulator to activate Casimir force to deform crab-leg cantilever to move electrode within electron tunneling range of quantum dot (block 1225), and transferring an electron from the electrode to the quantum dot via quantum tunneling (block 1230). For example, the quantum device 200 may charge the electrode capacitive plate 260, deform the crab-leg actuator 240 to extend the crab-leg actuator 240 to position the electrode 250 above the electrode capacitive plate 260 by activating the modulator 270, and charge the electrode 250. When the modulator 270 is activated, the Casimir force between the electrode 250 and the electrode anchor 252 may increase, causing the crab-leg actuator 240 to extend to position the electrode 250 above the electrode capacitive plate 260. An electron from the electrode 250 may then tunnel to the quantum dot 220.

The process 1200 further includes confirming successful electron transfer using a reflectometry read of the quantum dot (block 1235) and deactivating the modulator to reduce Casimir force to retract crab-leg mediator and isolate quantum dot (block 1240). The quantum device 200 may then use the quantum dot capacitive plate 230 to measure the charge in the quantum dot 220 to confirm an electron has been successfully transferred. If the transfer of the electron is not confirmed, blocks 1220, 1225, and 1230 may be repeated. If the transfer of the electron is confirmed, the modulator 270 may be deactivated. Deactivation of the modulator 270 may decrease the Casimir force between the electrode 250 and the electrode anchor 252, causing the crab-leg actuator 240 to retract due to the spring force stored in the extended crab-leg actuator 240. The electrode 250 may withdraw away from the quantum dot 220, reducing decoherence noise for the quantum dot 220 and resulting in an increased coherence time for the qubit in the quantum dot 220.

The process 1200 further includes setting the electron qubit in the quantum dot into superposition in preparation for entanglement (block 1245). For example, the quantum device 200 may use the microwave stripline 280 to set the qubit in the quantum dot 220 to a selected qubit value by causing the electron in the quantum dot 220 to adopt a spin value corresponding to the selected qubit value. Furthermore, the quantum system may apply a single qubit gate operation that puts the qubit into superposition. For example, the quantum system may apply a Hadamard gate operation, a rotation gate that rotates the qubit around the X axis and/or Y axis, and/or a combination gate that combines rotations that create superposition.

The process 1200 further includes synchronizing phase across hubs (block 1250), entangling left and right qubit using mediator dot (block 1255), and isolating entangled qubit pair (block 1260). For example, the quantum system 700 may use mediator modulator 620 to increase the interaction strength to enable detuned dispersive ZZ coupling between a left quantum dot 220 and the mediator quantum dot 610 and between the right quantum dot 220 and the mediator quantum dot 610 to entangle the qubit in the left quantum dot 220 with the qubit in the right quantum dot 220.

FIG. 13 is a flowchart of another example process 1300 for using a quantum device according to an embodiment described herein. In some implementations, the process 1300 may be performed by the quantum device 200, the quantum device 500, the quantum system 600, the quantum device, the quantum system 700, and/or the computer device 1100. In other implementations, some or all of the process 1300 may be performed by another device or groups of devices.

The process 1300 may be a continuation of the process 1200. The illustrated process 1300 includes propagating entanglement via a mediator bus (block 1310), extending the entangled state sequentially across adjacent quantum dot pairs (block 1315), and combining entangled states at a local hub to extend entanglement across additional qubit pairs (block 1320). The quantum system 700 propagates entanglement through the mediator bus 630, which functions as a dispersive entanglement distribution network connecting multiple quantum systems 600. The entangled state is extended stepwise along the mediator bus 630 through detuned dispersive ZZ interactions without transferring electrons or qubit states. At a local hub, independently generated entangled states are combined through phase-based entanglement extension to increase the size of the entangled qubit network.

The process 1300 further includes completing rounds to build a node cluster (block 1325) and isolating the node cluster (block 1330). Once a selected number of qubits are entangled, the cluster of entangled qubits may be isolated to perform the entangled cluster for operations. In some implementations, the node cluster may include at least three hundred qubits. For example, the node cluster may include 320 qubits. The process 1300 may further include performing single qubit operations (block 1335), opening local corridors for 2-qubit gates (block 1340), performing syndrome extraction/error detection (block 1345), and executing logical operations on the node cluster (block 1350).

The process 1300 may further include performing non-destructive readout of target qubits (block 1355), performing classical decoding and store results (block 1360), and performing decoherence management during idle interval (block 1365). The process 1300 may further include clearing quantum dots and prepare electrons for next round (block 1370) and updating calibration tables and proceed to next round (block 1375).

While a series of blocks have been described with respect to FIGS. 12 and 13, the order of the blocks may be modified in other implementations. Further, non-dependent blocks may be performed in parallel. Additionally, in some implementations, the process 1200 and/or process 1300 may not include all of the blocks, may include additional blocks, one or more blocks may be combined, and/or one or more blocks may be repeated.

Figure 14A:
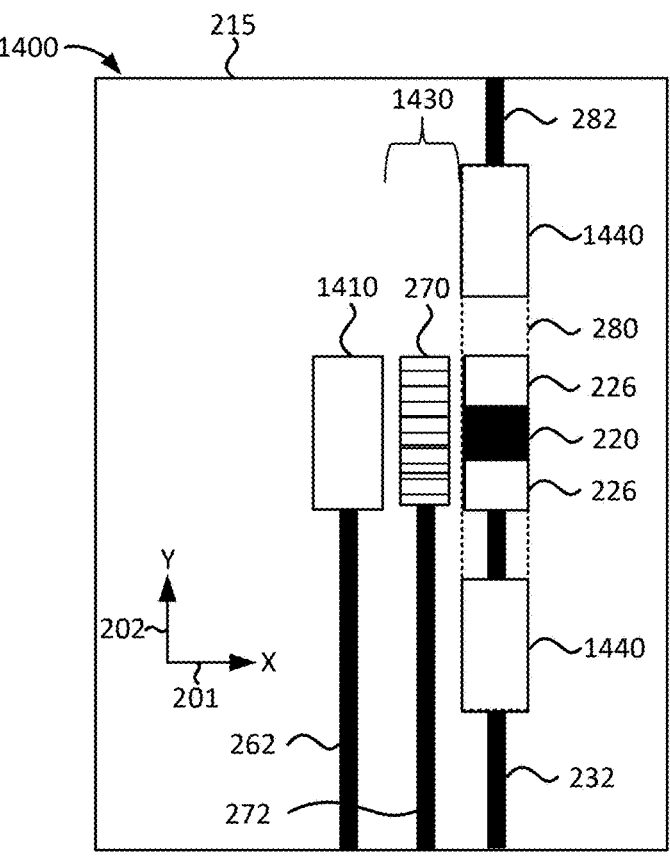
FIG. 14A is a schematic diagram of a top view of a quantum device with a fixed electrode according to an embodiment described herein.
Figure 14B:
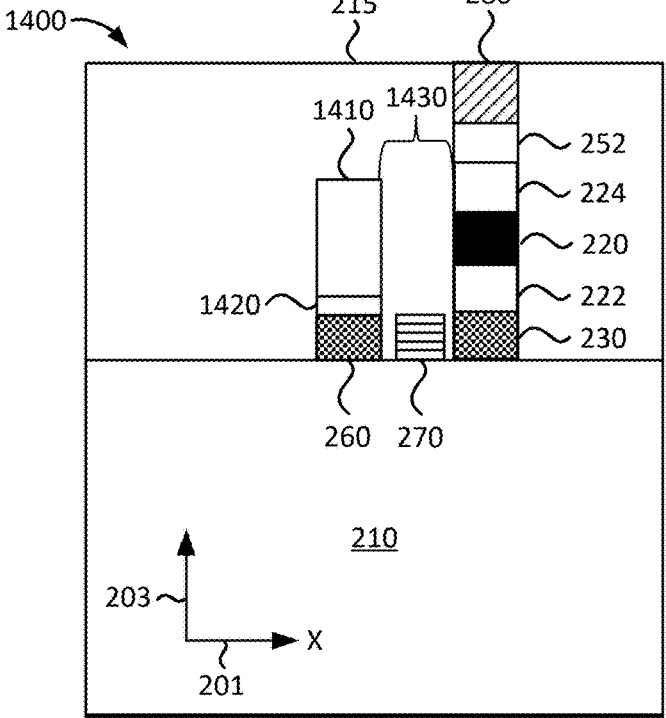
FIG. 14B is a schematic diagram of a side view of a quantum device with a fixed electrode according to an embodiment described herein.

FIG. 14A is a schematic diagram of a top view of a quantum device 1400 with a fixed electrode according to an embodiment. FIG. 14B is a schematic diagram of a side view of the quantum device 1400. As shown in FIGS. 14A and 14B, the quantum device 1400 includes a substrate 210 and a vacuum enclosure 215. The vacuum enclosure 215 includes a quantum dot 220, a dielectric layer 222, a cap layer 224, edge clamping 226, a quantum dot capacitive plate 230, a quantum dot capacitive plate lead 232, an electrode capacitive plate 260, an electrode capacitive plate lead 262, a modulator 270, a modulator lead 272, a microwave stripline 280, a microwave stripline lead 282, a fixed electrode 1410, a dielectric layer 1420, and microwave stripline support beams 1440.

The quantum dot 220, the dielectric layer 222, the cap layer 224, the edge clamping 226, the quantum dot capacitive plate 230, the quantum dot capacitive plate lead 232, the electrode capacitive plate 260, the electrode capacitive plate lead 262, the modulator 270, the modulator lead 272, the microwave stripline 280, and the microwave stripline lead 282 are as described above with reference to FIGS. 2A, 2B, 3A, 3B, and 4. The microwave stripline support beams 1440 support the microwave stripline 280 and, contrary to the electrode anchor 252 of FIGS. 2A, 2B, 3A, 3B, and 4, may not include a graphene material, as the attraction of the electrode 250 toward the quantum dot 220 is not needed in the quantum device 1400.

However, instead of a movable electrode and a crab-leg actuator, the quantum device 1400 includes a fixed electrode 1410. The fixed electrode 1410 may be deposited on top of the electrode capacitive plate 260 with a dielectric layer 1420 interposed between the electrode capacitive plate 260 and the fixed electrode 1410. The dielectric layer 1420 is located between the electrode capacitive plate 260 and the fixed electrode 1410 and functions as a spacer and electric insulator between the electrode capacitive plate 260 and the fixed electrode 1410. The dielectric layer 1420 may include hBN with a thickness between 5 and 15 nm. The hBN offers an atomically smooth, chemically inert insulating surface for the graphene of the fixed electrode 1410. In other implementations, a different type of material may be used, such as, for example, $SiO_2$, $Al_2O_3$, $HfO_2$, and/or another type of material with a high dielectric constant (e.g., a relative permittivity $\varepsilon_r > 3.5$). In yet other implementations, a vacuum gap may be used in place of the dielectric layer 1420. For example, the fixed electrode 1410 may be connected to an L-shaped fixed electrode anchor that is fixed to the substrate and that suspends the fixed electrode 1410 above the electrode capacitive plate 260. The fixed electrode 1410 is separated from the quantum dot 220 by a tunneling gap 1430. In some implementations, the tunneling gap 1430 corresponds to approximately 7 nm.

The fixed electrode 1410 may include a graphene material, or a graphene material stack, as described above with reference to the electrode 250 of FIGS. 2A, 2B, 3A, and 3B. The graphene material of the fixed electrode 1410 is tuned to respond to EM signals in a frequency range $f_1$ to decrease an electron tunneling barrier in the vacuum between the fixed electrode 1410 and the quantum dot 220 and thus to decrease the effective tunneling range between the fixed electrode 1410 and the quantum dot 220. The fixed electrode 1410 is charged by the electrode capacitive plate 260 and when the modulator 270 is activated, the tunneling barrier between the fixed electrode 1410 and the quantum dot 220 drops and an electron tunnels from the fixed electrode 1410 to the quantum dot 220 to store a single electron in the quantum dot 220.

Thus, the modulator 270 may be configured to emit electromagnetic signaling within a particular frequency range $f_1$, and the graphene material of the fixed electrode 1410 is tuned to vary the surface conductivity of the graphene material in response to the electromagnetic signaling emitted by the modulator 270, which results in varying the surface conductivity of the graphene material of the fixed electrode 1410 to increase the Casimir force across the tunneling gap to increase an electron tunneling probability across the tunneling gap without physical movement of the fixed source electrode 1410. The modulator 270 may be configured to emit an optical, radio-frequency, or terahertz signal configured to alter the Fermi level of the graphene material of the fixed electrode 1410 to modulate the permittivity tensor of the graphene material of the fixed electrode 1410. In some implementations, the Casimir coefficient n of the graphene material of the fixed electrode 1410 is tuned between approximately 1.0 and 0.3 to define idle and active tunneling states respectively.

Figure 15:
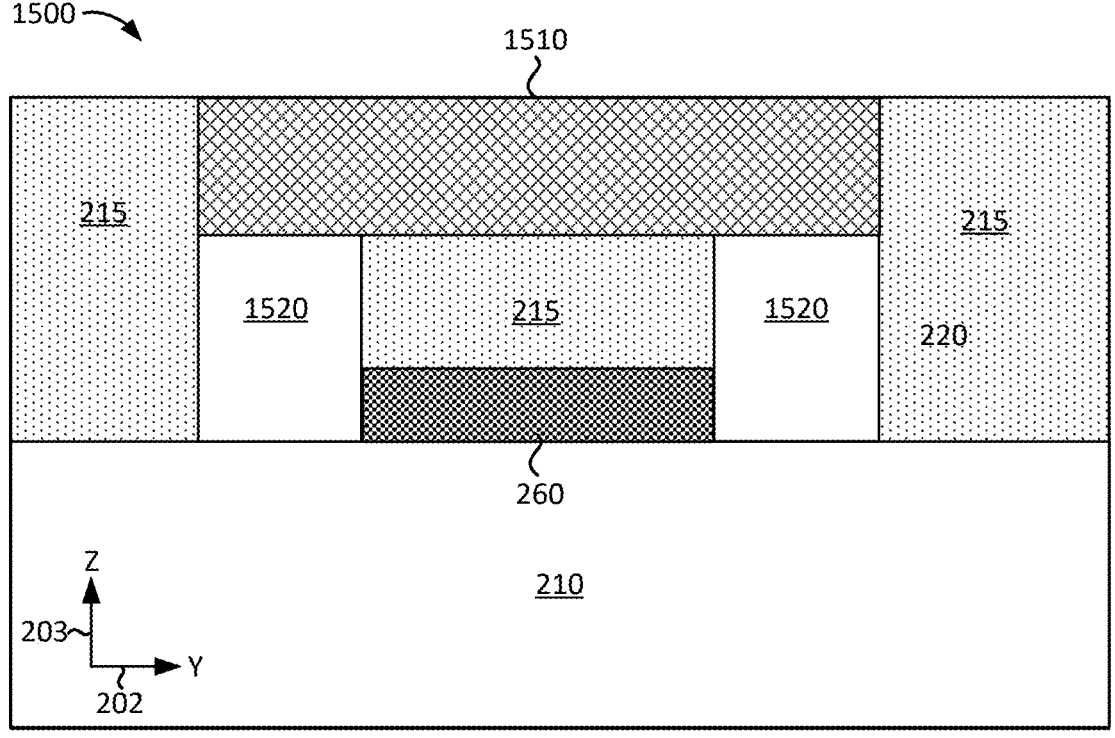
FIG. 15 is a schematic diagram of an end view of a quantum device with a fixed electrode according to an embodiment described herein.

FIG. 15 is a schematic diagram of an end view of a quantum device 1500 with a fixed electrode according to another embodiment. FIG. 15 illustrates an alternative structure to suspend a fixed electrode above the electrode capacitive plate 260 and within an electron tunneling range of the quantum dot 220. As shown in FIG. 15, the quantum device 1500 includes a fixed electrode 1510 secured on electrode support beams 1520, with a vacuum gap disposed between the fixed electrode 1410 and the electrode capacitive plate 260. The electrode support beams 1520 are fixed to the substrate 210 adjacent to the sides of the electrode capacitive plate 260 and suspends the fixed electrode 1510 above the electrode capacitive plate 260. Thus, in the quantum device 1500, the fixed electrode 1510 is fixed to the substrate 210 through the electrode support beams 1520, rather than the dielectric layer 1420 that secures the fixed electrode 1410 to the substrate 210 in the quantum device 1400.

Figure 16:
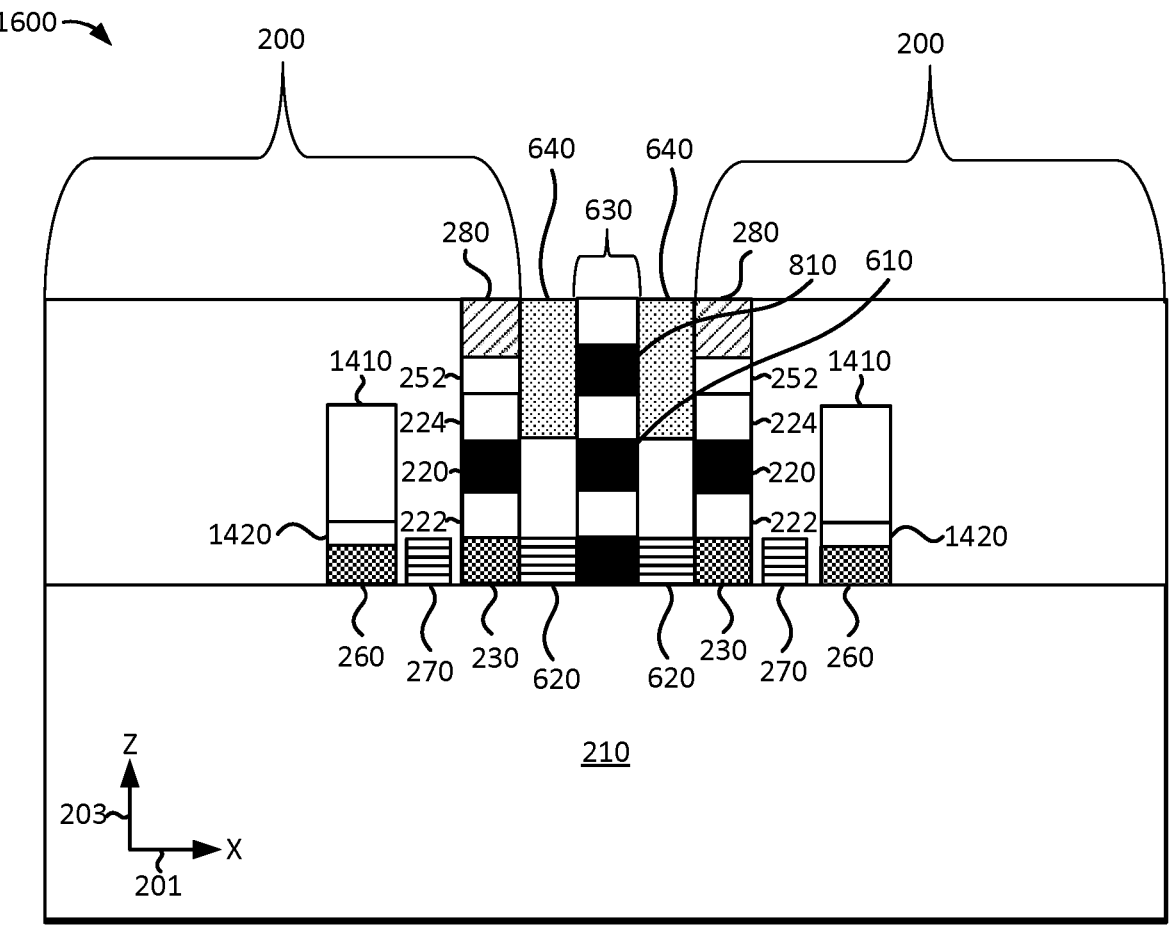
FIG. 16 is a schematic diagram of a side view of a quantum device with fixed electrode, a mediator quantum dot, and a mediator bus according to an embodiment described herein.

FIG. 16 is a schematic diagram of a side view of a quantum system 1600 with fixed electrodes 1410, the mediator quantum dot 610, and the mediator bus 630. As shown in FIG. 16, the quantum system 1600 includes two quantum devices 1400 (or alternatively two quantum devices 1500) formed as mirror images of each other on the substrate 210. A first quantum device 1400 on a left side of the substrate 210 along the x-axis 201 includes the fixed electrode 1410 facing to the right along the x-axis 201, and a second quantum device 1400 on a right side of the substrate 210 along the x-axis 201 includes the fixed electrode 1410 facing to the left along the x-axis 201. The quantum system 1600 further includes a mediator quantum dot 610, a mediator modulator 620, a mediator bus 630, and a mediator bus edge clamping 640. The mediator quantum dot 610, a mediator modulator 620, a mediator bus 630, and the mediator bus edge clamping 640 may be as described above with reference to FIG. 6.

The quantum system 1600 includes the fixed electrodes 1410 with a first graphene material tuned to respond to an EM signal in a first frequency range to decrease the tunneling barrier between the fixed electrodes 1410 and the quantum dot 220 in response to the modulators 270 emitting EM signals in the first frequency range. Furthermore, the quantum system 1600 includes the quantum dots 220, the mediator quantum dots 610, and the quantum dots of the mediator bus 630, which individually include a second graphene material tuned to respond to an EM signal in a second frequency range to increase the interaction strength and enable detuned dispersive ZZ coupling between adjacent quantum dots to propagate entanglement, without causing any actual electron tunneling. The mediator modulators 620 are configured to emit EM signals in the second frequency range to increase the interaction strength and enable detuned dispersive ZZ coupling between adjacent quantum dots to propagate entanglement. The first graphene material and/or the second graphene material may include an anisotropic or hyperbolic optical medium, and modulation of the permittivity tensor components of the first graphene material and/or the second graphene material changes the local density of electromagnetic vacuum modes to modify the Casimir force experienced by the first graphene material and/or the second graphene material. In some implementations, the anisotropic or hyperbolic optical medium satisfies $\varepsilon_\perp < 0$ and $\varepsilon_\parallel > 0$ in the mid-infrared regime (e.g., in the frequency range of 25 to 120 THz), producing hyperbolic dispersion. These frequency ranges are non-limiting examples; depending on the graphene/hBN stack and carrier density, the second frequency range may be in the THz range (e.g., 2 to 5 THz) or in the mid-infrared range (e.g., 25 to 120 THz). In some implementations, the modulation of the Casimir force or pressure results in at least a two-fold increase of the unmodulated Casimir force across Casimir coupled surfaces. In some implementations, the modulation may include optical modulation that produces a electronic carrier-density response time of less than one hundred femtoseconds.

The quantum device 1400, the quantum device 1500, and the quantum system 1600 may be fabricated as described above with reference to FIG. 10, without forming the crab-leg cantilever, the hard stops, and electrode anchor. Rather, in place of blocks 1030, 1035, and 1045, the process 1000 includes depositing and shaping the dielectric layer 1420 and the fixed electrode 1410.

Multiple quantum systems 1600 may be assembled into a quantum system that includes multiple mediator quantum dots 610 individually positioned between a pair of adjacent quantum dots 220 of the quantum devices 1400 (or quantum devices 1500) and a mediator bus 630 that includes mediator bus quantum dots, wherein the mediator bus 630 links pairs of adjacent quantum dots of the quantum devices 1400 through the mediator quantum dots, such that the mediator quantum dots 610 and the mediator bus 630 enable entanglement propagation between non-adjacent qubits stored in the quantum devices 1400. The mediator quantum dots 610 and the mediator bus 630 enable entanglement propagation by increasing interaction strength leading to detuned dispersive ZZ coupling through a modulated Casimir force and propagate entanglement across multiple left-right qubit pairs. The propagation of the entanglement is controlled by the mediator modulators 620 located along the mediator bus 630. The mediator modulators 620 may be configured to emit electromagnetic pulses having a phase alignment of less than 10 picoseconds to synchronize the entanglement propagation.

The fixed electrode configuration described with reference to FIGS. 14A, 14B, 15, and 16 may provide reduced fabrication complexity and cost, in comparison to the movable electrode configuration described with reference to FIGS. 2A, 2B, 3A, 3B, 4, 5A, 5B, and 6, at slightly reduced coherence times for qubits stored in the quantum dots 220. However, the fixed electrode configuration of FIGS. 14A, 14B, 15, and 16 still provides coherence times of at least 1 ms to 3 ms in a cryogenic environment of 1 to 4 mK.

For example, in a static Casimir-bias graphene spin qubit with a 7 nm source-to-dot spacing, a small capacitive co-bias, on the order of approximately 60 millielectronvolt (meV) potential difference, may be applied across the graphene-hBN stack of the fixed electrode 1410. The co-bias produces an electric field of approximately 0.1-0.2 V/nm in the gap, which complements the Casimir-force bias modulation to achieve an extremely high tunnel-versus-idle conductance ratio on the order of 106 to 109 between the tunneling-enabled ON state and the idle OFF state. With bias lines that are well filtered and thermally anchored at cryogenic temperature, introducing this field has a minimal impact on qubit coherence. The $T_1$ energy-relaxation time and $T_2$ phase-coherence time remain on the order of milliseconds (e.g., greater than 1 to 3 ms, etc.) in a 1-4 mK cryogenic environment. These coherence times are consistent with high-fidelity quantum operation, meaning the qubits retain coherence properties even under an added electric bias field.

An operation sequence for the quantum system 1600 may be performed as follows. An initialization sequence begins by setting the Casimir bias to a high-barrier state with a coupling coefficient n approximately equal to 1.0. Qubits in the quantum dots 220 are initialized to the |0⟩ state using spin re-polarization or thermal or optical reset protocols, using, for example, the microwave stripline 280. Mediator-bus couplings of the mediator bus 630 are verified to be inactive, and the microwave striplines 280 are configured to an idle phase reference. This sequence establishes a stable, low-noise starting condition for quantum operations.

Superposition preparation is achieved by applying ESR $\pi/2$ rotations to selected data qubits using the microwave striplines 280. H-equivalent rotations are implemented using calibrated X/Y composite pulse sequences. Phase coherence is confirmed through an optional non-destructive readout probe test on ancilla qubits. This process populates the qubits into a multi-state superposition, expanding the system into a $2^N$-dimensional Hilbert space.

Entanglement activation proceeds by activating the mediator modulators 620 to a prescribed interaction value. A mediator-bus coupling pulse is enabled for a calibrated duration to implement controlled Z (CZ) gates. This operation generates entangled cluster states, which may include two-qubit, multi-qubit, or tile-wide graph configurations. The result is the fusion of previously independent qubits into a joint wavefunction.

Phase programming is performed using a combination of ESR and Casimir bias controls to encode the computational structure. ESR phase and amplitude rotations are applied to selected qubits to encode algorithmic phase differences and assign computational weighting to different paths. Casimir-Z phase shifts are generated by applying controlled nanometer-scale shifts in Casimir bias, producing pure-phase Z rotations via energy-level detuning while preserving low-noise operation. This set of operations determines how different computational paths accumulate relative phase, enabling quantum interference.

To maintain coherence, echo and refocusing techniques are applied. Hahn-echo or Carr-Purcell-Meiboom-Gill (CPMG) ESR x pulses are used to cancel dephasing. Casimir bias exposure is symmetrized to eliminate static drift, and phase refresh operations are executed on mediator-connected qubits. This set of operations preserves algorithmic phase while discarding environmental phase noise.

Path recombination is performed in a second entanglement layer. Mediator-bus coupling is re-enabled to execute controlled entangling gates. Computational paths that received different phase histories are mixed, enabling constructive and destructive interference to form the solution pattern. These operations perform the core quantum computation by amplifying correct states and suppressing incorrect ones.

Mid-circuit control, if implemented, may use non-destructive readout ESR and capacitive sensing on ancilla qubits to extract error syndromes without collapsing the full quantum state or may use destructive readout on ancilla qubits also without collapsing the quantum state of other entangled qubits. Corrective ESR and Casimir operations are applied as needed, and the algorithm resumes. This capability enables circuit depths that exceed the raw physical coherence time.

Finalization and readout begins with an uncompute of ancilla operations. Casimir bias is frozen to a readout-stable level, and all mediator couplings are disabled. A destructive readout is executed on the data layer, collapsing the system into a classical output that reflects the interference result of all programmed ESR, Casimir, and mediator bus 630 operations.

The qubit gate operations may be implemented as follows. The single-qubit gate family includes ESR-based X and Y rotations via the microwave striplines 280, and Z-axis phase rotations via detuning using the sub-dot capacitive plate 230. Electron Spin Resonance (ESR) pulses enable coherent rotations around the X and Y axes of the Bloch sphere. These rotations are implemented by driving a microwave field at the qubit's ESR frequency, selecting the rotation axis through pulse phase adjustment, and controlling the rotation angle via pulse duration or amplitude. Such gates prepare superpositions, rotate spin states, and form the basis for arbitrary single-qubit operations. The Z rotation is achieved by detuning the qubit using the sub-dot capacitive plate 230, producing a controlled phase accumulation without population transfer and without enabling tunneling. This approach modifies local electromagnetic boundary conditions, dielectric response, vacuum-mode density, Casimir-field curvature, and the Stark-like energy landscape, producing a tunable shift in energy for precise Z-phase accumulation. Conditions for pure Z control require the RF or optical field to be far detuned from the ESR frequency, with amplitude below tunneling thresholds and no electric field gradients or changes in charge occupancy, ensuring a clean phase-only gate without population transfer.

A Hadamard (H) gate may be implemented using a combination of X/Y rotations through ESR pulses from the microwave striplines 280 and Z rotations implemented via detuning using the sub-dot capacitive plate 230. Rotation gates around the x, y, and z axis, represented as Rx, Ry, and Rz, respectively, may be implemented by applying an ESR pulse from the microwave stripline 280 for X or Y rotations and applying a detuning pulse applied via the quantum dot capacitive plate 230. For example, a Transpose (T) gate, which applies a phase rotation of x/4 around the Z-axis, may be implemented by applying a detuning pulse applied via the quantum dot capacitive plate.

Two-qubit entangling gates are realized through transient coupling via mediator quantum dots 610 bridging qubit pairs stored in quantum dots 220. A two-bit entangling operation may be applied by applying a single qubit gate operation to at least one of the two qubits to put the qubit in superposition, followed by the two-bit gate operation. Single qubit gate operations that put the qubit in superposition include an H gate, an Rx gate, and/or an Ry gate. A phase-change gate, such as an Rz gate or a T gate, may be further applied to the qubit to modify interference. When activated, the interaction Hamiltonian corresponds to a CZ gate enabling implementation of a CZ gate through precise timing. In other implementations, SWAP-equivalent logic may be compiled from the native CZ gate and single-qubit rotations, without invoking exchange coupling or state-swapping interactions. These operations maintain qubit stationarity, avoid charge motion across data qubits, and control coupling strength via Casimir-mediated detuned dispersive ZZ coupling and field bias, naturally supporting graph-state generation for cluster-state algorithms. Therefore, the native gate set may include ESR-based, Casimir-detuned, and/or mediator-bus entangling gates (CZ) and provides full SU(2) coverage for single-qubit operations and universality for multi-qubit computation. The native gate set may map directly to standard universal sets such as {H, T, CNOT}, {$R_x$, $R_z$,CNOT}, or {$R_y$, $R_z$, CZ}, where CNOT corresponds to the Controlled NOT gate, while offering higher purity, noise isolation, and/or scalability.

Gate control is established by modulating quantum dot coupling with Casimir-driven pulses while leveraging single-qubit rotations. The system architecture includes left and right quantum dot qubits (denoted as L and R in the following description) stored in quantum dots 220, which hold the computational quantum states, with a mediator quantum dot 610 (denoted as M in the following description) positioned between each L-R pair to enable direct coupling. Furthermore, multiple qubit pairs can be linked in series via mediator-bus dots of the mediator bus 630 (denoted as $B_1$, $B_2$, ..., $B_n$ in the following description), which act as a relay network for entanglement distribution across the system. Control of the qubits is achieved through two complementary channels: (1) single-qubit operations using ESR microwave signals via the microwave striplines 280 and local Casimir tuning via the mediator modulator 620, and (2) two-qubit detuned dispersive ZZ entangling operations driven by Casimir-controlled coupling and detuning (no exchange operations) along the mediator bus 630 driven by the mediator modulators 620. In particular, each qubit L or R can undergo arbitrary single-qubit rotations about the X or Y axes (denoted $X_Q(\theta)$ or $Y_Q(\theta)$) via ESR microwave pulses, and Z-axis phase rotations ($ZQ(\varphi)$) are applied by electrostatic detuning using the sub-dot capacitive plate 230, including DC bias and/or shaped detuning pulses that shift the qubit's energy splitting while preserving qubit localization.

Two-qubit interactions are implemented through detuned dispersive ZZ coupling between adjacent quantum dots $Q_1$ and $Q_2$. In one implementation, an interaction-control pulse at frequency $f_2$ and amplitude $a_1$ is applied to modulate the local electromagnetic boundary conditions associated with the pair of quantum dots. This $f_2$ modulation causes the surrounding graphene structure to respond through Casimir-mediated boundary condition changes, thereby increasing the strength of an effective detuned dispersive ZZ interaction between $Q_1$ and $Q_2$ while the dots remain energetically detuned. During the applied pulse duration t, the enhanced ZZ coupling produces a controlled conditional phase accumulation without electron transfer or exchange coupling. The interaction is then reduced by removing the $f_2$ modulation, enabling on-demand two-qubit entangling operations.

Entangling operations are defined by the interaction duration relative to the effective ZZ coupling strength $J_z$ between two qubits during an entangling operation. The effective coupling strength $J_z$ arises from dispersive ZZ interactions (which are an Ising-type interaction) in the effective Hamiltonian $H_{eff}$, defined as $$H_{eff} = h \cdot J_z \cdot \sigma_z^1 \cdot \sigma_z^2,$$

where h is the reduced Planck's constant, $J_z$ is the effective coupling strength, and $$\sigma_z^1$$

and $$\sigma_z^2$$

are the Pauli-Z operators acting on qubit 1 and qubit 2, respectively. A controlled CZ gate functions as the native two-qubit entangler of the system, as the controlled CZ gate is implemented through conditional phase accumulation without requiring electron tunneling, exchange coupling, or state transfer.

An entangling operating using the CZ gate is performed as follows. The system ensures that both qubits are in their initial target states, the mediator modulator 620 is not active, and the microwave striplines 280 are idle. Any required Z-phase corrections from prior operations are applied by adjusting the qubit reference frame or by applying a calibrated detuning pulse using the sub-dot capacitive plate 230. The system then applies a calibrated control pulse to the mediator modulator 620 to increase the strength of a dispersive ZZ (Ising-type) interaction between the qubits while maintaining energetic detuning and suppressing electron transfer. The control pulse is applied for a duration $t_g$ selected such that the accumulated conditional phase produces the phase inversion associated with the |11> state, thereby implementing the CZ gate. The mediator modulator 620 is subsequently deactivated, and any residual single-qubit phase offsets are corrected using Z rotations applied via the sub-dot capacitive plate 230. The microwave striplines 280 may then be used to apply ESR pulses for subsequent single-qubit operations.

In other implementations, a two-qubit entangling pulse produces a controlled-phase interaction (an effective ZZ interaction), with gate time set by the calibrated ZZ coupling rate while the qubits remain detuned and localized (with no exchange occurring). Thus, the CZ gate is enacted by enabling a calibrated dispersive ZZ interaction (via detuning and/or controlled coupling) for a set duration, then returning to an idle detuned configuration while no exchange interaction is invoked, for the specified t, and then disabling the dispersive ZZ coupling by turning off the $f_2$ modulation. No high-frequency microwaves or other control signals may be needed during this entangling operation, as the exchange interaction is toggled via the $f_2$ confinement pulse, which may be in the RF or THz range and directly modulates the interaction strength. Thus, when a ZZ phase-accumulation operation is executed between a left (L) qubit and a right (R) qubit, an $f_2$ control signal increases the strength of dispersive ZZ interactions between the L-M and M-R couplings while all elements remain energetically detuned. This transient increase in interaction strength enables an effective dispersive ZZ coupling between the L and R qubits mediated by the mediator quantum dot M. During the controlled interaction interval, conditional phase accumulation occurs without electron tunneling or exchange coupling. Following the set duration, the $f_2$ modulation is removed, the interaction strength is reduced to its idle level, and the dispersive ZZ coupling is terminated, thereby completing the operation.

Higher-level logic gates such as the Controlled-Z (CZ) and Controlled-NOT (CNOT) are constructed from these native entangling operations combined with single-qubit rotations. For example, a CZ gate between an L-R qubit pair may be realized by combining single-qubit basis rotations with a calibrated dispersive ZZ interaction. In one implementation, preparatory single-qubit rotations (e.g., X or Y rotations) are applied to orient the qubits into an interaction basis, followed by enabling a dispersive interaction for a controlled duration while the qubits remain energetically detuned. During this interval, the effective ZZ coupling produces a conditional phase accumulation between the qubits without electron transfer or exchange coupling. The interaction is then disabled and any required single-qubit phase corrections are applied, such that the net operation corresponds to a CZ gate. In other words, the two qubits acquire a conditional phase of $\pi$ (180°) if and only if they are in the $|1,1\rangle$ state, with no net exchange of quantum states. In practice, known gate decompositions for a CZ operation may use particular Z and X rotation combinations. A CNOT gate (with L as control and R as target, for example) may be implemented by conjugating a CZ operation with Hadamard gates on the target qubit. In other words, to get CNOT (L→R) operation, the sequence would include applying a Hadamard rotation H to qubit R (which can be synthesized by the available single-qubit operations, e.g. $Z(-\pi/2)$ followed by $X(\pi/2)$ and $Z(-\pi/2)$ as one concrete implementation of H), then executing the CZ (L, R) as described above, and finally apply another Hadamard (H) operation on R. This sequence yields a standard CNOT using the system's native operations. All requisite components for these gates, such as single-qubit rotations (ESR or Casimir-Z), are available within the control scheme, so any two-qubit gate can be realized by a suitable combination. The ability to perform CZ and CNOT ensures the system is universal for quantum computing while using a minimal set of primitives. While logical SWAP operations may be synthesized at the software or compilation level from native ZZ interactions and single-qubit operations, the physical architecture does not need to rely on SWAP-family exchange gates.

Beyond nearest-neighbor pairs, the system's design supports remote entanglement and multi-qubit operations across the mediator bus 630. If two qubits are not directly coupled (for instance, qubit $L_1$ in one pair and qubit $R_2$ in a distant pair), entanglement can be distributed through the mediator bus 630. Entanglement is propagated along the mediator bus by sequential ZZ-type entangling operations between neighboring nodes while all nodes remain in the dispersive regime (detuned, localized, no exchange), building graph/cluster-state connectivity without SWAP-type population transfer. When the entanglement has reached the quantum dot 810 adjacent to the target pair's mediator $M_2$, a ZZ type entangling operation between Bk and $M_2$ transfers the entanglement onto $M_2$, and another ZZ type entanglement between $M_2$ and the target qubit $R_2$ completes the entanglement distribution. Now $L_1$ (i.e., initial qubit of the first pair) is entangled with $R_2$ (i.e., qubit of the second pair), even though they had no direct interaction.

At this stage, a remote two-qubit gate between $L_1$ and $R_2$ can be performed. For example, to execute a remote CNOT ($L_1$→$R_2$), the system would use the mediated entanglement to effectively bring $L_1$ and $R_2$ into interaction. Once the entanglement is routed such that $L_1$ and $R_2$ are entangled (with the help of the mediator bus 630), applying the local gate operations (e.g., a CZ operation, etc.) between the entangled intermediaries yields the desired logical effect on $L_1$ and $R_2$. Optionally, the entanglement along the mediator bus 630 can be undone (reversed) after the operation if it's necessary to restore the system to a disentangled initial state for subsequent operations. However, in many quantum computing schemes, leaving established entanglement can be useful for creating cluster states. By iterating this entanglement routing procedure across many pairs in a chain, the system can generate large-scale multi-qubit entangled states, also referred to as cluster states. Thus, each qubit pair ($L_i$, $R_i$) can be entangled internally, and then all mediators $M_i$ can inject those entanglements into a common bus sequentially. As the mediator bus 630 pulses connect everything in series, a giant entangled cluster spanning all qubits emerges. Therefore, the architecture described herein may be capable of scaling entanglement across hundreds of qubits without introducing new types of interactions.

An architectural advantage of the systems described herein is the separation between "logical" qubit controls and "physical" routing operations, which simplifies control complexity. The L and R qubit dots are the only elements that require full control-they are equipped for ESR microwave manipulations (X and Y rotations), sub-dot capacitive plates for tuning for Z rotations, and any necessary measurement or error-correction instrumentation. In contrast, the mediator M and bus B dots serve purely as coupling intermediaries and do not require independent complex controls such as microwaves or fast electrical gating for logic operations. These coupling quantum dots are actuated by uniform $f_2$ control pulses that selectively increase interaction strength to enable dispersive ZZ coupling, without performing independent qubit rotations, measurements, or state transfer. The modulation frequency $f_2$ is used to modulate the strength of dispersive ZZ interactions between elements that remain energetically detuned. This two-tier control scheme means that all quantum logic gates (e.g., X, Y, Z rotations on qubits, CZ, CNOT, readout, etc.) take place on the dedicated quantum dots 220, while all entanglement distribution and physical qubit-to-qubit connections are confined to the mediator bus 630 using the single mechanism of $f_2$-enabled detuned dispersive ZZ coupling. Because there is no mixing between these two tiers of control, the system can be scaled up to include many qubit units without a proportional increase in control lines and circuitry for the coupling network. The mediator bus 630 layer remains simple and passive, just requiring the ability to receive the $f_2$ field through the mediator modulators 620. This confers a practical scalability advantage, in that one can increase the number of qubits (and thus the number of mediator/bus couplers) without needing to equip each new coupler with additional control hardware or timing channels. This approach ensures robust operation of multi-qubit gates while minimizing control overhead and preserving a modular, extensible architecture suited for large-scale quantum computing.

Figure 17:
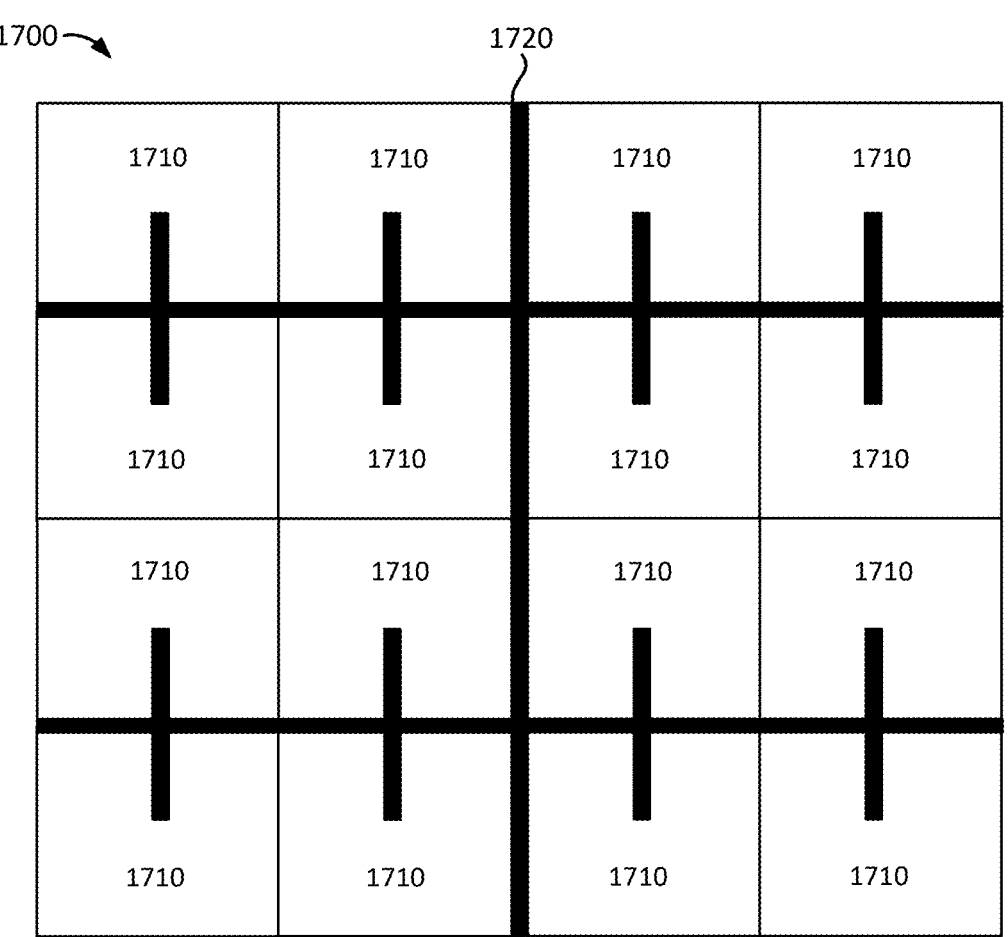
FIG. 17 is a schematic diagram of a quantum system of clusters of quantum devices according to an embodiment described herein.

FIG. 17 is a schematic diagram of a quantum system 1700 that includes clusters of quantum devices. As shown in FIG. 17, the quantum system 1700 may include quantum device tiles 1710 interconnected with mediator buses 1720. Each quantum device tile 1710 may include a cluster of 320 quantum devices (e.g., quantum devices 200, quantum devices 500, quantum devices 1400, quantum devices 1500, etc.), each storing a qubit. Thus, each quantum device tile 1710 may correspond to a cluster of approximately three hundred and twenty qubits each, interconnected via mediator bus 630 internally (not shown in FIG. 17) and connected to other adjacent quantum device tiles 1710 via the mediator buses 1720. The quantum device tiles 1710 and the mediator buses 1720 may include mediator modulators 620 and microwave striplines 280 that are multiplexed to form entangled clusters exceeding three hundred qubits per array. The quantum device tiles 1710 may be connected to each other by the mediator bus lines 1720 (e.g., between adjacent quantum device tiles 1710) to form a larger network or meta-cluster. Thus, the quantum system 1700 includes an array of Casimir-bias quantum tunneling transistors arranged in clusters of approximately three hundred and twenty qubits, each cluster defining an entangled tile interconnected via mediator-bus couplers to form higher-order meta-clusters, such that Casimir-bias modulation and electron-spin-resonance control are synchronized to maintain global coherence across all clusters. The synchronization of Casimir-bias and ESR control pulses may be maintained by the quantum system 1700 within ten picoseconds of skew across all meta-clusters. The quantum system 1700 can maintain a logical qubit fidelity at error rates below 10-5 through Casimir-bias stabilization and cryogenic operation between 1 and 4 mK.

The quantum system 1700 thereby can achieve a Hilbert-space dimensionality proportional to $2^N$, where N is the total number of qubits in the array, and wherein N exceeds three hundred twenty thousand. The quantum system 1700 can establish entanglement across all qubits within one millisecond, producing a global superposition state spanning a Hilbert space exceeding $10^{96300}$ dimensions. The entanglement architecture of the quantum system 1700 can support execution of cryptographically significant algorithms, such as, for example, integer factorization, elliptic-curve key reduction, and/or lattice-based post-quantum schemes. The cryptographic significance arises when the effective Hilbert-space dimensionality accessible under maintained coherence and entanglement depth supports modular-exponentiation operations on integers exceeding 256 bits, executed with gate fidelities above 99.9%. Furthermore, the quantum system 1700 may demonstrate quantum computational advantage by performing integer factorization on Rivest-Shamir-Adleman (RSA) key sizes exceeding 256 bits in less than one second under partially error-corrected operation. Moreover, the quantum system 1700 can perform fully error-corrected cryptographic computation on RSA key sizes up to one thousand twenty-four bits through linked entanglement across at least one thousand tiles of three hundred and twenty qubits each. Additionally, the modular tile and meta-cluster design of the quantum system 1700 can enable hierarchical scaling toward multi-million-qubit arrays while maintaining Casimir-field uniformity and ESR readout synchronization. The Hilbert-space dimensionality and coherence of the quantum system 1700 can enable cryptographic operations, including key reduction and post-quantum cryptanalysis within practical computational timescales.

Further aspects of the disclosure are provided by the subject matter of the following clauses:

A quantum device comprising: an actuator comprising a graphene material and having a proximal end mounted to an actuator anchor; an electrode disposed on a distal end of the actuator; a quantum dot configured to localize a single electron, wherein the quantum dot and the electrode are disposed within a common vacuum to define a tunneling gap; a quantum dot anchor, comprising the graphene material, wherein the quantum dot anchor is disposed in a same plane as the quantum dot relative to the electrode; and a modulator configured to emit electromagnetic signaling within a particular frequency range, wherein the graphene material is tuned to increase a Casimir force between the electrode and the quantum dot anchor in response to the modulator emitting the electromagnetic signaling within the particular frequency range, and wherein the increased Casimir force causes the actuator to deform to bring the electrode within an electron tunneling range of the quantum dot.

The quantum device of the preceding clause, wherein the actuator includes a crab-leg cantilever with a plurality of segments connected by joints, wherein the crab-leg cantilever is configured to extend the electrode toward the quantum dot through deformation of the joints.

The quantum device of any preceding clause, wherein the crab-leg cantilever includes progressive spring biasing of the plurality of segments toward the electrode.

The quantum device of any preceding clause, wherein the crab-leg cantilever includes at least one angular stop configured to prevent the crab-leg cantilever from extending beyond a position selected to prevent stiction between the electrode and the quantum dot anchor.

The quantum device of any preceding clause, further comprising a hard stop, wherein the hard stop is configured to prevent the crab-leg cantilever from extending beyond a position selected to prevent stiction between the electrode and the quantum dot anchor.

The quantum device of any preceding clause, wherein the crab-leg cantilever is configured to move the electrode from a position approximately 8 nanometers from the quantum dot to a position approximately 2 nanometers from the quantum dot.

The quantum device of any preceding clause, further comprising: a substrate; and an electrode capacitive plate located on the substrate at a position aligned with the electrode when the electrode is within the electron tunneling range of the quantum dot, wherein the electrode capacitive plate is configured to charge the electrode and cause an electron to tunnel from the electrode to the quantum dot to store a qubit in the quantum dot.

The quantum device of any preceding clause, further comprising: a substrate; and a quantum dot capacitive plate located on the substrate at a position aligned with the quantum dot, wherein the quantum dot capacitive plate is configured to capacitively sense a charge state or electron occupancy of the quantum dot and to perform mid-circuit non-destructive readout without removing the electron.

The quantum device of any preceding clause, further comprising: a microwave stripline located at a position aligned with the quantum dot, wherein the microwave stripline is configured to deliver an oscillating magnetic field to a qubit stored in the quantum dot to manipulate or readout the stored qubit.

The quantum device of any preceding clause, wherein the quantum dot is configured to maintain a spin coherence of the single electron for at least 1 millisecond.

The quantum device of any preceding clause, further comprising: a mirror quantum dot positioned opposite an actuator with respect to a quantum dot; and a mediator quantum dot located within a dispersive coupling range of the quantum dot and within a dispersive coupling range of the mirror quantum dot, wherein the mediator quantum dot is configured to enable entanglement between a first qubit stored in the quantum dot and a second qubit stored in the mirror quantum dot via detuned dispersive ZZ coupling, without electron tunneling or exchange coupling.

The quantum device of any preceding clause, wherein the mediator quantum dot comprises a second graphene material, different from the graphene material, the quantum device further comprising: a mediator quantum dot modulator configured to emit electromagnetic frequency at a second frequency range, different from the particular frequency range, wherein the second graphene material is tuned to increase the interaction strength to enable dispersive ZZ coupling between the quantum dot and the mediator quantum dot in response to the mediator quantum dot modulator emitting the electromagnetic frequency at the second frequency range.

The quantum device of any preceding clause, further comprising: a mediator bus of a plurality of pairs of quantum dots, wherein the mediator bus is configured to propagate an entanglement of the first qubit and the second qubit to an adjacent pair of addressable quantum dots.

The quantum device of any preceding clause, comprising a plurality of pairs of addressable quantum dots, wherein the mediator bus is configured to propagate entanglement between adjacent pairs of the plurality pairs of addressable quantum dots, and wherein the plurality of pairs of addressable quantum dots includes the quantum dot and the mirror quantum dot as a pair of the plurality of pairs of addressable quantum dots.

The quantum device of any preceding clause, wherein the mediator quantum dot and the mediator bus each comprise another graphene material, different from the graphene material of the actuator and the quantum dot anchor.

The quantum device of any preceding clause, wherein the quantum device is enclosed in a vacuum environment.

A quantum system comprising: a first quantum device comprising: a first quantum dot configured to localize a single electron; and a first actuator comprising a graphene material, wherein the graphene material is tuned to increase a Casimir force in response electromagnetic signaling within a frequency range, and wherein the increased Casimir force causes the first actuator to deform to bring a first electrode within an electron tunneling range of the first quantum dot; a second quantum device comprising: a second quantum dot configured to localize a single electron; and a second actuator comprising the graphene material, wherein the graphene material is tuned to increase the Casimir force in response electromagnetic signaling within the frequency range, and wherein the increased Casimir force causes the second actuator to deform to bring a second electrode within an electron tunneling range of the second quantum dot; and a mediator quantum dot located within a detuned dispersive ZZ coupling range of the first quantum dot and the second quantum dot, wherein the mediator quantum dot enables entanglement between a first qubit stored in the first quantum dot and a second qubit stored in the second quantum dot.

The quantum system of any preceding clause, wherein the first quantum dot, the second quantum dot, and the mediator dot comprise a second graphene material that is different from the graphene material included in the first actuator and the second actuator.

The quantum system of any preceding clause, wherein the second graphene material is tuned to increase the interaction strength to enable dispersive ZZ coupling in response to electromagnetic signaling with a second frequency range to enable entanglement propagation through the dispersive coupling.

A quantum system comprising: a plurality of quantum devices, wherein a quantum device, of the plurality of quantum devices, includes: an actuator comprising a graphene material and having a proximal end mounted to an actuator anchor; an electrode disposed on a distal end of the actuator; a quantum dot configured to localize a single electron, wherein the quantum dot and the electrode are disposed within a common vacuum to define a tunneling gap; a quantum dot anchor, comprising the graphene material, wherein the quantum dot anchor is disposed in a same plane as the quantum dot relative to the electrode; and a modulator configured to emit electromagnetic signaling within a particular frequency range, wherein the graphene material is tuned to increase a Casimir force between the electrode and the quantum dot anchor in response to the modulator emitting the electromagnetic signaling within the particular frequency range, and wherein the increased Casimir force causes the actuator to deform to bring the electrode within an electron tunneling range of the quantum dot; and a mediator bus of a plurality of pairs of quantum dots, wherein the mediator bus is configured to propagate an entanglement of qubits stored by the plurality of quantum devices.

A method of using a quantum device, the method comprising: charging an electrode located at an end of an actuator comprising a graphene material; activating a modulator to emit electromagnetic signaling within a particular frequency range, wherein the graphene material is tuned to increase a Casimir force between the electrode and a quantum dot anchor in response to the modulator emitting the electromagnetic signaling within the particular frequency range, wherein the quantum dot anchor comprises the graphene material; deforming the actuator toward the quantum dot anchor, in response to the increased Casimir force, wherein deforming the actuator brings the electrode within an electron tunneling range of a quantum dot; and causing an electron to tunnel from the charged electrode to the quantum dot to store a qubit in the quantum dot.

The method of any preceding clause, further comprising: confirming a successful transfer of the electron from the charged electron to the quantum dot by performing a reflectometry read of the quantum dot using a quantum dot capacitive plate located on a substrate at a position aligned with the quantum dot; and deactivating the modulator to retract the actuator away from the quantum dot, based on confirming the successful transfer of the electron from the charged electron to the quantum dot.

The method of any preceding clause, setting the qubit in the quantum dot using an oscillating magnetic field generated by a microwave stripline located at a position aligned with the quantum dot.

The method of any preceding clause, further comprising: entangling the qubit with a mirror qubit located in a mirror quantum dot using a mediator quantum dot located between the qubit and the mirror qubit.

The method of any preceding clause, further comprising: propagating entanglement to a mediator bus of quantum dots, wherein the mediator bus is configured to propagate the entanglement to an adjacent pair of quantum dots.

The method of any preceding clause, further comprising: entangling the entangled qubit with another qubit pair to generate a set of entangled qubits using the mediator bus.

The method of any preceding clause, further comprising: generating a cluster of entangled qubits using the mediator bus, wherein the cluster of entangled qubits includes approximately three hundred qubits.

The method of any preceding clause, further comprising: performing a quantum computing operation on the cluster of entangled qubits; performing non-destructive readout for mid-circuit error correction; and reading out a result of the quantum computing operation on the cluster of entangled qubits.

A method of making a quantum device, the method comprising: forming, on a substrate, a quantum dot configured to localize a single electron, wherein the quantum dot comprises a first graphene material; forming, on the substrate, a quantum dot anchor comprising a second graphene material; forming, on the substrate, an actuator comprising the second graphene material; forming an electrode on the actuator; and forming a modulator configured to emit electromagnetic signaling within a particular frequency range, wherein the second graphene material is tuned to increase a Casimir force between the electrode and the quantum dot anchor in response to the modulator emitting the electromagnetic signaling within the particular frequency range, and wherein the increased Casimir force causes the actuator to deform to bring the electrode within an electron tunneling range of the quantum dot.

The method of any preceding clause, wherein forming the actuator includes: forming a crab-leg cantilever with a plurality of segments connected by joints, wherein the crab-leg cantilever is configured to extend the electrode toward the quantum dot through deformation of the joints.

The method of any preceding clause, further comprising: configuring the crab-leg cantilever to include a progressive spring biasing of the plurality of segments toward the electrode.

The method of any preceding clause, further comprising: configuring the crab-leg cantilever to include at least one angular stop configured to prevent the crab-leg cantilever from extending beyond a position selected to prevent stiction between the electrode and the anchor.

The method of any preceding clause, further comprising: forming, on the substrate, at least one hard stop, wherein the at least one hard stop is configured to prevent the crab-leg cantilever from extending beyond a position selected to prevent stiction between the electrode and the anchor.

The method of any preceding clause, further comprising: forming an electrode capacitive plate on the substrate at a position aligned with the electrode when the actuator is within the electron tunneling range of the quantum dot, wherein the electrode capacitive plate is configured to charge the electrode and cause an electron to tunnel from the electrode to the quantum dot to store a qubit in the quantum dot.

The method of any preceding clause, further comprising: forming a quantum dot capacitive plate on the substrate at a position aligned with the quantum dot, wherein the quantum dot capacitive plate is configured to capacitively sense a charge state or electron occupancy of the quantum dot and to perform mid-circuit non-destructive readout without removing the electron from the quantum dot.

The method of any preceding clause, further comprising: forming a microwave stripline at a position aligned with the quantum dot, wherein the microwave stripline is configured to deliver an oscillating magnetic field to a qubit stored in the quantum dot to manipulate or readout the stored qubit.

The method of any preceding clause, further comprising: forming a mirror quantum dot positioned opposite the quantum dot actuator with respect to the quantum dot, wherein the mirror quantum dot comprises the first graphene material; and forming a mediator quantum dot, located within an electron dispersive coupling range of the quantum dot and within a detuned dispersive ZZ coupling range of the mirror quantum dot, wherein the mediator quantum dot comprises the first graphene material, and wherein the mediator quantum dot enables entanglement between a first qubit stored in the quantum dot and a second qubit stored in the mirror quantum dot.

The method of any preceding clause, further comprising: forming a mediator quantum dot modulator configured to emit an electromagnetic signal at a second frequency range that is different from the particular frequency range, wherein a second graphene material associated with the quantum dot and the mediator quantum dot is tuned, in response to the mediator quantum dot modulator emitting the electromagnetic signal at the second frequency range, to increase an effective electron dispersive coupling strength between the quantum dot and the mediator quantum dot while maintaining energetic detuning.

The method of any preceding clause, further comprising: forming a mediator bus of a plurality of pairs of quantum dots, wherein the mediator bus is configured to propagate an entanglement of the first qubit and the second qubit to an adjacent pair of addressable quantum dots.

The method of any preceding clause, further comprising: forming a plurality of pairs of addressable quantum dots, wherein the mediator bus is configured to propagate entanglement between adjacent pairs of the plurality pairs of addressable quantum dots, and wherein the plurality of pairs of addressable quantum dots includes the quantum dot and the mirror quantum dot as a pair of the plurality of pairs of addressable quantum dots.

A quantum device comprising: a fixed source electrode comprising a graphene material; a quantum dot configured to localize a single electron, wherein the quantum dot and fixed source the electrode are disposed within a common vacuum to define a tunneling gap; and a modulator configured to emit electromagnetic signaling within a frequency range, wherein the graphene material is tuned to vary a surface conductivity of the graphene material in response to the electromagnetic signaling, wherein varying the surface conductivity of the graphene material increases a Casimir force across the tunneling gap to increase an electron tunneling probability across the tunneling gap without physical movement of the fixed source electrode.

The quantum device of any preceding clause, further comprising: a substrate; and an electrode capacitive plate located on the substrate at a position aligned with the fixed source electrode, wherein the electrode capacitive plate is configured to charge the fixed source electrode and cause an electron to tunnel from the fixed source electrode to the quantum dot to store a qubit in the quantum dot.

The quantum device of any preceding clause, further comprising: a substrate; and a quantum dot capacitive plate located on the substrate at a position aligned with the quantum dot, wherein the quantum dot capacitive plate is configured to capacitively sense a charge state or electron occupancy of the quantum dot and to perform mid-circuit non-destructive readout without removing the electron from the quantum dot and is configured to perform mid-circuit non-destructive readout.

The quantum device of any preceding clause, wherein the modulator is configured to emit an optical, radio-frequency, or terahertz signal configured to alter a Fermi level of the graphene material to modulate a permittivity tensor of the graphene material.

The quantum device of any preceding clause, wherein a Casimir coefficient n is tuned between approximately 1.0 and 0.3 to define idle and active tunneling states respectively.

The quantum device of any preceding clause, wherein the quantum device is configured to operate within a cryogenic environment between 1 milliKelvin (mK) and 4 mK.

The quantum device of any preceding clause, further comprising: an electron spin resonance (ESR) readout assembly configured to measure a qubit state by inducing microwave excitation of an electron localized in the quantum dot and to detect a reflected or transmitted signal amplitude without removing the electron from the quantum dot.

The quantum device of any preceding clause, further comprising a microwave stripline through which the microwave excitation is applied, wherein the microwave stripline is physically distinct from a capacitive readout plate.

The quantum device of any preceding clause, further comprising a cryogenic parametric amplifier or graphene-based low-noise amplifier configured to amplify the reflected or transmitted signal.

The quantum device of any preceding clause, wherein the ESR readout assembly is configured to measure a qubit state within 50 nanoseconds and maintain a coherence time of the qubit state that is greater than 1 millisecond.

A quantum system comprising: a plurality of quantum devices individually including: a fixed source electrode comprising a first graphene material; a quantum dot configured to localize a single electron, wherein the quantum dot and the fixed source electrode are disposed within a common vacuum to define a tunneling gap; and a modulator configured to emit electromagnetic signaling within a particular frequency range, wherein the first graphene material is tuned to vary a surface conductivity of the first graphene material in response to the electromagnetic signaling in a first frequency range, wherein varying the surface conductivity of the first graphene material increases a Casimir force across the tunneling gap to increase an electron tunneling probability across the tunneling gap without physical movement of the fixed source electrode; a plurality of mediator quantum dots individually positioned between a pair of adjacent quantum dots of the plurality of quantum devices; and a mediator bus comprising a plurality of mediator bus quantum dots, wherein the mediator bus links pairs of adjacent quantum dots of the plurality of quantum devices through the plurality of mediator quantum dots, wherein the plurality of mediator quantum dots and the mediator bus enable entanglement propagation between non-adjacent qubits stored in the plurality of quantum devices.

The quantum system of any preceding clause, wherein the mediator bus and the plurality of mediator quantum dots are configured to propagate entanglement via detuned dispersive ZZ coupling enabled by Casimir-force modulation, the coupling strength being increased by the modulation of the Casimir force, without enabling electron tunneling, exchange coupling, or SWAP-family state transfer.

The quantum system of any preceding clause, wherein the mediator bus and the plurality of mediator quantum dots are configured to propagate entanglement across multiple left-right qubit pairs via detuned dispersive ZZ coupling enabled by Casimir-force modulation.

The quantum system of any preceding clause, wherein the quantum dots of the plurality of quantum devices, the plurality of mediator quantum dots, and the mediator bus individually include a second graphene material, wherein the second graphene material is tuned to enable detuned dispersive ZZ coupling between adjacent quantum dots, in response to electromagnetic signals in a second frequency range modulating coupling strength activating interaction between the dots while remaining detuned leading to entanglement propagation through detuned dispersive ZZ coupling enabled by Casimir-force modulation.

The quantum system of any preceding clause, further comprising: a plurality of modulators located along the mediator bus, individually configured to emit electromagnetic frequency in the second frequency range.

The quantum system of any preceding clause, wherein the plurality of modulators is configured to emit electromagnetic pulses having a phase alignment of less than 10 picoseconds to synchronize the entanglement propagation.

The quantum system of any preceding clause, wherein at least one of the first graphene material and the second graphene material comprises an anisotropic or hyperbolic optical medium, and wherein modulation of permittivity tensor components of the least one of the first graphene material or the second graphene material changes a local density of electromagnetic vacuum modes to modify the Casimir force experienced by the least one of the first graphene material or the second graphene material.

The quantum system of any preceding clause, wherein individual ones of the plurality of quantum devices further includes: a substrate; and an electrode capacitive plate located on the substrate at a position aligned with the fixed source electrode, wherein the electrode capacitive plate is configured to charge the fixed source electrode and cause an electron to tunnel from the fixed source electrode to the quantum dot to store a qubit in the quantum dot.

The quantum system of any preceding clause, wherein individual ones of the plurality of quantum devices further comprise: a substrate; and a quantum dot capacitive plate disposed on the substrate and aligned with a corresponding quantum dot, wherein the quantum dot capacitive plate is configured to capacitively sense a charge state or occupancy of the quantum dot, including by detecting an electrostatic response associated with an electron present on the quantum dot, and to perform mid-circuit non-destructive readout without requiring removal of the electron from the quantum dot.

The quantum system of any preceding clause, wherein individual ones of the plurality of quantum devices further comprise: a substrate; and quantum dot capacitive plate disposed on the substrate and aligned with the quantum dot, wherein the quantum dot capacitive plate is configured to capacitively sense an electron occupancy or charge state of the quantum dot, including detection of an electrostatic response associated with an electron present on the quantum dot, and to perform mid-circuit non-destructive readout without removing the electron from the quantum dot.

The quantum system of any preceding clause, wherein individual ones of the plurality of quantum devices further includes: an electron spin resonance (ESR) readout assembly configured to measure a qubit state by inducing microwave excitation of an electron localized in the quantum dot and to detect a reflected or transmitted signal amplitude without removing the electron from the quantum dot, wherein the microwave excitation is applied through a microwave stripline that is physically distinct from a capacitive readout plate to minimize crosstalk.

The quantum system of any preceding clause, wherein the anisotropic or hyperbolic optical medium satisfies $\varepsilon_\perp T < 0$ and $\varepsilon_\parallel > 0$ in a mid-infrared regime, producing hyperbolic dispersion.

The quantum system of any preceding clause, configured such that modulation of Casimir force results in at least a two-fold increase of an unmodulated Casimir force across a gap of two to ten nanometers.

The quantum system of any preceding clause, configured such that optical modulation produces a response time less than one hundred femtoseconds.

The quantum system of any preceding clause, wherein plurality of modulators and the ESR readout assembly are multiplexed to form entangled clusters exceeding three hundred qubits per array.

The quantum system of any preceding clause, wherein the quantum system comprises tile-based clusters of approximately three hundred and twenty qubits each, interconnected via mediator-bus lines.

A method of fabricating a static Casimir-bias quantum tunneling transistor, comprising depositing a first graphene-doped electrode; forming a vacuum gap between six and ten nanometers; depositing a dielectric or h-BN spacing layer; suspending a graphene gate above the gap; and integrating optical or radio-frequency modulation lines to vary graphene conductivity and thereby to vary Casimir pressure.

The method of any preceding clause, further comprising controlling graphene doping and layer uniformity within ±0.3 nanometers across a three hundred millimeter wafer.

The method of any preceding clause, further comprising depositing a cryogenic stress-management layer to maintain alignment of the vacuum gap during cooling to below ten millikelvin.

A method of measuring a qubit state in a Casimir-bias quantum tunneling transistor without collapsing the electron wavefunction, comprising applying an ESR pulse at a Larmor frequency of an electron; and detecting a reflected microwave phase shift correlated with qubit spin orientation.

The method of any preceding clause, further comprising producing a phase-shift signature corresponding to spin-up or spin-down states while preserving a trapped electron in the quantum dot for repeated measurement cycles.

The method of any preceding clause, further comprising implementing phase-sensitive detection using a lock-in amplifier synchronized with an ESR excitation frequency.

A quantum information processor comprising an array of Casimir-bias quantum tunneling transistors arranged in clusters of approximately three hundred and twenty qubits, each cluster defining an entangled tile interconnected via mediator-bus couplers to form higher-order meta-clusters, wherein Casimir-bias modulation and electron-spin-resonance control are synchronized to maintain global coherence across the clusters.

The quantum information processor of any preceding clause, wherein the processor is configured to achieve a Hilbert-space dimensionality proportional to $2N$, where N is a total number of qubits in an array, and wherein N exceeds three hundred twenty thousand.

The quantum information processor of any preceding clause, configured such that synchronization of Casimir-bias and ESR control pulses is maintained within ten picoseconds of skew across all meta-clusters.

The quantum information processor of any preceding clause, configured such that entanglement is established across all qubits within one hundred nanoseconds, producing a global superposition state spanning a Hilbert space exceeding $10^{96300}$ dimensions.

The quantum information processor of any preceding clause, configured such that logical qubit fidelity is maintained at error rates below ten to the minus five through Casimir-bias stabilization and cryogenic operation between one and four millikelvin.

The quantum information processor of any preceding clause, configured such that the entanglement architecture supports execution of cryptographically significant algorithms selected from integer factorization, elliptic-curve key reduction, and lattice-based post-quantum schemes.

The quantum information processor of any preceding clause, configured such to demonstrate quantum computational advantage by performing integer factorization on RSA key sizes exceeding two hundred fifty-six bits in less than one second under partially error-corrected operation.

The quantum information processor of any preceding clause, configured to perform fully error-corrected cryptographic computation on RSA key sizes up to one thousand twenty-four bits through linked entanglement across at least one thousand tiles of three hundred and twenty qubits each.

The quantum information processor of any preceding clause, wherein the modular tile and meta-cluster design are configured to enable hierarchical scaling toward multi-million-qubit arrays while maintaining Casimir-field uniformity and ESR readout synchronization.

The quantum information processor of any preceding clause, wherein the Hilbert-space dimensionality and coherence enable cryptographic operations, including key reduction and post-quantum cryptanalysis within practical computational timescales.

In the preceding specification, various preferred embodiments have been described with reference to the accompanying drawings. It will, however, be evident that various modifications and changes may be made hereto, and additional embodiments may be implemented, without departing from the broader scope of the specification as set forth in the claims that follow. The specification and drawings are accordingly to be regarded in an illustrative rather than restrictive sense.

What is claimed is:

1. A quantum device comprising:
a fixed source electrode comprising a graphene material;
a quantum dot configured to localize a single electron, wherein the quantum dot and the fixed source electrode are disposed within a common vacuum to define a tunneling gap; and
a modulator configured to emit electromagnetic signaling within a frequency range, wherein the graphene material is tuned to vary a surface conductivity of the graphene material in response to the electromagnetic signaling, wherein varying the surface conductivity of the graphene material increases a Casimir force across the tunneling gap to increase an electron tunneling probability across the tunneling gap without physical movement of the fixed source electrode.

2. The quantum device of claim 1, further comprising:
a substrate; and
an electrode capacitive plate located on the substrate at a position aligned with the fixed source electrode, wherein the electrode capacitive plate is configured to charge the fixed source electrode and cause an electron to tunnel from the fixed source electrode to the quantum dot to store a qubit in the quantum dot.

3. The quantum device of claim 1, further comprising:
a substrate; and
a quantum dot capacitive plate located on the substrate at a position aligned with the quantum dot, wherein the quantum dot capacitive plate is configured to verify that an electron has tunneled from the fixed source electrode to the quantum dot and perform mid-circuit non-destructive readout.

4. The quantum device of claim 1, wherein the modulator is configured to emit an optical, radio-frequency, or terahertz signal configured to alter a Fermi level of the graphene material to modulate a permittivity tensor of the graphene material.

5. The quantum device of claim 1, wherein a Casimir coefficient n is tuned between approximately 1.0 and 0.3 to define idle and active tunneling states respectively.

6. The quantum device of claim 1, wherein the quantum device is configured to operate within a cryogenic environment between 1 milliKelvin (mK) and 4 mK.

7. The quantum device of claim 1, further comprising:
an electron spin resonance (ESR) readout assembly configured to measure a qubit state by inducing microwave excitation of an electron localized in the quantum dot and to detect a reflected or transmitted signal amplitude without removing the electron from the quantum dot.

8. The quantum device of claim 7, further comprising a microwave stripline through which the microwave excitation is applied, wherein the microwave stripline is physically distinct from a capacitive readout plate.

9. The quantum device of claim 7, further comprising a cryogenic parametric amplifier or graphene-based low-noise amplifier configured to amplify the reflected or transmitted signal.

10. The quantum device of claim 7, wherein the ESR readout assembly is configured to measure a qubit state within 50 nanoseconds and maintain a coherence time of the qubit state that is greater than 1 millisecond.

11. A quantum system comprising:
a plurality of quantum devices individually including:
a fixed source electrode comprising a first graphene material;
a quantum dot configured to localize a single electron, wherein the quantum dot and the fixed source electrode are disposed within a common vacuum to define a tunneling gap; and
a modulator configured to emit electromagnetic signaling within a particular frequency range, wherein the first graphene material is tuned to vary a surface conductivity of the first graphene material in response to the electromagnetic signaling in a first frequency range, wherein varying the surface conductivity of the first graphene material increases a Casimir force across the tunneling gap to increase an electron tunneling probability across the tunneling gap without physical movement of the fixed source electrode;
a plurality of mediator quantum dots individually positioned between a pair of adjacent quantum dots of the plurality of quantum devices; and
a mediator bus comprising a plurality of mediator bus quantum dots, wherein the mediator bus links pairs of adjacent quantum dots of the plurality of quantum devices through the plurality of mediator quantum dots, wherein the plurality of mediator quantum dots and the mediator bus enable entanglement propagation between non-adjacent qubits stored in the plurality of quantum devices.

12. The quantum system of claim 11, wherein the mediator bus and the plurality of mediator quantum dots are configured to propagate entanglement via detuned dispersive ZZ coupling enabled by Casimir-force modulation.

13. The quantum system of claim 11, wherein the mediator bus and the plurality of mediator quantum dots are configured to propagate entanglement across multiple left-right qubit pairs through detuned dispersive ZZ coupling enabled by Casimir-force modulation.

14. The quantum system of claim 11, wherein the quantum dots of the plurality of quantum devices, the plurality of mediator quantum dots, and the mediator bus individually include a second graphene material, wherein the second graphene material is tuned to increase a dispersive coupling between adjacent quantum devices producing ZZ interaction, in response to electromagnetic signals in a second frequency range, to enable entanglement propagation through detuned dispersive ZZ coupling enabled by Casimir-force modulation.

15. The quantum system of claim 14, further comprising:
a plurality of modulators located along the mediator bus, individually configured to emit electromagnetic frequency in the second frequency range.

16. The quantum system of claim 14, wherein the plurality of modulators is configured to emit electromagnetic pulses having a phase alignment of less than 10 picoseconds to synchronize the entanglement propagation.

17. The quantum system of claim 14, wherein at least one of the first graphene material and the second graphene material comprises an anisotropic or hyperbolic optical medium, and wherein modulation of a permittivity tensor components of the least one of the first graphene material or the second graphene material changes a local density of electromagnetic vacuum modes to modify the Casimir force experienced by the least one of the first graphene material or the second graphene material.

18. The quantum system of claim 11, wherein individual ones of the plurality of quantum devices further includes:
a substrate; and
an electrode capacitive plate located on the substrate at a position aligned with the fixed source electrode, wherein the electrode capacitive plate is configured to charge the fixed source electrode and cause an electron to tunnel from the fixed source electrode to the quantum dot to store a qubit in the quantum dot.

19. The quantum system of claim 11, wherein individual ones of the plurality of quantum devices further includes:
a substrate; and
a quantum dot capacitive plate disposed on the substrate and aligned with the quantum dot, wherein the quantum dot capacitive plate is configured to capacitively sense an electron occupancy or charge state of the quantum dot, including detection of an electrostatic response associated with an electron present on the quantum dot, and to perform mid-circuit non-destructive readout without removing the electron from the quantum dot.

20. The quantum system of claim 11, wherein individual ones of the plurality of quantum devices further includes:
an electron spin resonance (ESR) readout assembly configured to measure a qubit state by inducing microwave excitation of an electron localized in the quantum dot and to detect a reflected or transmitted signal amplitude without removing the electron from the quantum dot, wherein the microwave excitation is applied through a microwave stripline that is physically distinct from a capacitive readout plate to minimize crosstalk.

21. The quantum system of claim 17, wherein the anisotropic or hyperbolic optical medium satisfies $\varepsilon_\perp < 0$ and $\varepsilon_\parallel > 0$ in a mid-infrared regime, producing hyperbolic dispersion.

22. The quantum system of claim 17, configured such that modulation of the Casimir force results in at least a two-fold increase of an unmodulated Casimir force across a gap of two to ten nanometers.

23. The quantum system of claim 17, configured such that optical modulation produces a response time less than one hundred femtoseconds.

24. The quantum system of claim 20, wherein plurality of modulators and the ESR readout assembly are multiplexed to form entangled clusters exceeding three hundred qubits per array.

25. The quantum system of claim 20, wherein the quantum system comprises tile-based clusters of approximately three hundred and twenty qubits each, interconnected via mediator-bus lines.

* * * * *